United States Patent
Nishiyama et al.

(10) Patent No.: US 8,927,976 B2
(45) Date of Patent: *Jan. 6, 2015

(54) ORGANIC EL ELEMENT AND PRODUCTION METHOD FOR SAME

(71) Applicant: Panasonic Corporation, Osaka (JP)

(72) Inventors: Seiji Nishiyama, Osaka (JP); Satoru Ohuchi, Osaka (JP); Takahiro Komatsu, Osaka (JP); Yoshiaki Tsukamoto, Osaka (JP); Shinya Fujimura, Osaka (JP); Hirofumi Fujita, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/740,348

(22) Filed: Jan. 14, 2013

(65) Prior Publication Data

US 2013/0126843 A1   May 23, 2013

Related U.S. Application Data

(63) Continuation of application No. PCT/JP2010/004985, filed on Aug. 6, 2010.

(51) Int. Cl.
*H01L 51/50* (2006.01)
*H01L 51/52* (2006.01)
*H01L 51/56* (2006.01)

(52) U.S. Cl.
CPC ........ *H01L 51/5088* (2013.01); *H01L 51/5209* (2013.01); *H01L 51/5218* (2013.01); *H01L 2251/5369* (2013.01); *H01L 51/56* (2013.01)
USPC .............................................. 257/40; 438/99

(58) Field of Classification Search
USPC .............................................. 257/40; 438/46
See application file for complete search history.

(56) References Cited

U.S. PATENT DOCUMENTS

| 5,294,869 A | 3/1994 | Tang et al. |
| 5,443,922 A | 8/1995 | Nishizaki et al. |

(Continued)

FOREIGN PATENT DOCUMENTS

| DE | 102005007540 | 8/2006 |
| EP | 2175504 | 4/2010 |

(Continued)

OTHER PUBLICATIONS

Meyer et al., Charge generation layers comprising transition metal-oxide/organic interfaces: Electronic structure and charge generation mechanism, May 10, 2010, Applied Physics Letters, 96, pp. 1-3.*

(Continued)

*Primary Examiner* — Matthew W Such
*Assistant Examiner* — Warren H Kilpatrick
(74) *Attorney, Agent, or Firm* — Greenblum & Bernstein, P.L.C.

(57) ABSTRACT

An organic EL element includes a hole injection layer yielding excellent hole conduction efficiency, and comprises: an anode; a cathode; a functional layer disposed between the anode and the cathode, and including a light-emitting layer containing organic material; the hole injection layer disposed between the anode and the functional layer; and a bank defining an area in which the light-emitting layer is to be formed, wherein the hole injection layer includes tungsten oxide, tungsten atoms constituting the tungsten oxide include both tungsten atoms with a valence of six and tungsten atoms with a valence less than six, the hole injection layer includes a crystal of the tungsten oxide, a particle diameter of the crystal being on an order of nanometers, an inner portion of the hole injection layer is depressed to define a recess, and an upper peripheral edge of the recess is covered with a part of the bank.

26 Claims, 29 Drawing Sheets

(56) References Cited

U.S. PATENT DOCUMENTS

| | | | |
|---|---|---|---|
| 5,688,551 A | 11/1997 | Littman et al. | |
| 6,132,280 A | 10/2000 | Tanabe et al. | |
| 6,284,393 B1 | 9/2001 | Hosokawa et al. | |
| 6,309,801 B1 | 10/2001 | Meijer et al. | |
| 2002/0051894 A1 | 5/2002 | Yoshikawa | |
| 2002/0158835 A1 | 10/2002 | Kobayashi et al. | |
| 2003/0137242 A1 | 7/2003 | Seki | |
| 2004/0075385 A1* | 4/2004 | Tao | 313/506 |
| 2004/0178414 A1 | 9/2004 | Frey et al. | |
| 2005/0064633 A1 | 3/2005 | Mikoshiba | |
| 2005/0093432 A1 | 5/2005 | Yamazaki et al. | |
| 2005/0093434 A1 | 5/2005 | Suh et al. | |
| 2005/0170208 A1 | 8/2005 | Yatsunami et al. | |
| 2005/0208206 A1 | 9/2005 | Yoshikawa | |
| 2005/0266763 A1* | 12/2005 | Kimura et al. | 445/24 |
| 2006/0008931 A1 | 1/2006 | Lee et al. | |
| 2006/0139342 A1 | 6/2006 | Yu | |
| 2006/0204788 A1 | 9/2006 | Yoshikawa | |
| 2006/0243377 A1 | 11/2006 | Matsuo et al. | |
| 2006/0284166 A1 | 12/2006 | Chua et al. | |
| 2007/0029929 A1 | 2/2007 | Nakamura et al. | |
| 2007/0099396 A1 | 5/2007 | Hirai et al. | |
| 2007/0172978 A1 | 7/2007 | Chua et al. | |
| 2007/0241665 A1 | 10/2007 | Sakanoue et al. | |
| 2007/0290604 A1 | 12/2007 | Sakanoue et al. | |
| 2008/0150422 A1 | 6/2008 | Ohara | |
| 2008/0231179 A1 | 9/2008 | Abe et al. | |
| 2008/0312437 A1 | 12/2008 | Inoue et al. | |
| 2009/0058268 A1 | 3/2009 | Yoshida et al. | |
| 2009/0096364 A1 | 4/2009 | Fujii et al. | |
| 2009/0115318 A1* | 5/2009 | Gregory et al. | 313/504 |
| 2009/0160325 A1 | 6/2009 | Yatsunami et al. | |
| 2009/0200917 A1 | 8/2009 | Yamagata et al. | |
| 2009/0206422 A1 | 8/2009 | Illing et al. | |
| 2009/0224664 A1 | 9/2009 | Yoshida et al. | |
| 2009/0243478 A1 | 10/2009 | Shoda et al. | |
| 2009/0250685 A1 | 10/2009 | Moon | |
| 2009/0272999 A1 | 11/2009 | Yoshida et al. | |
| 2009/0284135 A1 | 11/2009 | Yoshida et al. | |
| 2009/0284141 A1 | 11/2009 | Sakanoue et al. | |
| 2009/0284144 A1 | 11/2009 | Fujioka et al. | |
| 2009/0284146 A1 | 11/2009 | Yoshida et al. | |
| 2009/0315027 A1 | 12/2009 | Kidu et al. | |
| 2010/0084672 A1 | 4/2010 | Ueno et al. | |
| 2010/0102310 A1 | 4/2010 | Komatsu et al. | |
| 2010/0181554 A1 | 7/2010 | Yoshida et al. | |
| 2010/0181559 A1 | 7/2010 | Nakatani et al. | |
| 2010/0188376 A1 | 7/2010 | Sagawa et al. | |
| 2010/0213827 A1 | 8/2010 | Yoshida et al. | |
| 2010/0252857 A1 | 10/2010 | Nakatani et al. | |
| 2010/0258833 A1 | 10/2010 | Okumoto et al. | |
| 2010/0302221 A1 | 12/2010 | Okumoto | |
| 2011/0018007 A1 | 1/2011 | Kasahara et al. | |
| 2011/0037065 A1* | 2/2011 | Ueno et al. | 257/40 |
| 2011/0037068 A1* | 2/2011 | Yamazaki et al. | 257/43 |
| 2011/0042703 A1 | 2/2011 | Okumoto et al. | |
| 2011/0140091 A1 | 6/2011 | Friend et al. | |
| 2011/0140596 A1 | 6/2011 | Yoshida et al. | |
| 2011/0180821 A1 | 7/2011 | Matsushima | |
| 2011/0193107 A1 | 8/2011 | Takeuchi et al. | |
| 2011/0198623 A1 | 8/2011 | Matsushima | |
| 2011/0198624 A1 | 8/2011 | Matsushima | |
| 2011/0204410 A1 | 8/2011 | Yada | |
| 2012/0061656 A1 | 3/2012 | Ohuchi et al. | |
| 2012/0178191 A1 | 7/2012 | Sakanoue et al. | |

FOREIGN PATENT DOCUMENTS

| | | |
|---|---|---|
| EP | 2270896 | 1/2011 |
| JP | 05-163488 A | 6/1993 |
| JP | 10-162959 A | 6/1998 |
| JP | 2000-133446 A | 5/2000 |
| JP | 2000-223276 A | 8/2000 |
| JP | 2002-075661 A | 3/2002 |
| JP | 2002-530881 A | 9/2002 |
| JP | 2002-318556 A | 10/2002 |
| JP | 3369615 B2 | 11/2002 |
| JP | 2003-007460 A | 1/2003 |
| JP | 2003-249375 A | 9/2003 |
| JP | 2003-264083 A | 9/2003 |
| JP | 2004-139746 A | 5/2004 |
| JP | 2004-228355 A | 8/2004 |
| JP | 2004-234901 A | 8/2004 |
| JP | 2004-527093 A | 9/2004 |
| JP | 2004-363170 A | 12/2004 |
| JP | 2005-012173 A | 1/2005 |
| JP | 2005-197189 A | 7/2005 |
| JP | 2005-203339 A | 7/2005 |
| JP | 2005-203340 A | 7/2005 |
| JP | 2005-267926 A | 9/2005 |
| JP | 2005-268099 A | 9/2005 |
| JP | 2005-331665 A | 12/2005 |
| JP | 2006-024573 A | 1/2006 |
| JP | 2006-114928 A | 4/2006 |
| JP | 3789991 B2 | 4/2006 |
| JP | 2006-185869 A | 7/2006 |
| JP | 2006-253443 A | 9/2006 |
| JP | 2006-294261 A | 10/2006 |
| JP | 2006-344459 A | 12/2006 |
| JP | 2007-073499 A | 3/2007 |
| JP | 2007-095606 A | 4/2007 |
| JP | 2007-214066 A | 8/2007 |
| JP | 2007-220656 | 8/2007 |
| JP | 2007-527542 A | 9/2007 |
| JP | 2007-287353 A | 11/2007 |
| JP | 2007-288071 A | 11/2007 |
| JP | 2007-288074 A | 11/2007 |
| JP | 2008-041747 A | 2/2008 |
| JP | 2008-053556 A | 3/2008 |
| JP | 2008-091072 A | 4/2008 |
| JP | 2008-124268 A | 5/2008 |
| JP | 2008-140724 A | 6/2008 |
| JP | 2008-177557 A | 7/2008 |
| JP | 2008-218250 | 9/2008 |
| JP | 2008-241238 A | 10/2008 |
| JP | 2008-270731 A | 11/2008 |
| JP | 2009-004347 A | 1/2009 |
| JP | 2009-044103 A | 2/2009 |
| JP | 2009-048960 A | 3/2009 |
| JP | 2009-054582 A | 3/2009 |
| JP | 2009-058897 A | 3/2009 |
| JP | 2009-218156 A | 9/2009 |
| JP | 2009-239180 A | 10/2009 |
| JP | 2009-260306 A | 11/2009 |
| JP | 2009-277590 A | 11/2009 |
| JP | 2009-277788 A | 11/2009 |
| JP | 2010-009746 | 1/2010 |
| JP | 2010-010670 A | 1/2010 |
| JP | 2010-021138 A | 1/2010 |
| JP | 2010-021162 A | 1/2010 |
| JP | 2010-033972 A | 2/2010 |
| JP | 2010-050107 A | 3/2010 |
| JP | 2010-073700 A | 4/2010 |
| JP | 2010-103374 A | 5/2010 |
| JP | 2010-161070 A | 7/2010 |
| JP | 2010-161185 A | 7/2010 |
| JP | 2011-040167 A | 2/2011 |
| JP | 2011-044445 | 3/2011 |
| WO | 2007/037358 | 4/2007 |
| WO | 2008/120714 A1 | 10/2008 |
| WO | 2008/149498 A1 | 12/2008 |
| WO | 2008/149499 A1 | 12/2008 |
| WO | 2009/107323 | 9/2009 |
| WO | 2009/133903 | 11/2009 |
| WO | 2010/032443 A1 | 3/2010 |
| WO | 2010/032444 A1 | 3/2010 |
| WO | 2010/058716 A1 | 5/2010 |
| WO | 2010/070798 A1 | 6/2010 |
| WO | 2010/092795 A1 | 8/2010 |
| WO | 2010/092796 A1 | 8/2010 |
| WO | 2010/092797 A1 | 8/2010 |
| WO | 2011/021343 A1 | 2/2011 |

(56) References Cited

FOREIGN PATENT DOCUMENTS

| WO | 2012/017495 A1 | 2/2012 |
| WO | 2012/017502 A1 | 2/2012 |
| WO | 2012/017503 A1 | 2/2012 |

OTHER PUBLICATIONS

Ramana et al., Electron microscopy investion of structural transformation in tungsten oxide (WO3) thin films, Jul. 6, 2005, Physica Status Solidi (a) 202, No. 10, pp. R108-R110.*
Horsley et al., Structure of Surface Tungsten Oxide Species in the WO3/Al2O3 Supported Oxide System from X-Ray Aborption Nearedge Spectroscopy and Raman Spectroscopy, 1987, Journal of Physical Chemistry, 91, pp. 4014-4020.*
United States Advisory Action in U.S. Appl. No. 13/205,773, dated Jan. 15, 2014.
United States Office Action in U.S. Appl. No. 13/205,773, dated Feb. 28, 2014.
Tungsten Oxide, McGraw-Hill Dictionary of Scientific and Technical Terms, McGraw-Hill Book Company, Fourth Edition, p. 1979, left column, date stamped Feb. 28, 1989.
Hyunbok Lee et al., "The origin of the hole injection improvements at indium tin oxide/molybdenum trioxide/N,N'-bis (1-naphthyl)-N,N'-diphenyl-1,1'-biphenyl-4,4'-diamine interface", Applied Physics Letters 93, 043308 (2008).
Kenji Koizumi et al., The electronic structure of alpha-NOD/MoO3 interface, Dai 56 kai Ouyou Butsurigaku Kankei Rengou Kouenaki Yokoushuu (Extended Abstracts for the 56th Spring Meeting of the Japan Society of Applied Physics and Related Societies), No. 3, 30p-ZA-11, The Japan Society of Applied Physics, p. 1279 (Apr. 2, 2009). Along with a verified English language translation.
Jingze Li et al., "Enhanced performance of organic light emitting device by insertion of conducting/insulating WO3 anodic buffer layer", Syntetic Metals 151, pp. 141-146 (2005).
Hiromi Watanabe et al., "Structure and Physical Property Evaluation of MoOX Thin-Film in Reactive Sputtering Method, and MoOX/$\alpha$-NPD Boundary Analysis", (Nov. 20, 2008). Along with a verified English language partial translation.
Yasuo Nakayama et al., "MoO3 on F8BT Boundary Electron Structure: Research through Photoemission Spectrography and Meta-Stable Excited Atom Spectrometry", (Nov. 20, 2008). Along with a verified English language partial translation.
Min Jung Son et al., "Interface electronic structures of organic light-emitting diodes with WO3 interlayer: A study by photoelectron spectroscopy", Organic Electronics 10, pp. 637-642 (2009).
Kaname Kanai et al., "Electronic structure of anode interface with molybdenum oxide buffer layer", Organic Electronics 11, pp. 188-194 (2010).
F. Bussolotti et al, "Surface electronic properties of polycrystalline WO3 thin films: a study by core level and valence band photoemission", Surface Science 538, pp. 113-123 (2003).
Qin-Ye Bao et al., "Interfacial electronic structures of WO3-based intermediate connectors in tandem organic light-emitting diodes", Organic Electronics 11, pp. 1578-1583 (2010).
Th. Kugler et al., "Polymer band alignment at the interface with indium tin oxide: consequences for light emitting devices", Chemical Physics Letters 310, pp. 391-396 (1999).
I. N. Yakovkin et al., "Driving force for the WO3(001) surface relaxation", Surface Science 601, pp. 1481-1488 (2007).
J. B. Pedley et al., "Thermochemical Data for Gaseous Monoxides", Journal of Physical and Chemical Reference Data. vol. 12, No. 4, pp. 967-1032 (1983).
M. Stolze et al., "Nature of substoichiometry in reactively DC-sputtered tungsten oxide thin films and its effect on the maximum obtainable colouration by gases", Thin Solid Films 409, pp. 254-264 (2002).
V. Bulovic et al., "Transparent light-emitting devices", Nature, vol. 380, p. 29 (1996).
U.S. Appl. No. 13/205,773 to Seiji Nishiyama, filed Aug. 9, 2011.
U.S. Appl. No. 13/736,419 to Shinya Fujimura, filed Jan. 8, 2013.
U.S. Appl. No. 13/739,363 to Seiji Nishiyama et al., filed Jan. 11, 2013.
U.S. Appl. No. 13/736,285 to Seiji Nishiyama et al., filed Jan. 8, 2013.
U.S. Appl. No. 13/740,353 to Seiji Nishiyama, filed Jan. 14, 2013.
U.S. Appl. No. 13/739,290 to Seiji Nishiyama, filed Jan. 11, 2013.
U.S. Appl. No. 13/746,481 to Seiji Nishiyama, filed Jan. 22, 2013.
U.S. Appl. No. 13/742,600 to Kenji Harada et al., filed Jan. 16, 2013.
U.S. Appl. No. 13/742,584 to Kenji Harada et al., filed Jan. 16, 2013.
U.S. Appl. No. 13/660,291 to Takahiro Komatsu et al., filed Oct. 25, 2011.
International Search Report in PCT/JP2010/000782, dated Apr. 6, 2010.
International Search Report in PCT/JP2010/004833, dated Oct. 12, 2010.
International Search Report in PCT/JP2010/004987, dated Sep. 7, 2010.
International Search Report in PCT/JP2010/004959, dated Nov. 9, 2010.
International Search Report in PCT/JP2010/004985, dated Nov. 16, 2010.
International Search Report in PCT/JP2010/004962, dated Sep. 7, 2010.
International Search Report in PCT/JP2010/004955, dated Sep. 7, 2010.
International Search Report in PCT/JP2010/004986, dated Aug. 31, 2010.
International Search Report in PCT/JP2010/004992, dated Nov. 16, 2010.
International Search Report in PCT/JP2010/004991, dated Nov. 16, 2010.
International Search Report in PCT/JP2012/000963, dated May 15, 2012.
United States Office Action in U.S. Appl. No. 13/205,773, dated Aug. 16, 2013.
United States Office Action in U.S. Appl. No. 13/205,773, dated Mar. 6, 2013.
United States Office Action in U.S. Appl. No. 13/205,773, dated Jan. 10, 2013.
Extended European Search Report (EESR) in European Patent Application No. 10741076.3, dated Feb. 25, 2013.
United States Office Action in U.S. Appl. No. 13/205,773, dated Jul. 17, 2014.
United States Office Action in U.S. Appl. No. 13/739,363, dated Aug. 1, 2014.
United States Office Action in U.S. Appl. No. 13/742,584, dated Aug. 7, 2014.
China Office Action from State Intellectual Property Office (SIPO) in Chinese Patent Application No. 201080004030.X, dated Aug. 26, 2013, together with a partial English language translation.
United States Office Action in U.S. Appl. No. 13/742,600, dated Aug. 18, 2014.
United States Office Action in U.S. Appl. No. 13/742,584, dated Apr. 14, 2014.
United States Office Action in U.S. Appl. No. 13/742,600, dated Apr. 14, 2014.
United States Office Action in U.S. Appl. No. 13/746,481, dated Apr. 29, 2014.

* cited by examiner

FIG. 1A
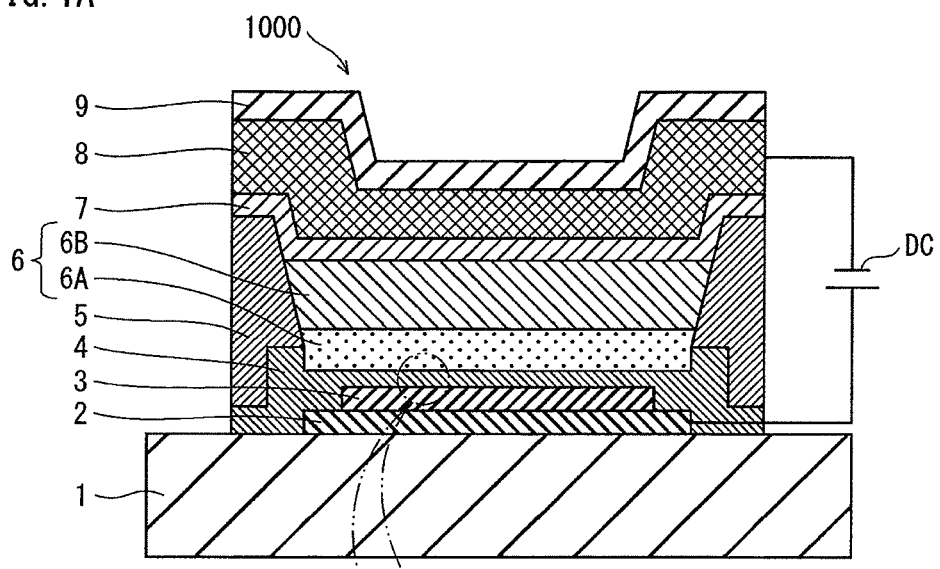
FIG. 1B
FIG. 2
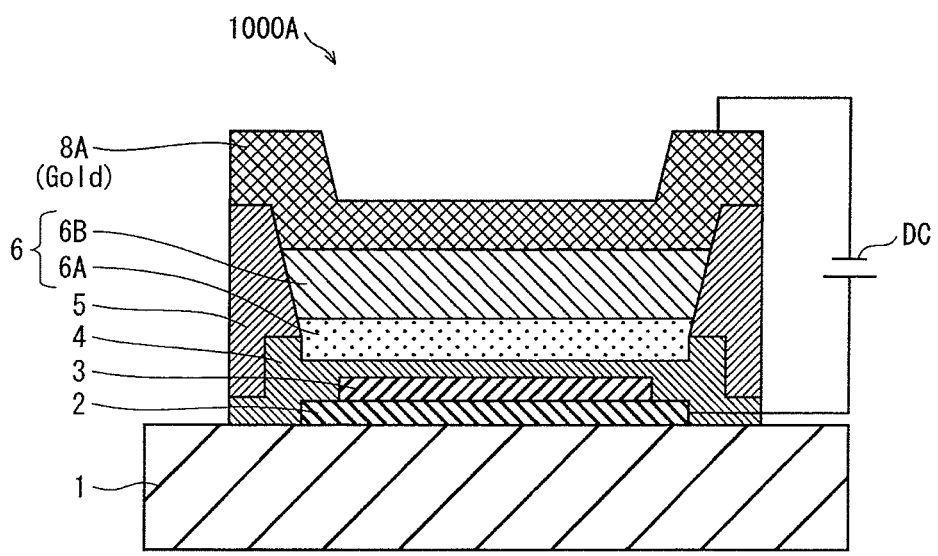

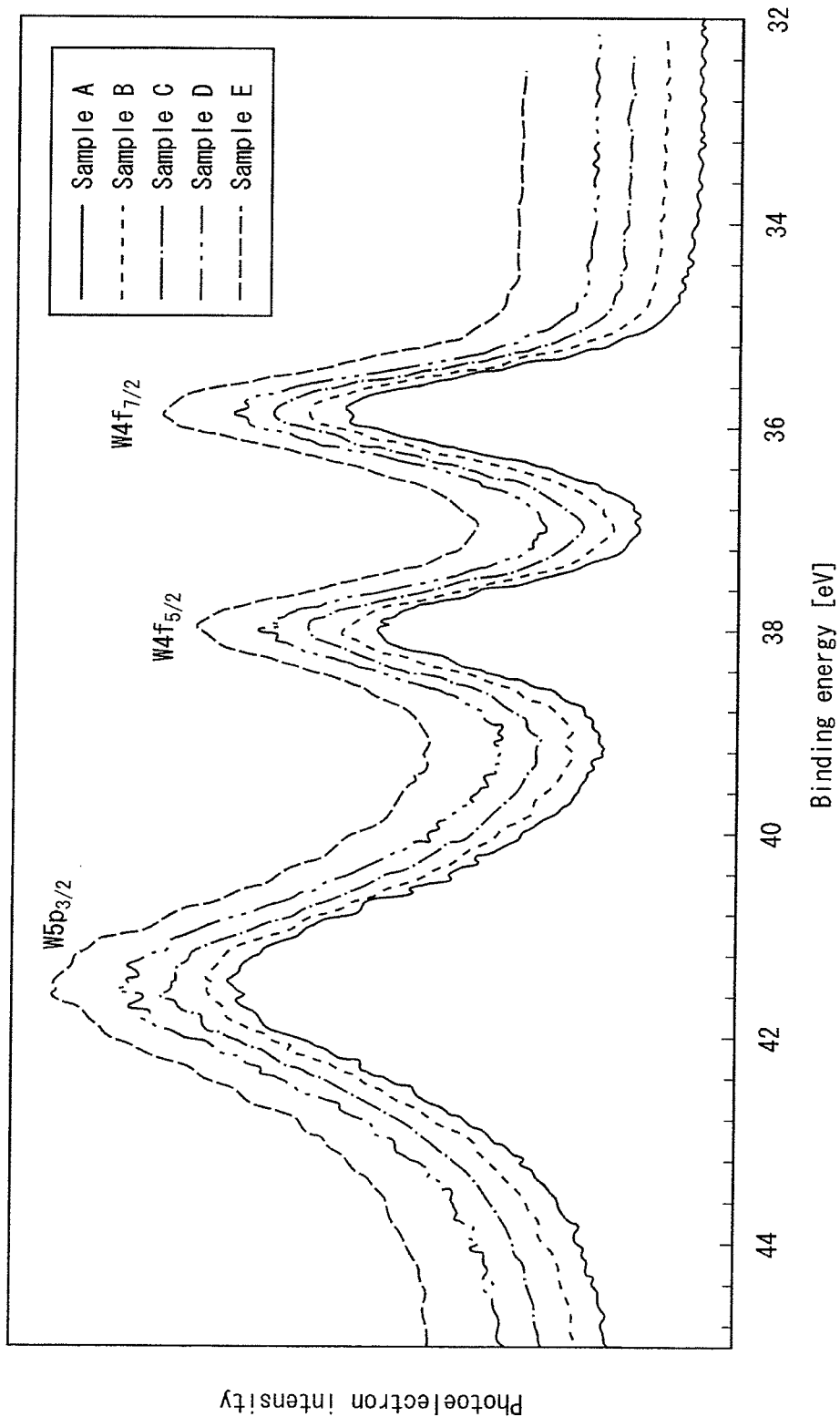

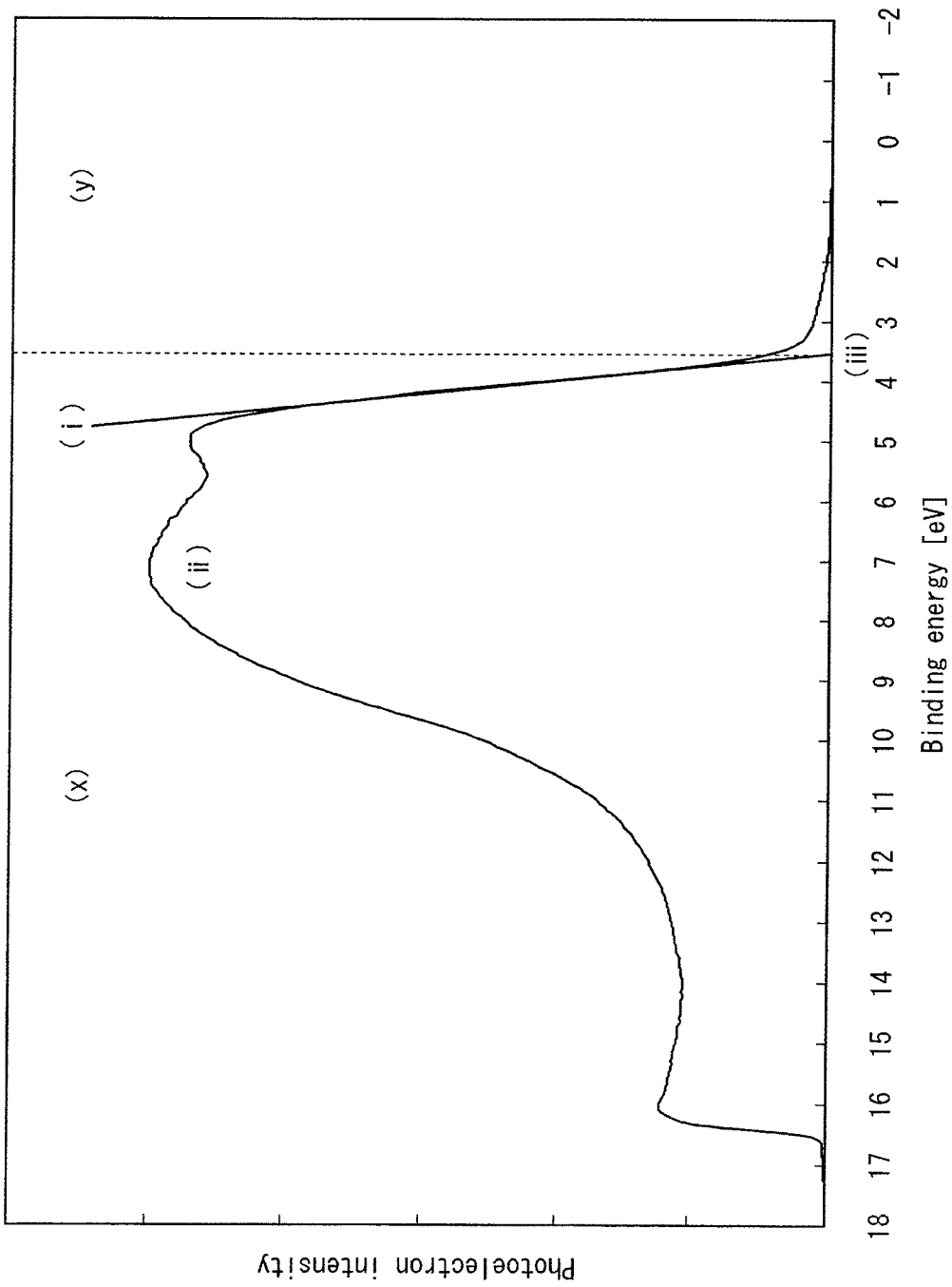

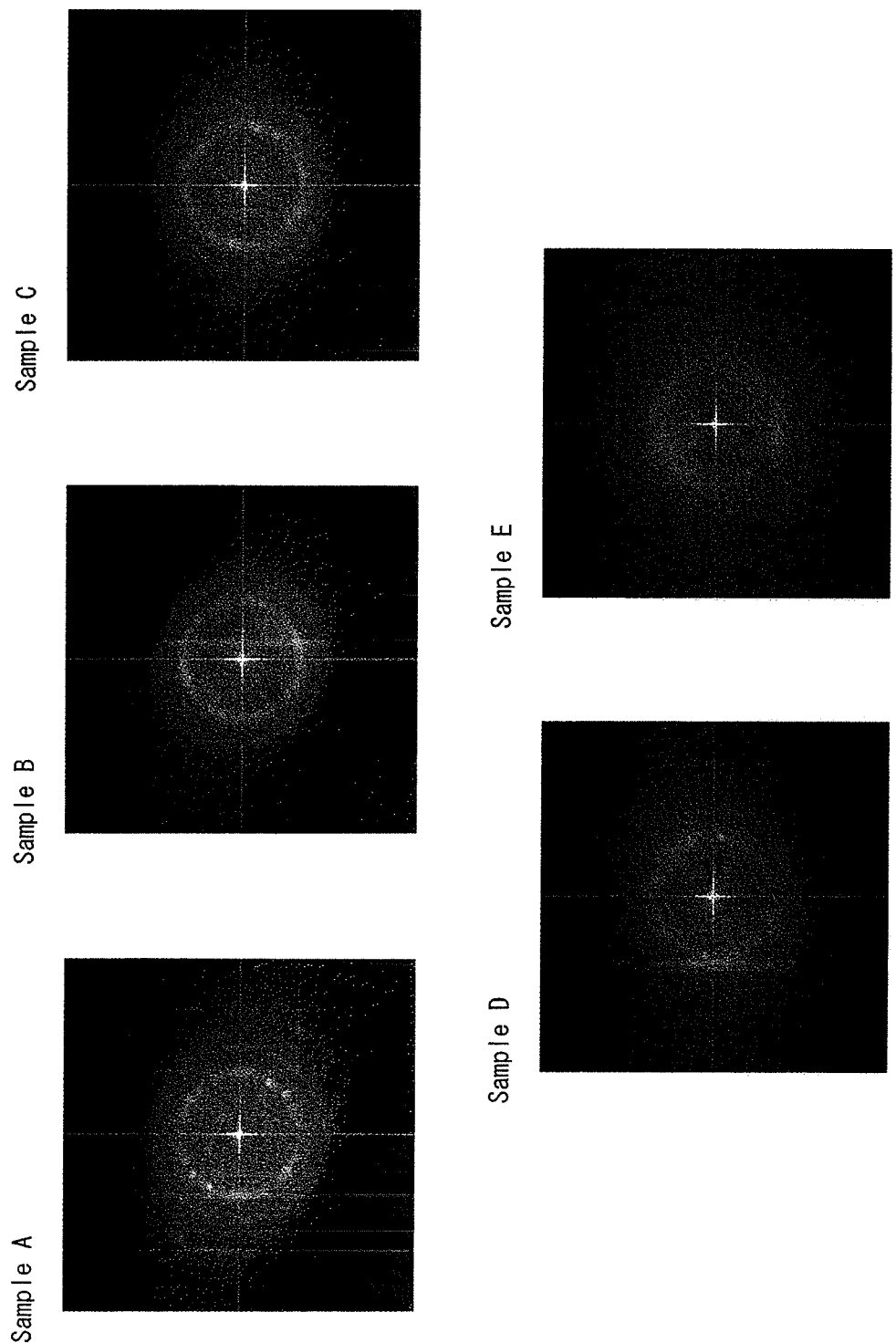

FIG. 13
Sample A
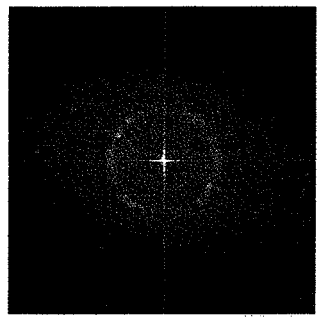 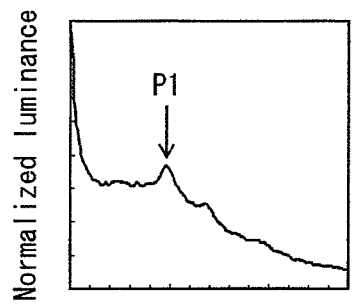
Sample B
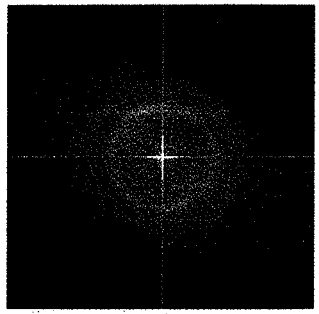 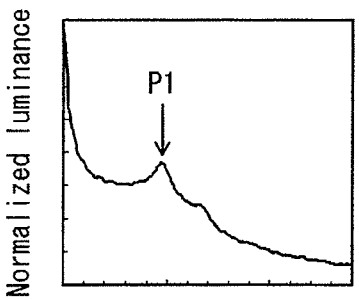
Sample C
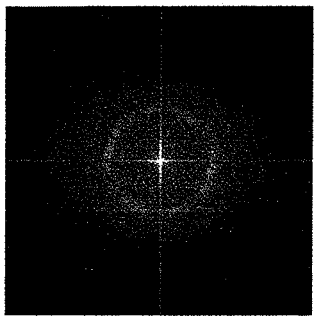 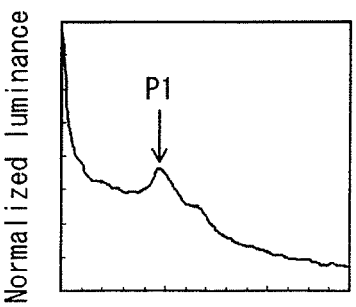

FIG. 14
Sample D
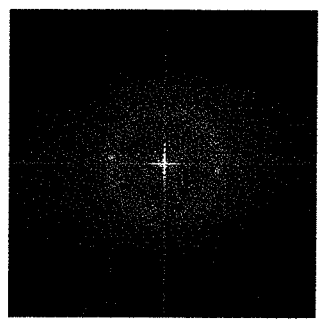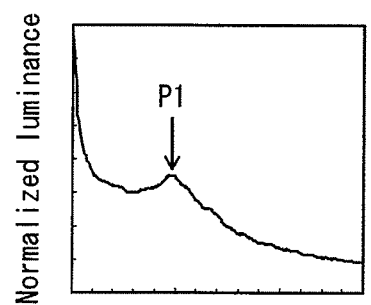
Sample E
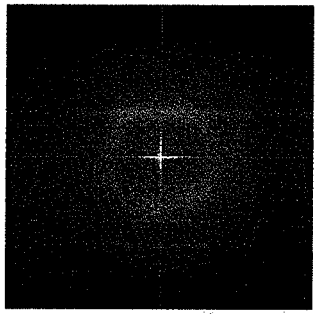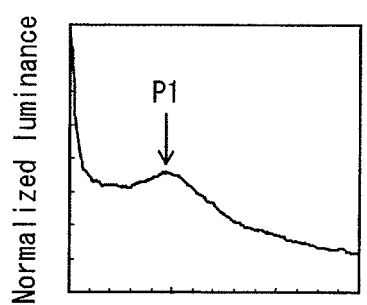

Hole injection layer

ITO layer

Hole injection layer

ITO layer

US 8,927,976 B2

ORGANIC EL ELEMENT AND PRODUCTION METHOD FOR SAME

CROSS REFERENCE TO RELATED APPLICATION

This is a continuation application of PCT Application No. PCT/JP2010/004985 filed Aug. 6, 2010, designating the United States of America, the disclosure of which, including the specification, drawings and claims, is incorporated herein by reference in its entirety.

TECHNICAL FIELD

The present invention relates to an organic electric-field light-emitting element (hereinafter referred to as an "organic EL element"), which is an electric light-emitting element, and a manufacturing method of the organic EL element. In particular, the present invention relates to a technology for improving the hole conduction efficiency of the hole injection layer.

DESCRIPTION OF THE RELATED ART

In recent years, progress has been made in research and development of diverse functional elements that use organic semiconductors. Organic EL elements are among the most common of such functional elements. An organic EL element is a current-driven light emitter that includes a pair of electrodes, consisting of an anode and a cathode, and a functional layer disposed between the pair of electrodes. The functional layer includes a light-emitting layer formed from organic material. The emission of light from the organic EL element is caused by an electric-field light-emitting phenomenon taking place as a result of the recombination of holes injected from the anode to the functional layer and electrons injected from the cathode to the functional layer after application of voltage between the electrodes. Given the high visibility of organic EL elements resulting from their self-luminescence, as well as their excellent vibration resistance resulting from the solid-state structure thereof, more attention is now being given to the application of organic EL elements as a light emitter for various display devices or as a light source.

In order for an organic EL element to emit high intensity light, efficient injection of carriers (holes and electrons) from the electrodes to the functional layer is essential. Generally, provision of an injection layer in between each of the electrodes and the functional layer is effective in realizing efficient injection of carriers to the functional layer, since an injection layer has the function of lowering the energy barrier during injection. An organic material, such as copper phthalocyanine or PEDOT (conducting polymer), or a metal oxide, such as molybdenum oxide or tungsten oxide, is used as the hole injection layer provided between the functional layer and the anode. An organic material, such as a metal complex or oxadiazole, or a metal such as barium is used as the electron injection layer provided between the functional layer and the cathode.

Among such injection layers, an improvement in hole conduction efficiency as well as longevity of the organic EL element has been reported for an organic EL element using a metal oxide film composed of a metal oxide, such as molybdenum oxide or tungsten oxide, as the hole injection layer (see Patent Literature 1, 2, and Non-Patent Literature 1).

CITATION LIST

Patent Literature

[Patent Literature 1]
  Japanese Patent Application Publication No. 2005-203339
[Patent Literature 2]
  Japanese Patent Application Publication No. 2007-288074

Non-Patent Literature

[Non-Patent Literature 1]
  Jingze Li et al., Synthetic Metals 151, 141 (2005).
[Non-Patent Literature 2]
  M. Stolze et al., Thin Solid Films 409, 254 (2002).
[Non-Patent Literature 3]
  Kaname Kanai et al., Organic Electronics 11, 188 (2010).
[Non-Patent Literature 4]
  N. Yakovkin et al., Surface Science 601, 1481 (2007).

SUMMARY

Vapor deposition or sputtering is typically used as the method for forming the above metal oxide film. Taking into consideration the heat resistance of the layers already formed on the substrate at the point of formation of the metal oxide film, the metal oxide film is typically formed at a low substrate temperature of 200° C. or less.

Forming the metal oxide film at a low substrate temperature with the sputtering method easily leads to formation of a metal oxide film with a disorderly, amorphous structure, since thermal energy produced when the film formation gas reaches the substrate is quickly absorbed by the substrate. Furthermore, the difficulty of maintaining the composition and thickness of the metal oxide film uniform when forming the film at a low substrate temperature has also been reported (Non-Patent Literature 2).

When the metal oxide film is amorphous, the locations that contribute to conduction of holes injected into the metal oxide film, such as locations similar to an oxygen vacancy, are isolated from each other throughout the film. Conduction of holes in the film is therefore achieved primarily by hopping conduction. During hopping conduction, holes hop between the isolated hole conduction locations. In order to use such a metal oxide film when driving the organic EL elements, however, it is necessary to apply a high driving voltage to the organic EL elements, thereby causing the problem of a decrease in hole conduction efficiency.

The present invention has been conceived in view of the above problem and provides an organic EL element with a hole injection layer that yields excellent hole conduction efficiency.

SOLUTION TO PROBLEM

In order to achieve the aim stated above, an organic EL element according to one aspect of the present invention comprises: an anode; a cathode; a functional layer disposed between the anode and the cathode, and including a light-emitting layer containing an organic material; a hole injection layer disposed between the anode and the functional layer; and a bank that defines an area in which the light-emitting layer is to be formed, wherein the hole injection layer includes a tungsten oxide, tungsten atoms constituting the tungsten oxide include both tungsten atoms with a valence of six and tungsten atoms with a valence less than six, the hole injection layer includes a crystal of the tungsten oxide, a particle diameter of the crystal being on an order of nanometers, an inner portion of the hole injection layer is depressed to define a recess, and an upper peripheral edge of the recess is covered with a part of the bank.

Advantageous Effects of Invention

In an organic EL element according to an aspect of the present invention, the hole injection layer is formed from tungsten oxide, and tungsten atoms constituting the tungsten oxide has a valence of six and a valence less than six. Therefore, the hole injection layer is provided with structures similar to oxygen vacancies that act as regions for the conduction of holes. Furthermore, setting the particle diameter of the crystal to be on the order of nanometers allows for the formation, in the tungsten oxide, of numerous crystal interfaces that include many structures similar to oxygen vacancies. As a result, conduction paths for holes extend through the hole injection layer in the direction of thickness thereof, allowing for effective hole conduction at a low driving voltage. It is thus possible to provide an organic EL element having a hole injection layer that yields excellent hole conduction efficiency.

When the hole injection layer contains tungsten oxide including the above-described many structures similar to oxygen vacancies, film thickness of the hole injection layer decreases in manufacturing process. This problem is so-called film thickness reduction. This film thickness reduction might affect light-emitting characteristics, such as causing the unevenness in luminance in a light-emitting portion partitioned by bank or a decreasing in service life of the organic EL element.

In contrast, according to the organic EL element which is one aspect described above of the present invention, part of the surface of the hole injection layer facing the functional layer (i.e., inner portion) has a concave structure. That is, the part of the surface is closer to the anode than the remaining portion of the surface is. Further, edge of the concave structure of the hole injection layer is covered with part of bank, which can reduce concentration of the electric field occurring at the edge. This prevents problems such as the unevenness in luminance or a decrease in service life of the organic EL element. That is, it is possible to prevent the occurrence of effects on light-emitting characteristics.

These general and specific aspects may be implemented using a manufacturing method.

Additional benefits and advantages of the disclosed embodiments will be apparent from the specification and figures. The benefits and/or advantages may be individually provided by the various embodiments and features of the specification and drawings disclosed, and need not all be provided in order to obtain one or more of the same.

BRIEF DESCRIPTION OF DRAWINGS

FIG. 1A is a schematic cross-sectional view illustrating the structure of an organic EL element 1000 according to Embodiment 1. FIG. 1B is a partially expanded view near a hole injection layer 4.

FIG. 2 is a schematic cross-sectional view illustrating a structure of a hole-only device 1000A.

FIG. 5 shows spectra belonging to $W5p_{3/2}$, $W4f_{5/2}$, and $W4f_{7/2}$, obtained by XPS measurement of the surface of the tungsten oxide layer.

FIG. 7 is a diagram illustrating a UPS spectrum of the surface of a tungsten oxide layer.

FIG. 11 shows 2D Fourier transform images for the TEM photographs shown in FIG. 10.

FIG. 13 shows Fourier transform images and plots of change in luminance for samples A, B, and C.

FIG. 14 shows Fourier transform images and plots of change in luminance for samples D and E.

DETAILED DESCRIPTION

[Embodiment]

Figure 3:
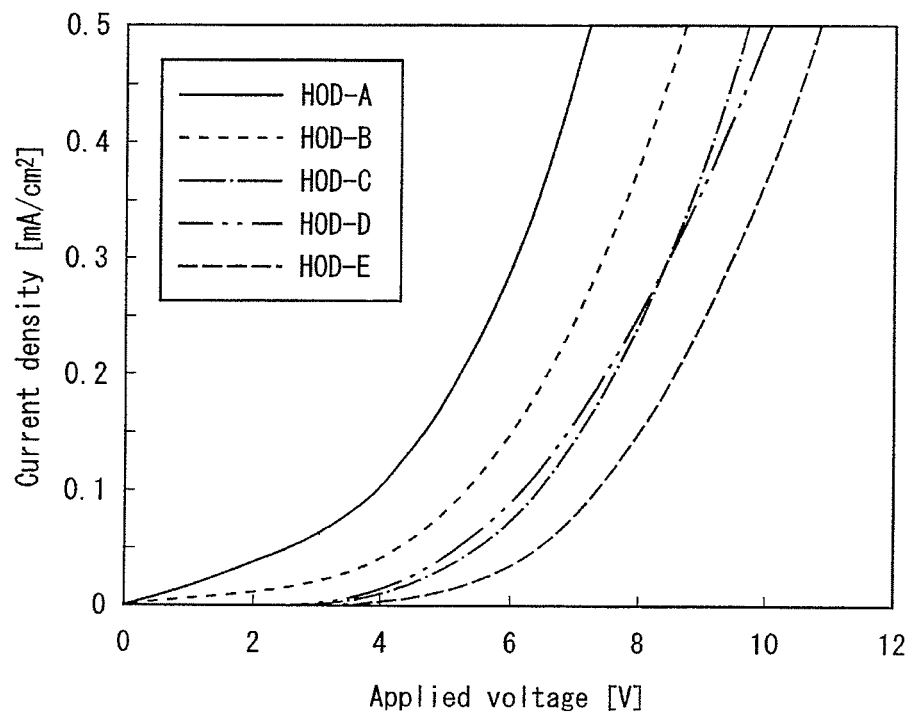
FIG. 3 is a device characteristics diagram showing relation curves illustrating relations between applied voltage and current density of the hole-only devices.

An organic EL element according to one aspect of the present invention is an organic electroluminescent (EL) element comprising: an anode; a cathode; a functional layer disposed between the anode and the cathode, and including a light-emitting layer containing an organic material; a hole injection layer disposed between the anode and the functional layer; and a bank that defines an area in which the light-emitting layer is to be formed, wherein the hole injection layer includes a tungsten oxide, tungsten atoms constituting the tungsten oxide include both tungsten atoms with a valence of six and tungsten atoms with a valence less than six, the hole injection layer includes a crystal of the tungsten oxide, a particle diameter of the crystal being on an order of nanometers, an inner portion of the hole injection layer is depressed to define a recess, and an upper peripheral edge of the recess is covered with a part of the bank.

In an organic EL element according to an aspect of the present invention, the hole injection layer is formed from tungsten oxide, and tungsten atoms constituting the tungsten oxide have a valence of six and a valence less than six. As a result, the hole injection layer is provided with structures similar to oxygen vacancies that act as regions for the conduction of holes. In addition, setting the particle diameter of the crystal to be on the order of nanometers allows for the formation, in the tungsten oxide, of numerous crystal interfaces that include many structures similar to oxygen vacancies. As a result, conduction paths for holes extend through the hole injection layer in the direction of thickness thereof, allowing for effective hole conduction at a low driving voltage. It is thus possible to provide an organic EL element having a hole injection layer that yields excellent hole conduction efficiency. In this context, the "particle diameter on an order of nanometers" refers to a size that is approximately 3 nm to 10 nm and that is smaller than the thickness of the hole injection layer.

When the hole injection layer contains tungsten oxide including the above-described many structures similar to oxygen vacancies, film thickness of the hole injection layer decreases in manufacturing process. This problem is so-called film thickness reduction. This film thickness reduction might affect light-emitting characteristics, such as causing the unevenness in luminance in a light-emitting portion partitioned by banks or a decreasing in service life of the organic EL element. In contrast, according to the organic EL element which is one aspect described above of the present invention, part of the surface of the hole injection layer facing the functional layer has a concave structure. That is, the part of the surface is closer to the anode than the remaining portion of the surface is. Further, edge of the concave structure of the hole injection layer is covered with part of bank, which can reduce concentration of the electric field occurring at the edge. This prevents problems such as the unevenness in luminance or a decrease in service life of the organic EL element. That is, it is possible to prevent the occurrence of effects on light-emitting characteristics.

Here, the valence less than six may be a valence of five. A ratio $W^{5+}/W^{6+}$ of the number of the tungsten atoms with a valence of five to the number of the tungsten atoms with a valence of six may be at least 3.2%. Including tungsten atoms with a valence of five at a ratio of at least 3.2% with respect to tungsten atoms with a valence of six achieves even better hole conduction efficiency.

Setting the ratio $W^{5+}/W^{6+}$ to be at least 3.2% and at most 7.4% achieves even better hole conduction efficiency.

A hard X-ray photoelectron spectroscopy spectrum of a surface of the hole injection layer may exhibit a first peak and a second peak, the first peak corresponding to a $4f_{7/2}$ energy level of the tungsten atoms with a valence of six, and the second peak being in a region lower than the first peak in terms of binding energy. Specifically, the second peak may be in a region between 0.3 electron volts and 1.8 electron volts lower, in terms of binding energy, than the first peak. The first peak corresponds to the peak for tungsten atoms with a valence of six, whereas the second peak corresponds to the peak for tungsten atoms with a valence of five.

An area intensity of the second peak may be between 3.2% and 7.4% of an area intensity of the first peak. The ratio between the areas of the first peak in the second peak corresponds to the abundance ratio of tungsten atoms with a valence of five to tungsten atoms with a valence of six. The above range for the area intensity of the second peak therefore indicates that the ratio of the tungsten atoms with a valence of five to the tungsten atoms with a valence of six is between 3.2% and 7.4%.

Tungsten atoms with a valence less than the maximum valence may cause a band structure of the hole injection layer to have an occupied energy level in a range between 1.8 electron volts and 3.6 electron volts lower than a lowest energy level of a valence band in terms of binding energy. Due to the existence of this occupied energy level, the hole injection barrier between the hole injection layer and the functional layer is reduced. This achieves even better hole injection efficiency. In this context, the "lowest energy level of a valence band in terms of binding energy" refers to the energy at a position at the upper end of the valence band from the vacuum level.

The hole injection layer may include a plurality of crystals of the tungsten oxide, each of the crystals having a particle diameter of between 3 nm and 10 nm, and regular linear structures at intervals of between 1.85 angstroms and 5.55 angstroms may appear in a lattice image by transmission electron microscopy observation of the hole injection layer. In a TEM photograph of a tungsten oxide layer that includes crystals having a particle diameter of between 3 nm and 10 nm, regular linear structures appear based on how bright regions are partially aligned in the same direction. These regular linear structures suggest the existence of a crystal on the order of nanometers.

In a 2D Fourier transform image of the lattice image, a pattern of concentric circles centering on a center point of the 2D Fourier transform image may appear. The existence of a crystal on the order of nanometers results in the appearance of the above pattern of concentric circles.

In a plot of distance from the center point versus normalized luminance, the normalized luminance being a normalized value of the luminance of the 2D Fourier transform image at the corresponding distance, at least one peak of the normalized luminance may appear. One peak of the normalized luminance in the above plot corresponds to one of the concentric circles.

With a peak width being a difference between the distance corresponding to a position of a peak of the normalized luminance appearing closest to the center point in the plot and the distance corresponding to a position at which the peak of the normalized luminance begins to rise, the peak width may be less than 22 when a difference between the distance corresponding to the center point and the distance corresponding to the peak of the normalized luminance appearing closest to the center point is 100. The peak of the normalized luminance appearing closest to the center point corresponds to the concentric circle based on the existence of the crystal on the order of nanometers. As the number of crystals on the order of nanometers increases, the full width at half maximum of the peak of the normalized luminance decreases, i.e. the width of the normalized luminance decreases. Even better hole conduction efficiency can be achieved when the number of crystals on the order of nanometers is such that the peak width falls within a predetermined range.

The functional layer may include amine-containing material. In amine-containing organic molecules, the electron density of the HOMO is distributed centering on a lone pair of electrons of a nitrogen atom, which becomes a hole injection site. Including amine-containing material in the functional layer allows for formation of hole injection sites along the functional layer, thereby allowing holes that are conducted from the hole injection layer to be efficiently injected into the functional layer.

The functional layer may be one of a hole transfer layer that transfers holes, and a buffer layer that one of adjusts optical characteristics and/or blocks electrons.

The part of the bank may reach a bottom of the recess of the hole injection layer, and a side surface of the bank may slope upward from the bottom of the recess to a top of the bank. With this structure, when the light-emitting layer is formed using printing technology such as inkjet technology, ink is distributed to every corner of an area defined by the bank. As a result, formation of a void and the like is suppressed.

The part of the bank may be out of contact with a bottom of the recess. In order to cover the upper peripheral edge of the recess with the part of the bank, there is a method, for example, of heat-treating a bank material to make it fluid so that the upper peripheral edge of the recess is covered with a part of the bank material. With the above-mentioned structure, the temperature and time of the heat treatment are reduced as it is not necessary to extend the bank material to the bottom of the recess.

The hole injection layer may extend laterally along a bottom surface of the bank. The upper peripheral edge of the recess may be a convex portion composed of (i) a part of the upper surface of the hole injection layer in which the recess is not formed and (ii) the inner side surface of the recess. The bank may have liquid repellency and the hole injection layer may have liquid affinity.

Further, an organic EL panel, an organic EL light-emitting apparatus and an organic EL display apparatus each pertaining to the present invention include an organic EL element with the above-described structure. This allows for an organic EL panel, an organic EL light-emitting apparatus, and an organic EL display apparatus that achieve the same advantageous effects as above.

A manufacturing method of an organic EL element according to one aspect of the present invention comprises the steps of: preparing an anode; forming a tungsten oxide layer on the anode using a sputtering gas including argon gas and oxygen gas and using tungsten as a sputtering target, under film forming conditions such that a total pressure of the sputtering gas is at least 2.3 Pa and at most 7.0 Pa, a partial pressure of the oxygen gas in the sputtering gas is at least 50% and at most 70%, an input power density per unit area of the sputtering target is at least 1.5 W/cm2 and at most 6.0 W/cm2, and a value yielded by dividing the total pressure of the sputtering gas by the input power density is larger than 0.7 Pa·cm2/W; forming a bank material layer containing material constituting a bank above the tungsten oxide layer; forming a recess by removing a portion of the bank material layer so that the tungsten oxide layer is partially exposed and an upper surface of the tungsten oxide layer in the recess is closer to the anode than an upper peripheral edge of the recess, the recess having an inner bottom surface and an inner side surface that is continuous with the inner bottom surface; heat-treating a remaining portion of the bank material layer, the remaining portion of the bank material layer being made fluid so that the bank material layer extends to cover the upper peripheral edge of the recess; forming functional layer including a light-emitting layer above an exposed surface of the tungsten oxide layer after the heat treatment; and forming a cathode above the functional layer. Further, the tungsten oxide layer may be formed so that tungsten atoms constituting the tungsten oxide layer include both tungsten atoms with a maximum valence thereof and tungsten atoms with a valence less than the maximum valence, and so as to include a tungsten oxide crystal having a particle diameter on an order of nanometers. Furthermore, when forming the tungsten oxide layer, the value yielded by dividing the total pressure of the sputtering gas by the input power density may be less than 3.2 Pa·cm2/W. Performing the above steps allows for formation of an organic EL element that achieves the same advantageous effects as above.

[Embodiment 1]

<Structure of Organic EL Element>

FIG. 1A is a schematic cross-sectional view illustrating the structure of an organic EL element 1000 according to Embodiment 1. FIG. 1B is a partially expanded view near a hole injection layer 4.

The organic EL element 1000 is, for example, manufactured by applying a functional layer with a wet process. The hole injection layer 4 and a variety of functional layers that have predetermined functions and include organic material are layered together and placed between a pair of electrodes consisting of an anode 2 and a cathode 8.

Specifically, as shown in FIG. 1A, the organic EL element 1000 includes the following layered on the main surface of a substrate 1 in this order: the anode 2, an ITO layer 3, the hole injection layer 4, a buffer layer 6A (an example of a functional layer), a light-emitting layer 6B (an example of a functional layer), an electron injection layer 7, the cathode 8, and a sealing layer 9.

(Substrate 1, Anode 2, ITO Layer 3)

The substrate 1 is the base material for the organic EL element 1000 and may be formed with an insulating material such as alkali-free glass, soda glass, nonfluorescent glass, phosphate glass, borate glass, quartz, acrylic resin, styrenic resin, polycarbonate resin, epoxy resin, polyethylene, polyester, silicone resin, or alumina.

While not shown in the figures, a TFT (thin film transistor) is provided on the surface of the substrate 1 for driving the organic EL element 1000, with the anode 2 layered thereabove. The anode 2 may be made of APC (alloy of silver, palladium and copper), ARA (alloy of silver, rubidium and gold), MoCr (alloy of molybdenum and chrome) or NiCr (alloy of nickel and chrome), for example.

The ITO (indium tin oxide) layer 3 is interposed between the anode 2 and the hole injection layer 4, and has a function of improving the bond between these layers.

(Hole Injection Layer 4)

The hole injection layer 4 is formed from a tungsten oxide film (WOx) having a thickness of, for example, 30 nm. In the composition formula WOx denoting the composition of the tungsten oxide, x is a real number existing within a range of approximately $2<x<3$. Concerning the hole injection layer 4, it is preferable that the hole injection layer 4 consist of only tungsten oxide. However, the inclusion of a trace level of impurities is acceptable, provided that the amount does not exceed the amount of impurities which may be incorporated as a result of normal processing.

The tungsten oxide layer is formed under predetermined film forming conditions. Details on these predetermined film forming conditions are provided in the sections "Outline of Method of Manufacturing Organic EL Element 1000" and "Film Forming Conditions for Hole injection layer 4". By forming the tungsten oxide layer under these predetermined film forming conditions, the tungsten oxide layer includes an abundance of tungsten oxide crystals 13 as illustrated in FIG. 1B. The crystals 13 are formed so that the particle diameter of each crystal 13 is on the order of nanometers. For example, if the thickness of the hole injection layer 4 is approximately 30 nm, the particle diameter of the crystals 13 is approximately between 3 nm and 10 nm. Hereinafter, the crystals 13 whose particle diameter is on the order of nanometers are referred to as "nanocrystals 13", and a layered structure composed of nanocrystals 13 is referred to as a "nanocrystal structure". Note that in the hole injection layer 4, regions other than the regions with the nanocrystal structure include an amorphous structure.

In a hole injection layer 4 with the above nanocrystal structure, the tungsten atoms (W) constituting the tungsten oxide are distributed to include both atoms with the maximum valence possible for tungsten and atoms with a valence less than the maximum valence. Typically, the crystal structure of tungsten oxide is not uniform, but rather includes structures similar to an oxygen vacancy. Within tungsten oxide having a crystal structure that does not include a structure similar to an oxygen vacancy, the maximum valence possible for tungsten is a valence of six. On the other hand, within tungsten oxide having a crystal structure that does include a structure similar to an oxygen vacancy, it is known that the valence of tungsten is a valence of five, which is lower than the maximum valence. The tungsten oxide film includes tungsten atoms with a variety of valences, including both the maximum valence and a valence lower than the maximum valence. The overall valence for the film is the average of these different valences.

It has been reported that forming a structure similar to an oxygen vacancy improves the hole conduction efficiency due to an electron level that is based on the structure (Non-Patent Literature 3). Furthermore, it is known that this structure similar to an oxygen vacancy is abundant along the crystal surface, as described with reference to FIG. 9.

Therefore, distributing tungsten atoms with a valence of five and tungsten atoms with a valence of six in the tungsten oxide and providing the hole injection layer 4 with structures similar to an oxygen vacancy offers the promise of increased hole conduction efficiency. Specifically, the holes provided from the anode 2 to the hole injection layer 4 are conducted along oxygen vacancies existing along the crystal interface. Therefore, providing the tungsten oxide layer with the nanocrystal structure allows for an increase in the number of paths by which holes are conducted, thus leading to an improvement in hole conduction efficiency. In turn, this allows for a decrease in the driving voltage of the organic EL element 1000.

Additionally, the tungsten oxide forming the hole injection layer 4 has high chemical resistance, i.e. the tungsten oxide does not easily undergo undesired chemical reactions. Therefore, even if the hole injection layer 4 comes into contact with solvents or the like used during processes performed after formation of the hole injection layer 4, damage to the hole injection layer 4 due to dissolution, degradation, or a change of properties is reduced. Forming the hole injection layer 4 from a material with high chemical resistance thus prevents a reduction in hole conduction properties of the hole injection layer 4.

The hole injection layer 4 in the present embodiment includes both the case of being formed only from tungsten oxide with a nanocrystal structure and the case of being formed from tungsten oxide with a nanocrystal structure and tungsten oxide with an amorphous structure. Furthermore, it is desirable that the nanocrystal structure be present throughout the hole injection layer 4. Holes can be efficiently conducted from the lower edge of the hole injection layer 4 to the upper edge of the hole injection layer 4, however, as long as grain boundaries are connected in at least one location between the interface where the anode 2 contacts with the hole injection layer 4 and the interface where the hole injection layer 4 contacts with the buffer layer 6A.

Note that examples have been reported on in the past of using a tungsten oxide layer including crystalized tungsten oxide as the hole injection layer. For example, Non-Patent Literature 1 reports that crystallizing a tungsten oxide layer by annealing at 450° C. improves hole conduction properties. However, Non-Patent Literature 1 does not demonstrate the potential for practical mass-production of a large organic EL panel nor describe the effect on other layers above the substrate due to formation of the hole injection layer. Furthermore, Non-Patent Literature 1 does not disclose purposely forming tungsten oxide nanocrystals having an oxygen vacancy in the hole injection layer. The hole injection layer according to an aspect of the present invention is formed from a tungsten oxide layer that is resistant to chemical reactions, is stable, and can withstand the mass production process of large organic EL panels. Furthermore, purposely incorporating oxygen vacancies in the tungsten oxide layer achieves excellent hole conduction properties and hole injection efficiency, another decisive difference from conventional technology.

(Bank 5)

On the surface of the hole injection layer 4, a bank 5 that is composed of organic material with insulating property (for instance, acrylic resins, polyimide resins, novolac-type phenolic resins and the like) is formed. The bank 5 is formed to have a uniform trapezoidal cross-section and to have either a line bank structure or a pixel bank structure. By the provision of the banks 5, the surface of the hole injection layer 4 is divided into a plurality of sections. At each of the sections on the surface of the hole injection layer 4, a functional layer is formed. The functional layer includes the buffer layer 6A, and a light-emitting layer 6B of a corresponding color among the colors of red (R), green (G), and blue (B). As is illustrated in FIGS. 1A, when applying the organic EL element 1000 to an organic EL panel, a plurality of units (pixels) of organic EL elements 1000 are disposed in parallel on the surface of the substrate 1. More specifically, each unit, or pixel, is a series of three organic EL elements 1000, and each of the three organic EL elements 1000 in a pixel is allocated to a corresponding one of the colors R, G, and B.

It should be note that the banks 5 are not essential to the present invention, and an organic EL element 1000 is to be used alone, the banks need not be formed.

(Functional Layer 6)

Other than the hole injection layer 4, the organic EL element 1000 includes a functional layer that fulfills certain functions necessary for the organic EL element 1000. The functional layer of the present invention is either one, a combination of two or more, or every one of layers such as the following: a hole transport layer, a light-emitting layer, and a buffer layer. The hole transport layer transports holes. The light-emitting layer emits light as a result of recombination of holes and electrons which are injected therein. The buffer layer is used for the adjustment of optical characteristics or for blocking electrons. In the present embodiment, an example is described in which the functional layer 6 includes the buffer layer 6A and the light-emitting layer 6B.

The buffer layer 6A is a 20 nm-thick layer composed of TFB(poly(9,9-di-n-octylfluorene-alt-(1,4-phenylene-((4-sec-butylphenyl)imino)-1,4-phenylene)), which is an amine-based organic polymer, for example.

Forming the buffer layer 6A from an amine-containing organic molecules allows for holes conducted from the hole injection layer 4 to be efficiently injected into layers included in the functional layer formed above the buffer layer 6A. This is because in amine-containing organic molecules, the electron density of the HOMO is distributed centering on a lone pair of electrons of a nitrogen atom, which becomes a hole injection site. Including amine-containing organic molecules in the buffer layer 6A allows for formation of hole injection sites by the buffer layer 6A.

The light-emitting layer 6B is, for example, a 70 nm-thick layer of F8BT (poly(9,9-di-n-octylfluorene-alt-benzothiadiazole)), which is an organic polymer. However, the material to be used in forming the light-emitting layer 6B is not limited to this, and the light-emitting layer 6B may include a commonly-known organic material. For example, the light-emitting layer 6B may be formed from a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group III metal, metal complex of oxine, rare earth metal complex, etc., as recited in Japanese Patent Application Publication No. H5-163488.

(Hole Injection Layer 7, Cathode 8, Sealing Layer 9)

The electron injection layer 7 has a function of transporting, to the light-emitting layer 6B, an electron injected from the cathode 8. The electron injection layer 7 is 5 nm thick, for example. It is preferable that the electron injection layer 7 be formed from valium, phthalocyanine, fluorine lithium, or a combination of these materials.

The cathode 8 is, for example, composed of an aluminum layer with a thickness of 100 nm. The anode 2 and the cathode 8 described above are connected to a direct current voltage source DC to supply power to the organic EL element 1000 from the outside.

The sealing layer 9 has a function of preventing the light-emitting layer 6 and so on from being exposed to moisture and air. The sealing layer 9 is made from a material such as SiN (silicon nitride) and SiON (silicon oxynitride). In the case of a top emission type organic EL element, it is desirable that the sealing layer 9 be formed from a light-transmissive material.

<Outline of Method of Manufacturing Organic EL Element 1000>

The following outlines a method of manufacturing the organic EL element 1000 pertaining to the present embodiment based on FIGS. 1A and 1B.

First, the substrate 1 is placed inside the chamber of a sputtering film-forming apparatus. A predetermined sputtering gas is injected into the chamber, and using the reactive sputtering method, the anode 2 is formed. Note that the anode 2 may be formed by another method such as vacuum deposition. Subsequently, in the above chamber, the ITO layer 3 is formed on the anode 2 using the sputtering method.

Next, the hole injection layer 4 is formed. It is desirable that the hole injection layer 4 be formed with the reactive sputtering method. Specifically, metal tungsten is placed in the chamber as the sputtering target, with argon gas as the sputtering gas and oxygen gas as the reactive gas. Under these conditions, the argon is ionized by the application of high voltage and caused to bombard the sputtering target. The metal tungsten ejected as a result of the sputtering phenomenon reacts with the oxygen gas, and produces tungsten oxide. As a result, the "sputtered" tungsten oxide layer is formed on the ITO layer 3.

While details on the film forming conditions are provided in the following section, in brief, the following conditions are desirable: (1) the total pressure of the sputtering gas composed of argon gas and oxygen gas should be at least 2.3 Pa and at most 7.0 Pa, and (2) the partial pressure of the oxygen gas with respect to the total pressure of the sputtering gas should be at least 50% and at most 70%. Furthermore, (3) the input power per unit area of the target (input power density) should be at least 1.5 W/cm$^2$ and at most 6.0 W/cm$^2$, and (4) the value yielded by dividing the total pressure of the sputtering gas by the input power density should be larger than 0.7 Pa·cm$^2$/W. The tungsten oxide film having a nanocrystal structure is formed under these film forming conditions. The tungsten oxide film having a nanocrystal structure is formed under these film forming conditions.

As described above, the tungsten oxide forming the hole injection layer 4 has high chemical resistance. Therefore, even if the hole injection layer 4 comes into contact with solvents or the like used during subsequent processes, damage to the hole injection layer 4 due to dissolution, degradation, or a change of properties is reduced.

Subsequently, as the material for forming the bank 5, photosensitive resin material or, more preferably, photoresist material containing fluorine material is to be prepared. In order to form the bank 5, first, the bank material so prepared is uniformly applied on the hole injection layer 4. After performing prebaking, a mask having an aperture of a predetermined shape (a pattern of the bank 5 to be formed) is placed over the prebaked bank material. After exposing the bank material to light from over the mask, unhardened, redundant bank material is removed by using a developer. Finally, by performing rinsing with pure water, the bank 5 is yielded.

Next, drops of ink composition containing organic amine-containing molecular material are dripped onto the surface of the hole injection layer 4 by a wet process, such as spin coating or an inkjet method, and the solvent is removed by volatilization. The buffer layer 6A is thus formed.

Next, drops of ink composition containing organic light-emitting material are dripped by the same method onto the surface of the buffer layer 6A, and the solvent is removed by volatilization. The light-emitting layer 6B is thus formed.

Here, it should be noted that the method for forming the buffer layer 6A and the light-emitting layer 6B is not limited to the above method. Other than spin coating and the inkjet method, ink may be ejected/applied by another commonly-known method such as the gravure printing method, the dispenser method, the nozzle coating method, the intaglio printing method, or the relief printing method.

Next, the electron injection layer 7 and the cathode 8 are formed on the surface of the light-emitting layer 6B by vacuum deposition.

Finally, the sealing layer 9 is formed. When a sealing cap is provided instead of the sealing layer 9, the sealing cap may be formed of, for instance, the same material as the substrate 1, and a getter which absorbs moisture and the like may be provided within the space enclosed by the sealing cap.

Through the manufacturing steps described above, the organic EL element 1000 is completed.

<Experiments on Film Forming Conditions for Hole injection Layer 4 and Analysis of Results>

(Film Forming Conditions for Hole Injection Layer 4)

In the present embodiment, the tungsten oxide constituting the hole injection layer 4 is formed under predetermined film forming conditions, thus intentionally providing the hole injection layer 4 with a nanocrystal structure to improve hole conduction properties and allows for a low driving voltage for the organic EL element 1000. These predetermined film forming conditions are now described in detail. These predetermined film forming conditions are now described in detail.

A DC magnetron sputtering device was used as the sputtering device, with metal tungsten as the sputtering target. The substrate temperature was not controlled. It is considered desirable to form the film using the reactive sputtering method, with argon gas as the sputtering gas, oxygen gas as the reactive gas, and an equivalent amount of each gas released. Well-known methods other than sputtering may be used for film formation, such as the vapor deposition method or CVD.

In order to form a tungsten oxide film with high crystallinity, it is necessary for atoms to form a regular film on the substrate, and it is desirable to form the film at as low a deposition rate as possible.

The film forming rate during film formation by sputtering is considered to depend on the above conditions (1) through (4). As a result of the experiments described below, it was confirmed that with the above numerical ranges for conditions (1) through (4), the driving voltage lowers, and a tungsten oxide film with high crystallinity is obtained.

With respect to condition (1), note that while the upper limit of the total pressure in the experiment conditions described below is 4.7 Pa, it was confirmed separately that a similar trend is exhibited at least up to 7.0 Pa.

Furthermore, with respect to condition (2), while the partial pressure of the oxygen gas with respect to the total pressure is set to 50%, the reduction in driving voltage was confirmed at least in the range between 50% and 70%.

A further explanation of condition (4) is now provided. When the amounts of argon gas and oxygen gas that are released are equivalent, it is assumed that film properties are determined by the input power density and the pressure at the time of film formation (total pressure). The input power density in condition (3) changes both the number and energy of sputtered tungsten atoms and tungsten atom clusters. In other words, by reducing the input power density, the number of sputtered tungsten atoms decreases, so that the tungsten film formed on the substrate can be formed at a low energy, thus offering the promise of film formation at a low film formation rate. The total pressure at the time of film formation in condition (1) changes the mean free path to the film formation substrate of the tungsten atoms and tungsten atom clusters that are sputtered and released in the gas phase. In other words, when the total pressure is high, the probability that the tungsten atoms and tungsten atom clusters will repeatedly collide with gas components in the film formation chamber before reaching the substrate increases. It is considered that an increase in the randomness of the flying tungsten atoms and tungsten atom clusters reduces the number of tungsten atoms that form as a film on the substrate and causes the tungsten to form the film at a low energy. As a result, film formation at a low film formation rate can be expected.

It is considered, however, that there are limits to the extent to which device characteristics can be improved by independently controlling the input power density and the total pressure at the time of film formation in order to change the film forming rate during sputtering. Accordingly, the value yielded by dividing the total pressure at the time of film formation (Pa) by the input power density (W/cm$^2$) was established as a new film forming condition (4) serving as an index to determine the film forming rate of the tungsten atoms.

Through experiment, the following tendencies were confirmed; as the value of the film forming condition (4) increases, the driving voltage decreases, and the film forming rate decreases; conversely, as the value of the film forming condition (4) decreases, the driving voltage increases, and the film forming rate increases.

Specifically, in the experiment conditions described below, the total pressure/power density was at least 0.78 Pa·cm$^2$/W. A value larger than 0.7 Pa·cm$^2$/W is considered desirable, and for even more reliable film formation, a value of 0.8 Pa·cm$^2$/W or greater is considered desirable. On the other hand, the upper limit on the total pressure/power density was 3.13 Pa·cm$^2$/W in the experiment conditions. A value less than 3.2 Pa·cm$^2$/W is considered desirable, and for even more reliable film formation, a value of 3.1 Pa·cm$^2$/W or less is considered desirable. As described above, however, out of consideration for the film formation rate, restrictions are not necessarily placed on the upper limit.

Next, the inventors confirmed the validity of the above film forming conditions through experiments.

First, hole-only device 1000A as illustrated in FIG. 2 were manufactured as assessment devices in order to assess the degree to which the hole conduction efficiency from the hole injection layer 4 to the buffer layer 6A depends on film forming conditions.

In an actual operating organic EL element, the carriers constituting electric current consist of both holes and electrons. As such, the electrical characteristics of an organic EL element reflect not only hole current, but also electron current. In a hole-only device, however, the injection of electrons from the cathode is blocked, and there is almost no flow of electron current. Therefore, the current consists almost entirely of hole current. The carriers can thus be considered almost entirely to be holes, making the hole-only device appropriate for assessment of hole conduction efficiency.

As illustrated in FIG. 2, the hole-only device 1000A is the organic EL element 1000 in FIG. 1A, with the cathode 8 replaced by a cathode 8A made from gold. Specifically, the hole-only device 1000A was formed based on the above-described manufacturing method. A hole injection layer 4 composed of tungsten oxide has a thickness of 30 nm, a buffer layer 6A composed of TFB has a thickness of 20 nm, a light-emitting layer 6B composed of F8BT has a thickness of 70 nm, and a cathode 6A composed of gold has a thickness of 100 nm.

In the manufacturing of the hole-only devices 1000A, the hole injection layer 4 was formed by applying the reactive sputtering method with a DC magnetron sputtering device. The gas introduced into the chamber was composed of at least one of argon gas and oxygen gas, and the sputtering target used was metal tungsten. The substrate temperature was not controlled, whereas the total pressure was adjusted by varying the flow amount of each gas. As shown in Table 1, the hole-only devices 1000A were manufactured under each of five film forming conditions, A through E. The total pressure and the input power density differed between the film forming conditions, as can be seen in Table 1. The partial pressure of the argon gas and the oxygen gas in the chamber were each 50%.

Hereinafter, the hole-only device 1000A formed under film forming conditions A is referred to as HOD-A, the hole-only device 1000A formed under film forming conditions B is referred to as HOD-B, the hole-only device 1000A formed under film forming conditions C is referred to as HOD-C, the hole-only device 1000A formed under film forming conditions D is referred to as HOD-D, and the hole-only device 1000A formed under film forming conditions E is referred to as HOD-E.

TABLE 1

| Film Forming Conditions | Total Pressure (Pa) | Oxygen Partial Pressure (%) | Input Power Density (W/cm$^2$) | Total Pressure/ Power Density (Pa · cm$^2$/W) |
| --- | --- | --- | --- | --- |
| A | 4.70 | 50 | 1.50 | 3.13 |
| B | 4.70 | 50 | 3.00 | 1.57 |
| C | 4.70 | 50 | 6.00 | 0.78 |
| D | 2.35 | 50 | 1.50 | 1.57 |
| E | 2.35 | 50 | 6.00 | 0.39 |

Each of the hole-only devices thus prepared was then connected to the direct current voltage source DC, so that voltage was applied thereto. Furthermore, by changing the applied voltage, an electric current value per unit surface area (current density) was calculated for different voltages.

FIG. 3 is a device characteristics diagram showing relation curves illustrating relations between applied voltage and current density of the hole-only devices. In FIG. 3, the vertical axis indicates current density (mA/cm$^2$), whereas the horizontal axis indicates applied voltage (V).

Table 2 shows the driving voltage for each sample HOD-A through HOD-E yielded by the corresponding experiment. Note that the expression "driving voltage" in Table 2 is the voltage applied when the current density value is a specific, practical value of 0.3 mA/cm2.

TABLE 2

| Name of Sample | Driving Voltage (V) |
| --- | --- |
| HOD-A | 6.25 |
| HOD-B | 7.50 |
| HOD-C | 8.50 |
| HOD-D | 8.50 |
| HOD-E | 9.49 |

The hole conduction efficiency of the hole injection layer 4 is said to be higher as the driving voltage is smaller, for the following reason. That is, the members composing the hole-only devices 10A, other than the hole injection layer 4, were prepared according to the same manufacturing method. Thus, it could be assumed that the hole injection barrier between two adjacent layers, other than the hole injection layer 4 is uniform in each of the hole-only devices 10A. Furthermore, it was confirmed through another experiment that the ITO layer 3 and the hole injection layer 4 in this experiment are in ohmic contact. Accordingly, the differences in driving voltage depending on the film forming conditions for the hole injection layer 4 can be considered to strongly reflect the hole conduction efficiency from the hole injection layer 4 to the buffer layer 6A.

As illustrated in Table 2 and FIG. 3, it is clear that as compared to HOD-E, which is manufactured under the film forming conditions with a low total pressure and the maximum input power density, HOD-A through HOD-D have superior hole conduction efficiency.

Thus far, tests on the hole conduction efficiency of the hole injection layer 4 in the hole-only devices 1000A have been described. Except for the cathode 8A, the hole-only devices 1000A has the same structure as the organic EL element 1000, which actually operates (FIGS. 1A and 1B). Accordingly, in the organic EL element 1000 as well, the dependence of the hole conduction efficiency from the hole injection layer 4 to the buffer layer 6A on film forming conditions is essentially the same as the hole-only devices 1000A. In order to confirm this point, organic EL elements 1000 were prepared using a hole injection layer 4 formed under film forming conditions A through E. Hereinafter, the organic EL element 1000 formed under film forming conditions A is referred to as BPD-A, the organic EL element 1000 formed under film forming conditions B is referred to as BPD-B, the organic EL element 1000 formed under film forming conditions C is referred to as BPD-C, the organic EL element 1000 formed under film forming conditions D is referred to as BPD-D, and the organic EL element 1000 formed under film forming conditions E is referred to as BPD-E.

Each organic EL element thus formed was manufactured by using the above-described manufacturing method. A hole injection layer 4 composed of tungsten oxide has a thickness of 30 nm, a buffer layer 6A composed of TFB has a thickness of 20 nm; a light-emitting layer 6B composed of F8BT has a thickness of 70 nm, an electron injection layer 7 composed of a barium layer has a thickness of 5 nm, and a cathode 8 composed of aluminum layer has a thickness of 100 nm. Each sample organic EL apparatus 1000 prepared under film forming conditions A through E was connected to the direct current power source DC, so that voltage was applied thereto. Furthermore, by changing the applied voltage, an electric current value per unit surface area (current density) was calculated for different voltages.

Figure 4:
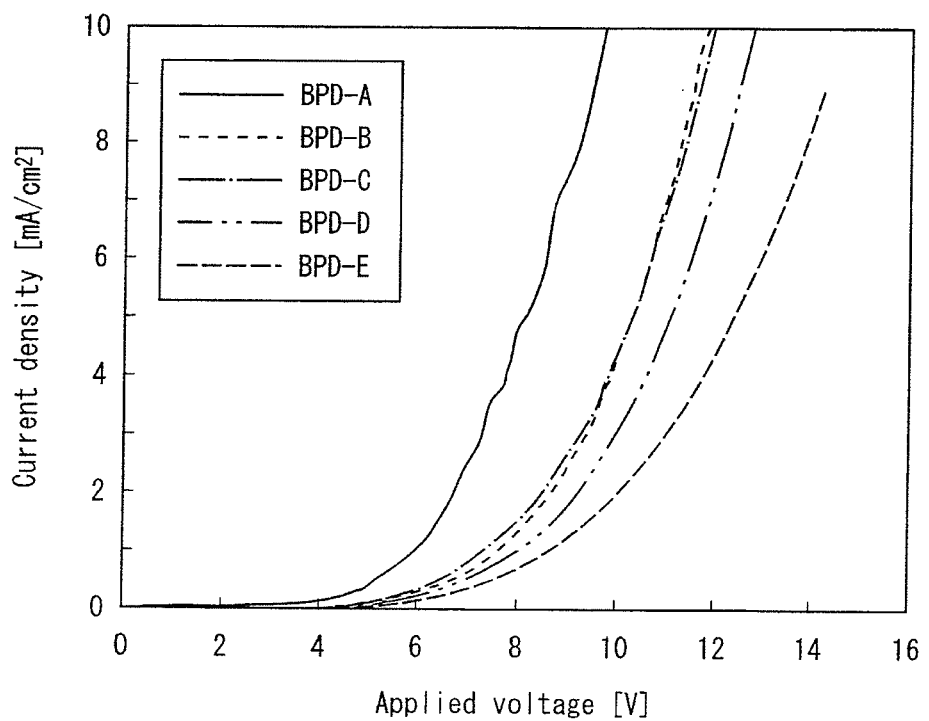
FIG. 4 is a device characteristics diagram showing relation curves illustrating relations between applied voltage and current density of organic EL elements.

FIG. 4 is a device characteristics diagram showing relation curves illustrating relations between applied voltage and current density of organic EL elements. In FIG. 4, the vertical axis indicates current density (mA/cm$^2$), whereas the horizontal axis indicates applied voltage (V). Table 3 shows the driving voltage for each sample BOD-A through BOD-E yielded by the corresponding experiment. Note that the expression "driving voltage" in Table 3 is the voltage applied when the current density value is a specific, practical value of 8 mA/cm$^2$.

TABLE 3

| Name of Sample | Driving Voltage (V) |
| --- | --- |
| BPD-A | 9.25 |
| BPD-B | 11.25 |
| BPD-C | 11.50 |
| BPD-D | 12.25 |
| BPD-E | 14.00 |

As illustrated in Table 3 and FIG. 4, compared to the other organic EL elements, the current density-applied voltage curve rises the slowest for BPD-E, which requires the highest applied voltage in order to achieve a high current density. This trend is similar to the trend observed in the hole-only devices HOD-A through HOD-E, which were prepared under the same respective film forming conditions.

From the above results, it was confirmed that in the organic EL elements 1000 as well, the hole conduction efficiency of the hole injection layer 4 depends on the film forming conditions, similar to the case of the hole-only devices 1000A. Specifically, it was confirmed that forming the film under the conditions provided by the ranges in film forming conditions A, B, C, and D increases the hole conduction efficiency from the hole injection layer 4 to the buffer layer 6A, thereby achieving a low driving voltage.

Note that among the above conditions, the condition concerning input power is represented in terms of input power density, as indicated in Table 1. When using a DC magnetron sputtering device that is different from the DC magnetron sputtering device used in the present experiment, a hole injection layer 4 composed of a tungsten oxide layer with excellent hole conduction efficiency, as in the present experiment, can be yielded by adjusting the input power according to the size of the magnet at the back surface of the sputtering target so that the input power density fulfills the above condition. Conditions on total pressure and oxygen partial pressure, on the other hand, are independent of the device, the size of the target, and the magnet size of the target.

Additionally, as already explained above, no intentional adjustment of the substrate temperature was performed while forming the hole injection layer 4 by applying the reactive sputtering method, and during the experiment, the sputtering device was placed under room temperature. Therefore, the substrate was at room temperature at least before the forming of the hole injection layer 4. However, while the hole injection layer 4 was being formed, there is a possibility that the substrate temperature may have risen by several tens of degrees Celsius.

Note that through a separate experiment, the inventors confirmed that when the oxygen partial pressure is raised too high, the driving voltage conversely ends up rising. Accordingly, it is desirable for the oxygen partial pressure to be between 50% and 70%.

The above experiment results indicate that for a low driving voltage, an organic EL element provided with a hole injection layer manufactured under film forming conditions A, B, C, and D is desirable, and that an organic EL element manufactured under film forming conditions A and B is even more desirable. Hereinafter, an organic EL element provided with a hole injection layer manufactured under film forming conditions A, B, C, or D is the target of the present disclosure.

(Chemical State of Tungsten in the Hole Injection Layer 4)

The above-described nanocrystal structure exists in the tungsten oxide constituting the hole injection layer 4 in the organic EL element 1000 of the present embodiment. This nanocrystal structure is formed by adjusting the film forming conditions described in the experiments above. Details are provided below.

In order to confirm that a nanocrystal structure is found in the tungsten oxide formed under the above film forming conditions A through E, a hard X-ray photoelectron spectroscopy (HAXPES) measurement (hereinafter simply referred to as "XPS measurement") experiment was performed. Typically, the information depth of an optical spectrum yielded by hard X-ray photoelectron spectroscopy (hereinafter simply referred to as "XPS spectrum") reflecting the average valence of the film is determined by the angle between the surface of the target of measurement and the direction in which the photoelectron is detected by the detector that detects photoelectrons. In the present experiment, the angle between the direction in which photoelectrons are detected and the surface of the tungsten oxide layer during the XPS measurement was 40° in order to observe the average valence in the direction of thickness of the tungsten oxide layer.

The conditions under which the XPS measurement was conducted are as follows. Note that no charge-up occurred during measurement.

(XPS Measurement Conditions)
Device used: R-4000 (manufactured by VG-SCIENTA)
Light source: synchrotron radiation (7856 eV)
Bias: None
Electron emission angle: angle of 40° with substrate surface
Interval between measurement points: 0.05 eV Samples for XPS measurement were manufactured under the film forming conditions A through E shown in Table 1. The hole injection layer 4 was formed to a thickness of 30 nm by the above reactive sputtering method on an ITO conductive substrate formed on glass. The result was taken as the sample for XPS measurement. The samples for XPS measurement manufactured under the film forming conditions A, B, C, D, and E are hereinafter respectively referred to as sample A, sample B, sample C, sample D, and sample E. XPS measurement was then performed on the surface of the hole injection layer 4 in each of the samples A through E. FIG. 5 is a diagram illustrating the resulting spectra.

In FIG. 5, the horizontal axis represents binding energy, corresponding to the energy level of the photoelectrons at each energy level with the X-ray as a reference. The left direction with respect to the origin is positive. The vertical axis represents photoelectron intensity and corresponds to individually measured photoelectrons. As illustrated in FIG. 5, three peaks were observed. From the left side of the figure to the right, the peaks belong to the following energy levels of tungsten: $5p_{3/2}$ ($W5p_{3/2}$), $4f_{5/2}$ ($W4f_{5/2}$), and $4f_{7/2}$ ($W4f_{7/2}$).

Next, peak fitting analysis was performed on the peaks belonging to the energy levels $W5p_{3/2}$, $W4f_{5/2}$, and $W4f_{7/2}$ of the spectra for sample A and, as a comparative example, for sample E.

The peak fitting analysis was performed as follows.

The peak fitting analysis was performed using XPSPEAK Version 4.1, which is software for photoelectron spectroscopy analysis. First, based on the photoionization cross-section for the hard X-ray energy of 7940 eV, the peak area intensity ratio for the energy levels $W4f_{7/2}$, $W4f_{5/2}$, and $W5p_{3/2}$ was fixed as follows: $W4f_{7/2}:W4f_{5/2}:W5p_{3/2}=4:3:10.5$. As shown in Table 4, the peak top belonging to a valence of six at the surface discontinuity energy level of $W4f_{7/2}$ ($W^{6+}4f_{7/2}$) was aligned with an energy of 35.7 eV. Next, the peak energy and the peak full width at half maximum for each of the peaks belonging to the surface photoelectron peak ($W^{sur}5p_{3/2}$), a valence of six at the surface discontinuity energy level ($W^{6+}5p_{3/2}$), and a valence of five at the surface discontinuity energy level ($W^{5+}5p_{3/2}$) of $W5p_{3/2}$ were set to the values listed in Table 4. Similarly, for $W4f_{5/2}$ and $W4f_{7/2}$ the peak energy and the peak full width at half maximum for each of the peaks belonging to the surface photoelectron peak ($W^{sur}4f_{5/2}$, $W^{sur}4f_{7/2}$), a valence of six at the surface discontinuity energy level ($W^{6+}4f_{5/2}$), and a valence of five at the surface discontinuity energy level ($W^{5+}4f_{5/2}$, $W^{5+}4f_{7/2}$) were set to the values listed in Table 4. After setting the peak intensities to a desired value, calculations were performed a maximum of 100 times using a Gaussian-Lorentzian mixed function to obtain the final peak fitting analysis results. In the mixed function, the ratio in the Lorentzian function was set as indicated in Table 4.

TABLE 4

| Corresponding peak | W5p$_{3/2}$ | | | W4f$_{5/2}$ | | | W4f$_{7/2}$ | | |
|---|---|---|---|---|---|---|---|---|---|
| | W$^{sur}$5p$_{3/2}$ | W$^{6+}$5p$_{3/2}$ | W$^{5+}$5p$_{3/2}$ | W$^{sur}$4f$_{5/2}$ | W$^{6+}$4f$_{5/2}$ | W$^{5+}$4f$_{5/2}$ | W$^{sur}$4f$_{7/2}$ | W$^{6+}$4f$_{7/2}$ | W$^{5+}$4f$_{7/2}$ |
| Peak Energy (eV) | 42.30 to 43.07 | 41.20 to 41.30 | 39.70 to 38.65 | 38.75 to 39.13 | 37.80 to 37.85 | 36.72 to 36.95 | 36.60 to 36.90 | 35.70 (reference) | 34.60 to 34.80 |
| Value of full width at half maximum (eV) | 1.73 to 2.40 | 1.93 to 2.24 | 1.8 to 2.86 | 1.40 to 1.60 | 0.87 to 0.98 | 0.90 to 1.50 | 1.40 to 1.60 | 0.87 to 0.98 | 0.90 to 1.50 |
| Lorentzian function ratio (%) | 0 | 13 to 40 | 0 to 25 | 0 to 57 | 0 to 6 | 0 to 20 | 0 to 57 | 0 to 6 | 0 to 20 |

Figure 6A:
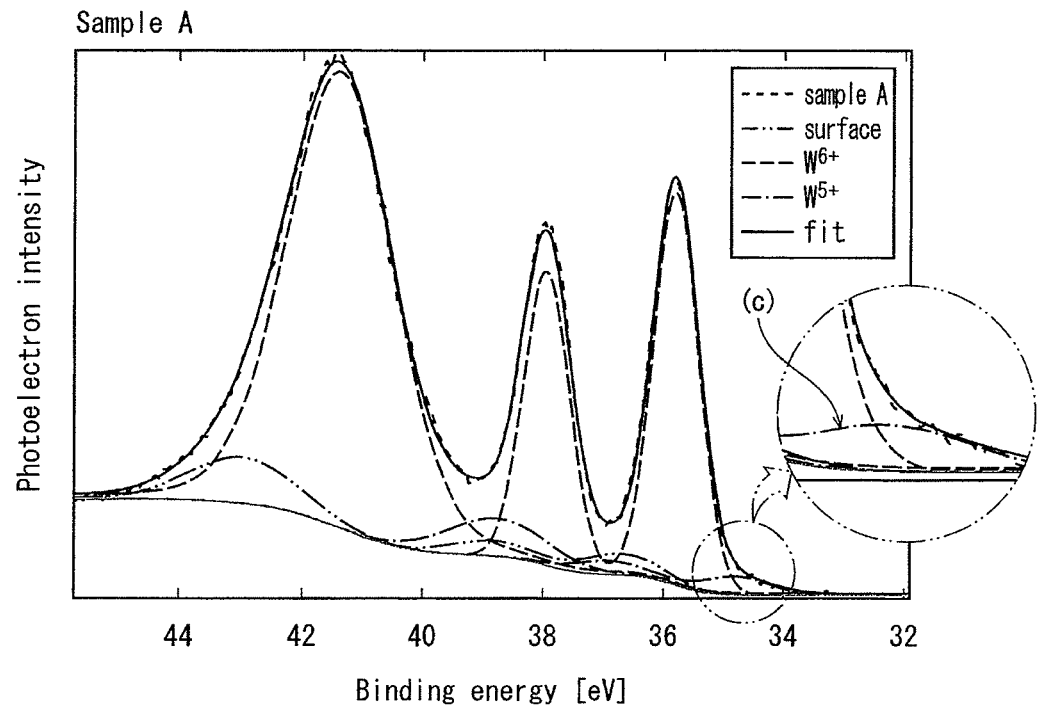
FIG. 6A shows peak fitting analysis results for sample A in FIG. 5.
Figure 6B:
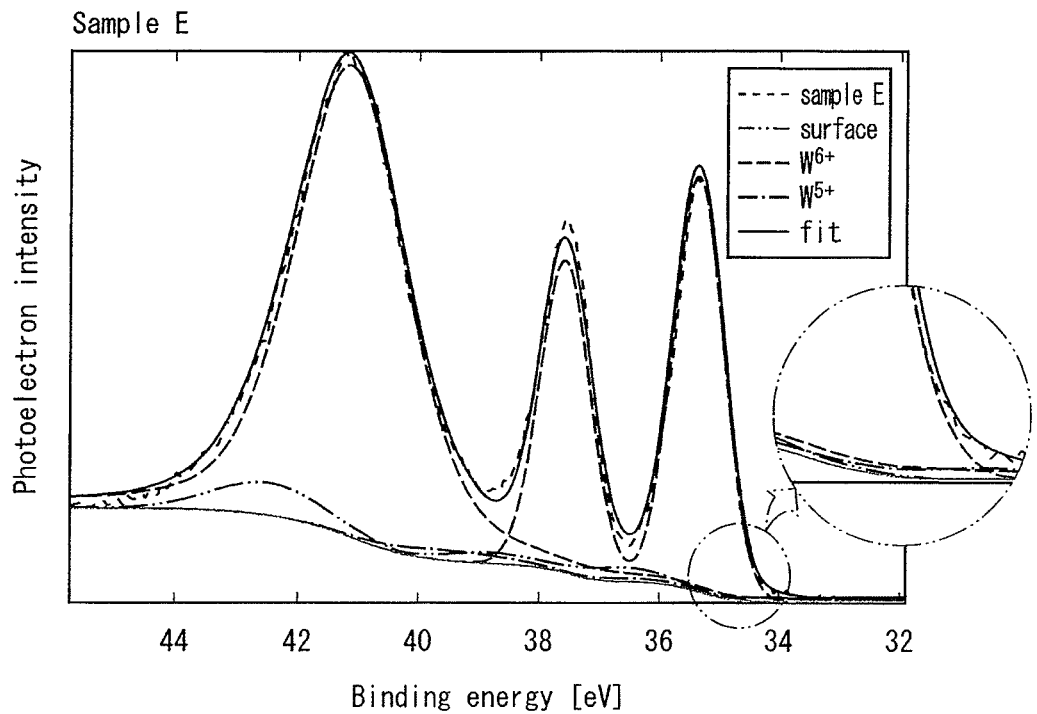
FIG. 6B shows peak fitting analysis results for sample E.

FIGS. 6A and 6B show the final peak fitting analysis results. FIG. 6A shows the analysis results for sample A, and FIG. 6B shows the analysis results for sample E.

In both FIGS. 6A and 6B, the dashed lines (sample A, sample E) are actual measured spectra (corresponding to the spectra in FIG. 5), the lines with alternate long and two short dashes (surface) are the spectra belonging to the surface photoelectron peaks of W$^{sur}$5p$_{3/2}$, W$^{sur}$4f$_{5/2}$, and W$^{sur}$4f$_{7/2}$, the dotted lines (W$^{6+}$) are the spectra belonging to a valence of six at the surface discontinuity energy level of W$^{6+}$5p$_{3/2}$, W$^{6+}$4f$_{7/2}$, and W$^{6+}$4f$_{5/2}$, and the alternating long and short dashed lines (W$^{5+}$) are the spectra belonging to a valence of five at the surface discontinuity energy level of W$^{5+}$5$_{3/2}$, W$^{5+}$4f$_{5/2}$, and W$^{5+}$4f$_{7/2}$. The solid lines (fit) are the spectra yielded by summing the spectra indicated by the lines with alternate long and two short dashes and the alternating long and short dashed lines. Note that in FIGS. 6A and 6B, the peak belonging to the tungsten with a valence of five indicated by the alternating long and short dashed line is considered to derive only from tungsten with a valence of five.

As illustrated in FIGS. 6A and 6B, the spectra belonging to the energy levels 5p$_{3/2}$, 4f$_{5/2}$, and 4f$_{7/2}$ are constituted by a sum of the peak due to photoelectrons from the surface of the hole injection layer 4 (surface), the peak of tungsten atoms with a valence of six included at the depth at which photoelectrons are detected within the hole injection layer 4 (W$^{6+}$), and the peak of tungsten atoms with a valence of five included at the same depth (W$^{5+}$).

Furthermore, FIG. 6A shows that for sample A, a peak for W$^{5+}$ corresponding to each energy level occurs in a binding energy region that is 0.3 eV to 1.8 eV lower than each of the peaks belonging to the energy levels 5p$_{3/2}$, 4f$_{5/2}$, and 4f$_{7/2}$ in the W$^{6+}$ spectra. On the other hand, in FIG. 6B, no such peak for W$^{5+}$ is evident for sample E. For the purposes of illustration, the peak belonging to 4f$_{7/2}$ in the W$^{5+}$ spectrum for sample A and for sample E is shown enlarged to the right of FIGS. 6A and 6B. As shown in (c) of FIG. 6A, the peak for W$^{5+}$ is clearly observable for sample A, whereas no such peak for W$^{5+}$ is observable for sample E.

Furthermore, looking more closely at the enlarged diagrams in FIGS. 6A and 6B, the solid line (fit), which is the summed spectrum resulting from peak fitting, exhibits a large "shift" in sample A with respect to the spectrum for W$^{6+}$ indicated by the dotted line (W$^{6+}$). In sample E, however, the "shift" is not as large as in sample A. In other words, the "shift" in sample A can be inferred as suggestive of the existence of tungsten atoms with a valence of five.

Next, for samples A through E, the abundance ratio W$^{5+}$/W$^{6+}$ of the number of tungsten atoms with a valence of five versus the number of tungsten atoms with a valence of six was calculated. The abundance ratio was calculated, in the spectrum obtained through peak fitting analysis on each sample, by dividing the area intensity of the peak for W$^{5+}$ (alternating long and short dashed line) by the area intensity of the peak for W$^{6+}$ (dotted line).

Note that in principle, representing the abundance ratio of the number of tungsten atoms with a valence of six to the number of tungsten atoms with a valence of five as the ratio of the area intensity of the peak for W$^{6+}$ to the area intensity of the peak for W$^{5+}$ in W4f$_{7/2}$ is equivalent to representing the abundance ratio based on the peaks belonging to W5p$_{3/2}$ and W4f$_{5/2}$. In the present experiment, it was confirmed that the ratio of the area intensity of W$^{5+}$4f$_{7/2}$ to the area intensity of W$^{6+}$4f$_{7/2}$ in W4f$_{7/2}$ was indeed the same value for W5p and for W4f$_{5/2}$ as well. Accordingly, in the following analysis, only the peak belonging to W4f$_{7/2}$ is considered.

Table 5 shows the ratio W$^{5+}$/W$^{6+}$ for samples A through E.

TABLE 5

| Name of Sample | W$^{5+}$/W$^{6+}$ |
|---|---|
| Sample A | 7.4% |
| Sample B | 6.1% |
| Sample C | 3.2% |
| Sample D | 3.2% |
| Sample E | 1.8% |

Based on the values of W$^{5+}$/W$^{6+}$ in Table 5, it was confirmed that the sample including the most tungsten atoms with a valence of five was sample A, followed by samples B, C, and D in decreasing order. Furthermore, based on the results in Table 3 and Table 5, it became clear that as the value of W$^{5+}$/W$^{6+}$ increases, the driving voltage of the organic EL element decreases.

(Electronic State of Tungsten in the Hole Injection Layer 4)

The tungsten oxide film formed under the above film forming conditions A through D has, in an electronic state thereof, an occupied energy level in a binding energy region that is between 1.8 eV and 3.6 eV lower than the upper end of the valence band, i.e. the lowest binding energy of the valence band. This occupied energy level corresponds to the highest occupied energy level of the hole injection layer 4, and the binding energy range thereof is closest to the Fermi surface of the hole injection layer 4. The occupied energy level is hereinafter referred to as "the occupied energy level near the Fermi surface".

Due to the existence of this occupied energy level near the Fermi surface, a so-called interface energy level alignment is formed at the layer interface between the hole injection layer 4 and the buffer layer 6A, so that the binding energy of the highest occupied molecular orbital of the buffer layer 6A and the binding energy of the occupied energy level near the Fermi surface of the hole injection layer 4 become approximately equal. In other words, due to the existence of the occupied energy level, the hole injection barrier between the hole injection layer 4 and the buffer layer 6A is reduced. This allows for even better hole conduction efficiency as well as driving at a lower voltage.

Note that the expressions "approximately equal to" and "interface energy level alignment is formed" as referred to herein indicate that at the interface between the hole injection layer 4 and the buffer layer 6A, the difference between the lowest binding energy at the occupied energy level near the Fermi surface and the lowest binding energy at the highest occupied molecular orbital is ±0.3 eV.

Furthermore, the expression "interface" as referred to here denotes an area that includes a surface of the hole injection layer 4 and a portion of the buffer layer 6A within a distance of 0.3 nm from the surface of the hole injection layer 4.

While it is desirable that the occupied energy level near the Fermi surface exist throughout the hole injection layer 4, it suffices for this occupied energy level to exist at the interface with the buffer layer 6A.

Next, experiments to confirm the existence of the occupied energy level near the Fermi surface in the hole injection layer 4 of sample A and sample E were performed using ultraviolet photoelectron spectroscopy (UPS) measurement.

The forming of the hole injection layer 4 in sample A and sample E was performed inside a sputtering device. Then, to prevent atmospheric exposure, samples A and E were transported to a glovebox which was connected to the sputtering device and which was filled with nitrogen gas. Subsequently, the samples were sealed inside transfer vessels in the glovebox, and were mounted on a photoelectron spectroscopy device. After formation, the hole injection layer 4 was therefore not exposed to the atmosphere before UPS measurement was performed.

In general, a UPS spectrum obtained as a result of the UPS measurement reflects a state of occupied energy levels, such as a valence band and the like, within several nanometers in distance from the surface of the target of measurement. As such, the present experiment was conducted in order to observe the state of occupied energy levels at a surface portion of the hole injection layer 4 by utilizing UPS measurement.

The conditions under which the UPS measurement was conducted are as follows. Note that charge-up did not occur during measurement.

(UPS Measurement Conditions)

Device used: PHI 5000 VersaProbe Scanning X-ray Photoelectron Spectroscopy Device (manufactured by ULVAC-PHI, Inc.)

Light source: He I line

Bias: None

Electron emission angle: Direction of normal line to the substrate

Interval between measurement points: 0.05 eV

FIG. 7 is a diagram illustrating a UPS spectrum of the hole injection layer 4 of sample A. The origin of the horizontal axis, which represents binding energy, corresponds to the Fermi surface of the substrate 7, and the left direction with respect to the origin is positive. Each of the occupied energy levels of the hole injection layer 4 is now described with reference to FIG. 7.

Commonly, a UPS spectrum of tungsten oxide indicates a distinct, rapid rise which can be uniquely distinguished from other areas thereof. Here, a tangential line passing through an inflection point of the above rise is referred to as line (i), and the point at which line (i) intersects the horizontal axis is referred to as point (iii). The UPS spectrum of tungsten oxide can be divided into two areas: area x that extends in the high binding energy direction from point (iii), and area y that extends in the low binding energy direction (i.e. towards the Fermi surface) from point (iii).

Using the same XPS measurement as described above, it was confirmed that the ratio of the number of tungsten atoms to the number of oxygen atoms was nearly 1:3 in both of the samples A and E. Specifically, the composition ratio of tungsten to oxygen within several nanometers in distance from the surface of the hole injection layer 4 was estimated.

Based on this ratio, it can be concluded that in both samples A and E, the hole injection layer 4 has a basic structure with atomic coordinates based on tungsten trioxide (details are provided in the following section), at least to a depth of several nanometers from the surface. Accordingly, region x in FIG. 7 corresponds to an occupied energy level deriving from the above basic structure, i.e. a region corresponding to a so-called valence band. Note that the inventors performed X-ray absorption fine structure (XAFS) measurement with respect to the hole injection layer 4 of both samples A and E and confirmed that the above basic structure is formed therein.

Accordingly, the area y illustrated in FIG. 7 corresponds to a band gap between the valence band and the conduction band. It is commonly known, however, that an occupied energy level that differs from the occupied energy level of the valence band may exist in this area of the tungsten oxide, as is suggested by the UPS spectrum in FIG. 7. This occupied energy level in area y derives from another structure that is different from the above-mentioned basic structure, and is referred to as a band gap energy level (in-gap state or gap state).

Figure 8:
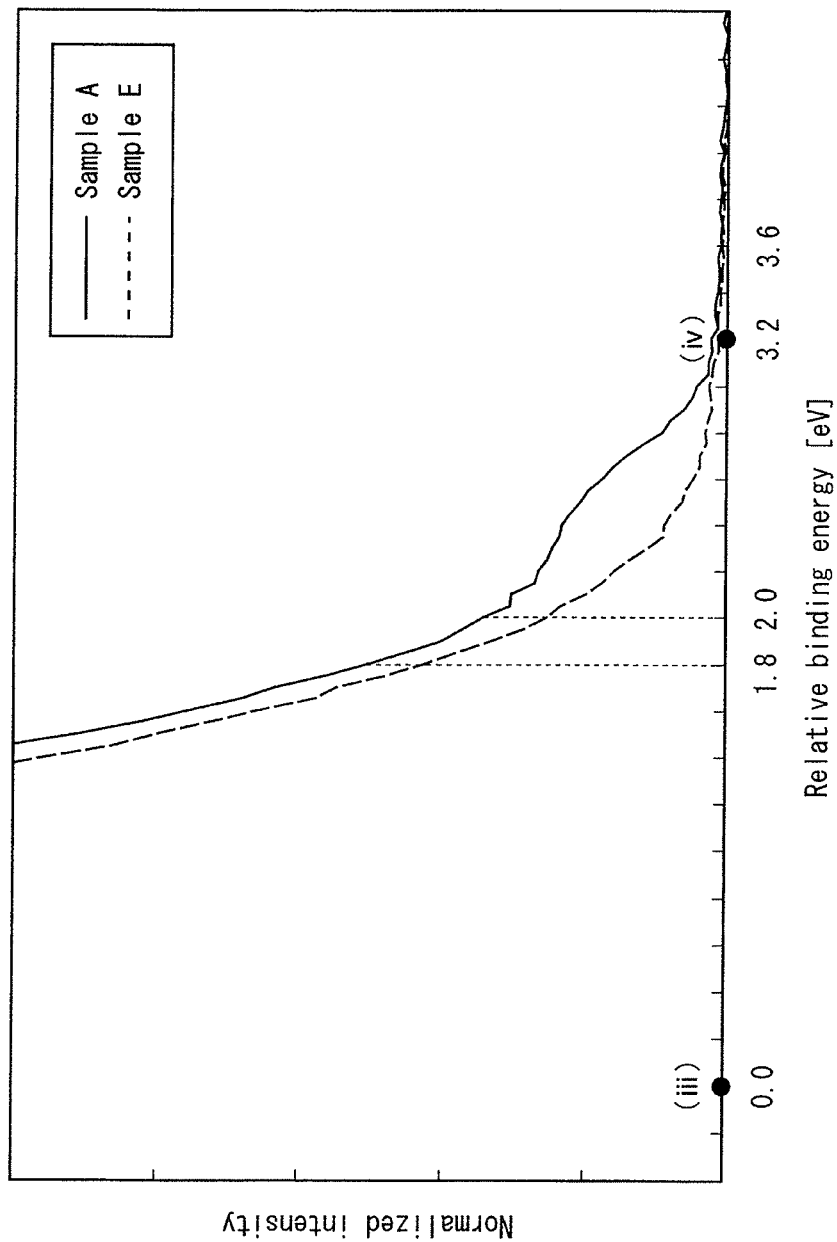
FIG. 8 is a diagram illustrating UPS spectra of the surface of a tungsten oxide layer.

Next, FIG. 8 is a diagram illustrating a UPS spectrum of the hole injection layer 4 in samples A and E within area y. The spectrum intensity indicated by the vertical axis in FIG. 8 has been normalized using the peak-top intensity value of a peak (ii) in FIG. 7, which is located approximately between 3 eV and 4 eV in the high binding energy direction from point (iii). In addition, note that point (iii) in FIG. 8 is illustrated at the same point on the horizontal axis as in FIG. 7. In FIG. 8, the horizontal axis indicates a relative value (relative binding energy) with respect to point (iii), and the binding energy decreases from left to right (towards the Fermi surface).

As illustrated in FIG. 8, the spectrum indicating the hole injection layer 4 of sample A exhibits a peak in an area between a point which is 3.6 eV lower in terms of binding energy than point (iii) and a point which is 1.8 eV lower in terms of binding energy than point (iii). The point at which this peak clearly begins is labeled as point (iv) in FIG. 8. The existence of such a peak is not observed in the spectrum for sample E.

Forming the hole injection layer from tungsten oxide having a structure such that the UPS spectrum thereof indicates an upward protrusion (not necessarily in the form of a peak) in an area which is between 1.8 eV and 3.6 eV lower in terms of binding energy than point (iii) provides the organic EL element with excellent hole conduction efficiency.

Furthermore, it has been found that hole injection efficiency increases when this upward protrusion has a higher degree of sharpness. Therefore, as illustrated in FIG. 8, it can be said that the area that is between 2.0 eV and 3.2 eV lower than point (iii) in terms of binding energy is particularly important, since the upward protrusion is relatively easier to confirm in this area and has a relatively sharper inclination.

(Relationship Between Value of $W^{5+}/W^{6+}$ and Driving Voltage)

Figure 9:
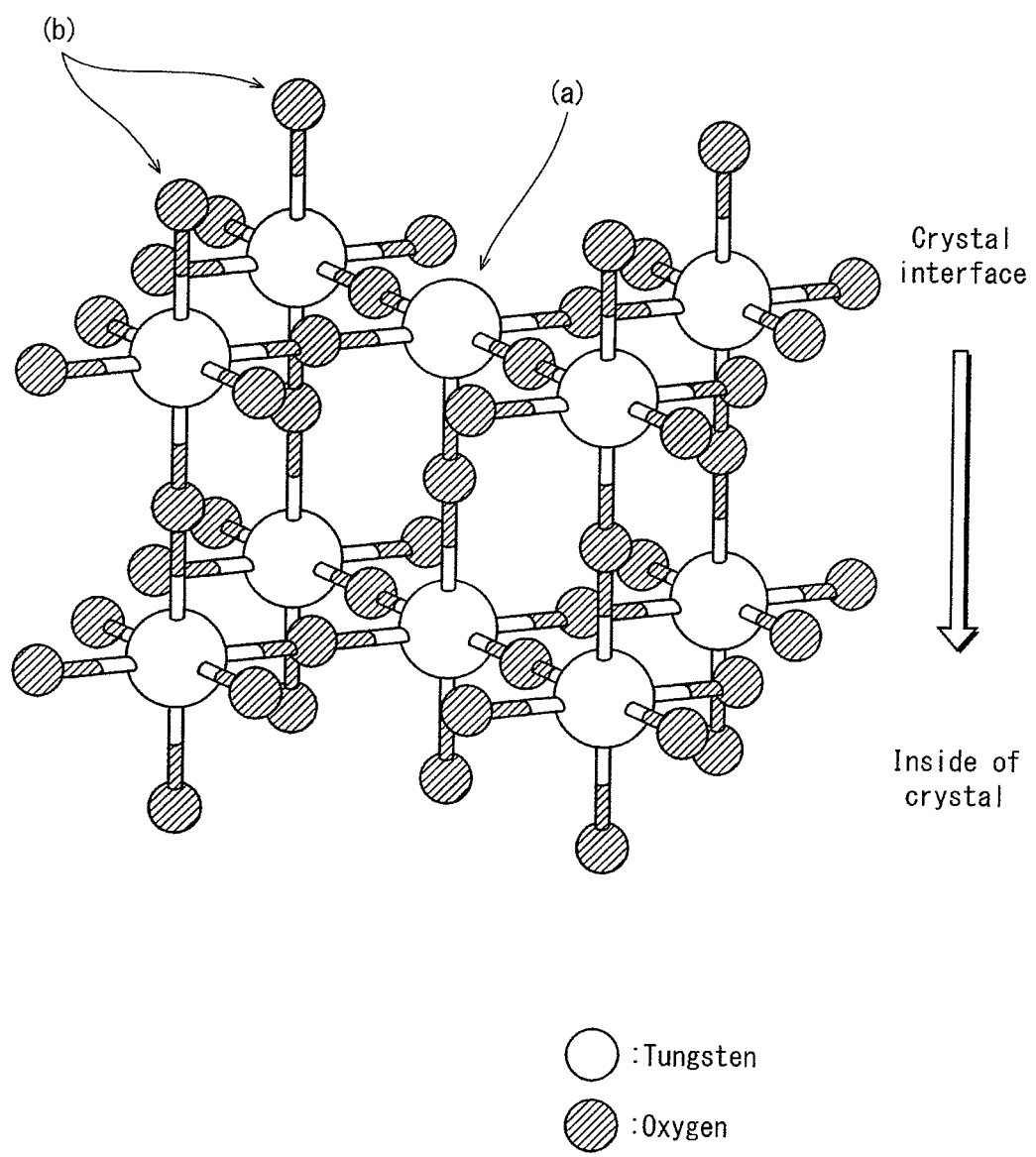
FIG. 9 is a diagram illustrating the structure along the surface of the tungsten oxide layer.

FIG. 9 is a diagram illustrating the structure along the surface of the tungsten oxide layer. In this figure, tungsten trioxide ($WO_3$) is used as an example of tungsten oxide. As illustrated in FIG. 9, tungsten atoms are surrounded by six oxygen atoms to form an octahedron with the six oxygen atoms at the vertices. The octahedrons share the vertices and connect to each other. For the sake of simplicity, in this figure the octahedrons are drawn as regular octahedrons, such as the rhenium oxide structure. In practice, the octahedrons themselves are somewhat distorted but they order periodically.

As illustrated in FIG. 9, tungsten atoms are terminated by oxygen atoms within the crystal, whereas at the crystal interface, two types of tungsten atoms are thought to exist: tungsten atoms (b) surrounded by terminal oxygen atoms, and tungsten atoms (a) not terminated in this way. Non-Patent Literature 4 reports how first principles calculation reveals that a structure where a part of the tungsten atoms at the crystal interface remain not terminated (corresponding to the non-terminated tungsten atoms (a)), as in FIG. 9, is more stable in terms of energy than a structure where all of the tungsten atoms at the crystal interface are terminated in oxygen atoms. The reason for this is that when all of the tungsten atoms at the crystal interface are terminated in oxygen atoms, the electric repulsive force between terminal oxygen atoms increases, which results in a loss of stability. In other words, at the crystal interface, the presence of an oxygen vacancy or a similar structure (a) along the surface results in higher stability.

Tungsten atoms terminated in oxygen atoms, i.e. tungsten atoms not having oxygen vacancies or similar structures (a), correspond to tungsten atoms with a valence of six. On the other hand, tungsten atoms not terminated in oxygen atoms, i.e. tungsten atoms having the structure (a) similar to an oxygen vacancy, correspond to tungsten atoms with a valence of five (including a valence of at least five and less than six).

Tungsten atoms with a valence of five are considered to have a structure with a lone pair of electrons due to the loss of one oxygen atom in octahedral coordination. In other words, it is thought that a tungsten atom with a valence of five supplies a hole with its own lone pair of electrons, so that the tungsten atom with a valence of five that supplied the electrons has a hole. Due to the bias voltage applied to the hole injection layer, this provision of an electron from a lone pair of electrons existing in a tungsten atom with a valence of five is thought to occur continuously, leading to hole conduction in which holes move in the direction of lower electric potential and electrons move in the direction of higher electric potential. The hole injection layer 4 having a high value for $W^{5+}/W^{6+}$ in sample A, i.e. a high ratio of tungsten atoms with the valence of five, thus has abundant hole conduction paths, allowing for driving at a low voltage due to hole conduction at a low voltage. As a result, the organic EL element has excellent hole conduction efficiency.

Furthermore, in samples C and D, while the value of $W^{5+}/W^{6+}$ was not as high as sample A, good hole conduction was confirmed even at a value of approximately 3.2%.

(Microstructure of Tungsten in the Hole Injection Layer 4)

The tungsten oxide film constituting the hole injection layer 4 has a nanocrystal structure. This nanocrystal structure is formed by adjusting the film forming conditions. Details are provided below.

In order to confirm the existence of the nanocrystal structure in the tungsten oxide layer formed under film forming conditions A, B, C, D, and E listed in Table 1, a transmission electron microscope (TEM) measurement experiment was performed.

The tungsten oxide layer in the sample for TEM measurement was formed by the reactive sputtering method using a DC magnetron sputtering device under each set of conditions listed in Table 1. To form each sample, the hole injection layer 4 was formed to a thickness of 30 nm by the above reactive sputtering method on an ITO conductive substrate formed on glass. The samples for TEM measurement manufactured under the film forming conditions A, B, C, D, and E are hereinafter respectively referred to as sample A, sample B, sample C, sample D, and sample E. Note that TEM measurement was performed after confirming, by the above XPS measurement, that tungsten atoms with a valence of five were included in each of the samples A, B, C, and D.

Typically, TEM measurement is performed on a surface by forming a thin sample. A sample according to the present embodiment was manufactured as a cross-section of the tungsten oxide layer by using a focused ion beam (FIB) device to process sample and adjust the thickness of to approximately 100 nm. The conditions for FIB processing and TEM measurement are as follows.

Figure 10:
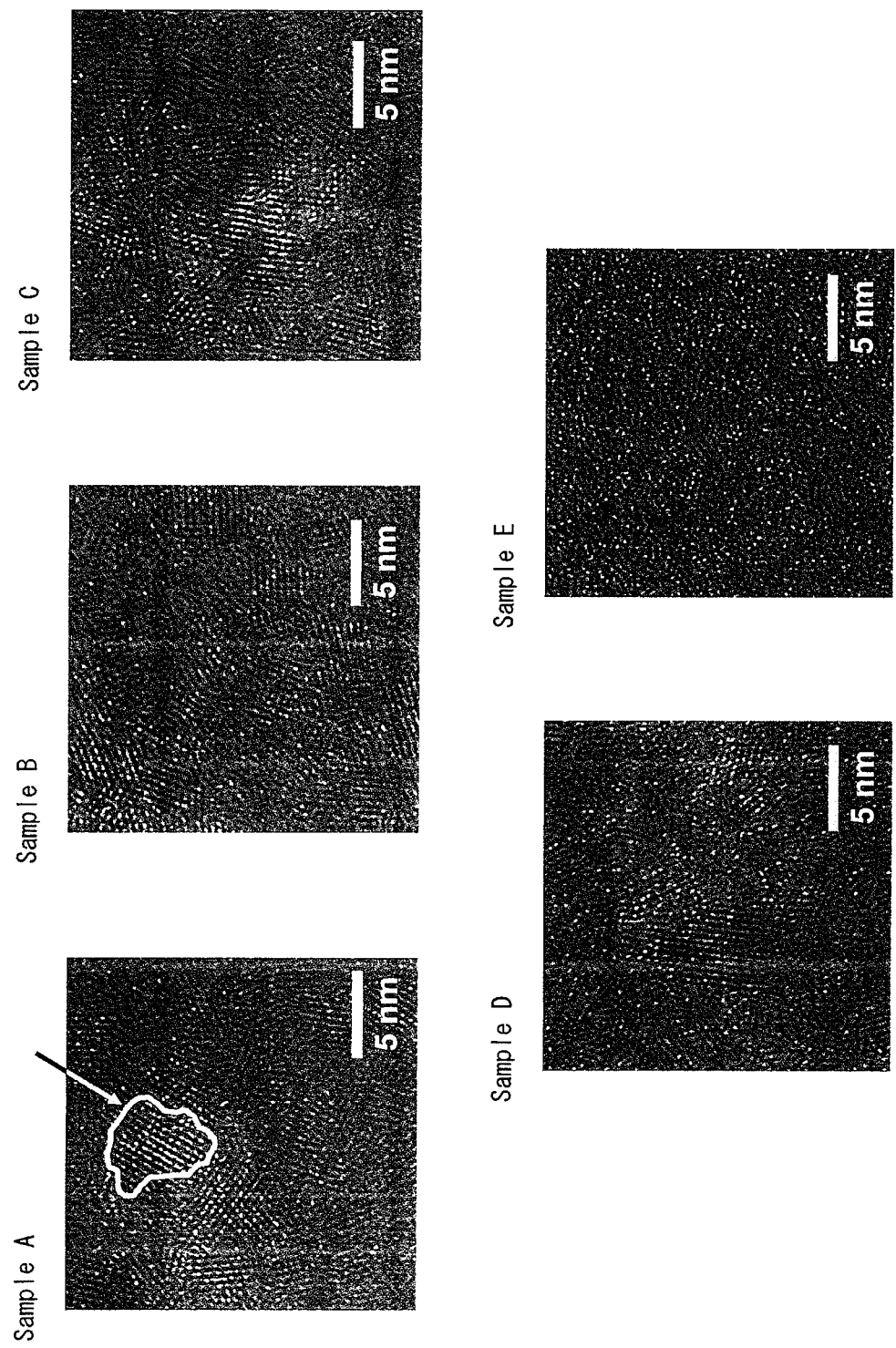
FIG. 10 shows cross-sectional TEM photographs of a tungsten oxide layer.

(Conditions for FIB Processing)
Device used: Quanta 200 (manufactured by FEI Company)
Accelerating voltage: 30 kV (final voltage: 5 kV)
Thickness of sample: 50 nm or less
(Conditions for TEM Measurement)
Device used: Topcon EM-002B (manufactured by Topcon Technohouse Corporation)
Measurement method: high-resolution electron microscopy
Accelerating voltage: 200 kV FIG. 10 is a diagram illustrating a TEM measurement photograph of a cross-section of the hole injection layer 4 in samples A, B, C, D, and E. The scale is indicated by the scale bar in each TEM photograph, and the display size of each TEM photograph is 560×506 pixels. The TEM photographs in FIG. 10 are shown with 256 gradations from the darkest to the brightest region.

In the TEM photographs in FIG. 10, regular linear structures can be observed in samples A, B, C, and D as bright regions aligned in the same direction in portions of samples A, B, C, and D. As is clear from the scale of the TEM photographs, these linear structures are provided at intervals of approximately 1.85 angstroms to 5.55 angstroms.

On the other hand, the bright regions are scattered irregularly in sample E, with no regular linear structures being observable. In the TEM photographs, regions with the above linear structures represent one nanocrystal of tungsten oxide. The TEM photographs thus confirm the presence of the nanocrystal structure of tungsten oxide in samples A, B, C, and D. On the other hand, no nanocrystal structure could be confirmed in sample E.

In the TEM photograph of sample A in FIG. 10, one of the nanocrystals, chosen arbitrarily, is outlined with a white line. Note that this outline is not precise, but rather is meant to be an example. This is because the TEM photograph shows not only the uppermost surface in the cross-section, but also the conditions lower in the layer, thus making it difficult to precisely identify the outline. The size of the nanocrystal outlined with a white line in sample A is approximately between 3 nm and 10 nm.

FIG. 11 shows 2D Fourier transform images indicating the results of a 2D Fourier transform on the TEM measurement photographs in FIG. 10. The 2D Fourier transform images shown in FIG. 11 have a distribution indicating a reciprocal lattice space of the TEM measurement photographs in FIG. 10. The 2D Fourier transform images in FIG. 11 were created by performing a Fourier transform on the TEM photographs of FIG. 10 using LAview Version #1.77, which is image processing software. In the Fourier transform images in FIG. 11, a bright region formed by two or three concentric circles centering on a center point of the Fourier transform images appears for samples A, B, C, and D. While a bright region formed by concentric circles in the Fourier transform image can be confirmed for samples A, B, C, and D, an unclear circle appears in sample E. The lack of clarity of the bright region formed by concentric circles indicates a qualitative loss of order in the structure of the hole injection layer 4 in FIG. 10. In other words, samples A, B, C, and D, for which a bright region formed by concentric circles can be confirmed, are highly ordered, whereas sample E exhibits a loss of order.

Figure 12B:
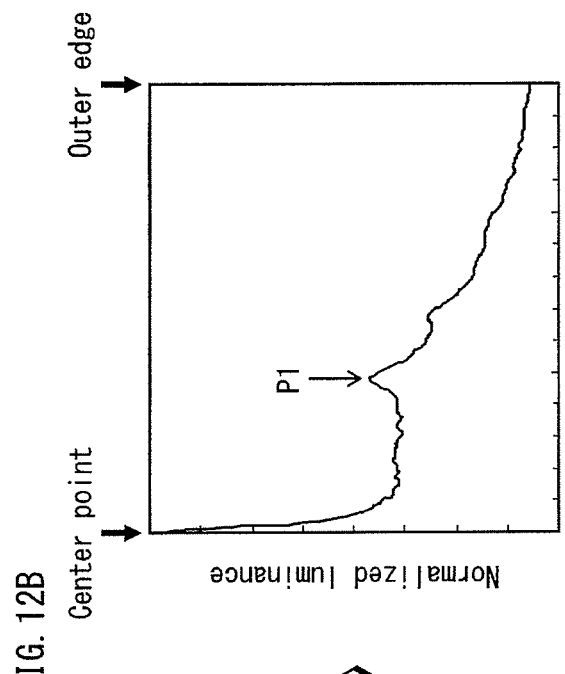
FIGS. 12A and 12B are diagrams illustrating the creation of a plot of change in luminance from the 2D Fourier transform image shown in FIG. 11.
Figure 12A:
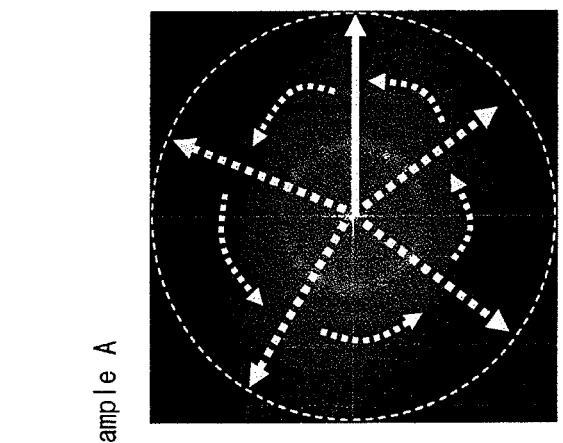

Next, graphs showing the change in luminance vs. the distance from the center point of the image to the outer edge were created from the 2D Fourier transform images in FIG. 11. FIGS. 12A and 12B show an outline of the method of creating the graphs, using sample A as an example.

As illustrated in FIG. 12A, the Fourier transform image was rotated 1° at a time around the center point, and the luminance versus the distance from the center point of the Fourier transform image to the outer edge of the photograph along the X-axis was measured. The Fourier transform image was rotated from 0° to 359°, and the distance from the center point of the Fourier transform image (horizontal axis) and the normalized luminance of the Fourier transform image (vertical axis) were integrated over each 1° rotation of the Fourier transform image and divided by 260 to yield the graph shown in FIG. 12B. Microsoft Office Picture Manager was used to rotate the images, and the image processing software ImageNos was used to measure the distance from the center point and the luminance of the Fourier transform image. Hereinafter, the plot created using the method described with reference to FIGS. 12A and 12B is referred to as a "plot of change in luminance".

FIGS. 13 and 14 illustrate the plots of change in luminance for samples A, B, C, D, and E. The plots of changes in luminance for samples A, B, C, D, and E clearly evidence a peak, labeled P1, other than a high luminance region at the center point of each sample. Hereinafter, the peak of the normalized luminance appearing nearest the center point in the plot of change in luminance is referred to as a "peak P1". Furthermore, as compared to the peak P1 in sample E, the peak P1 in samples A, B, C, and D has a sharply convex structure.

Figure 15A:
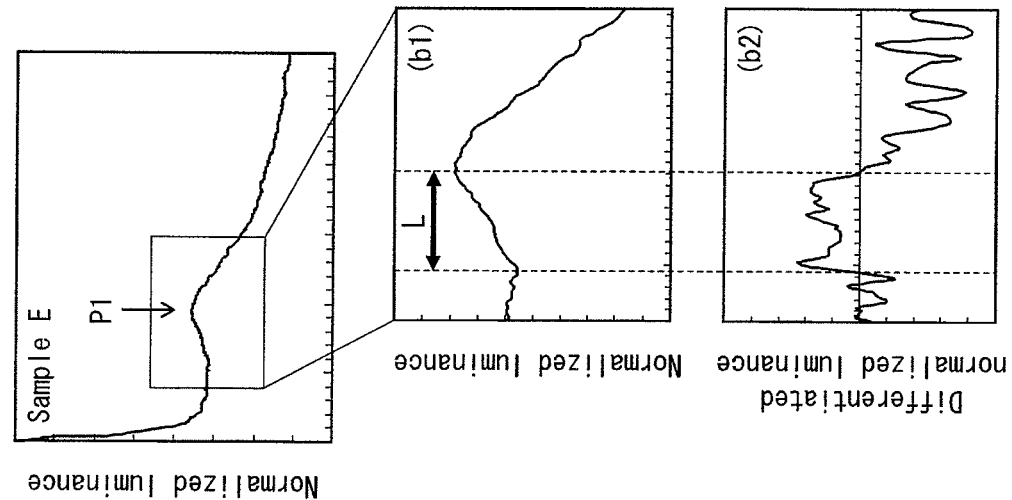
FIGS. 15A and 15B are plots of change in luminance for samples A and E, with (a1) and (b1) being enlarged diagrams of each peak in normalized luminance closest to the center point in the plots of change in luminance, and (a2) and (b2) being the first derivative of the plots in (a1) and (b1).
Figure 15B:
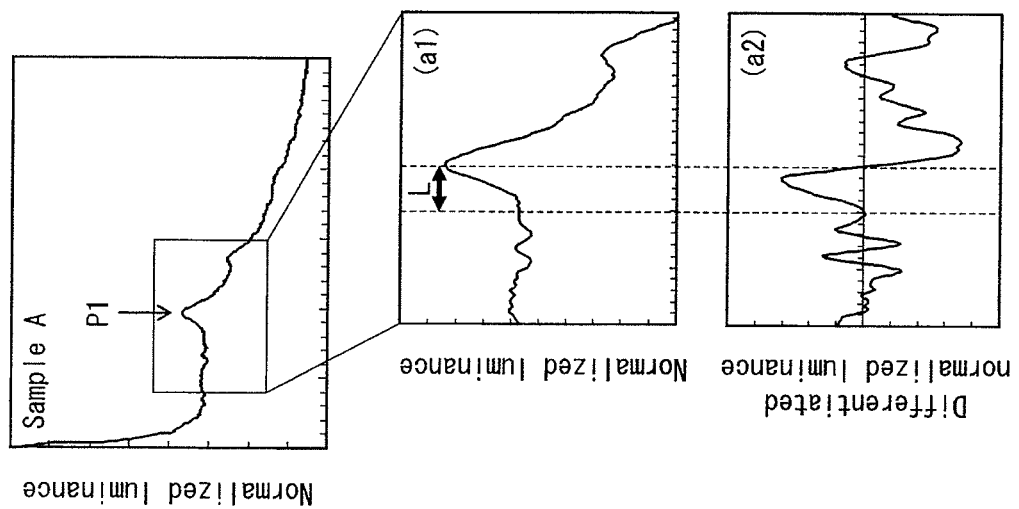

Next, the sharpness of the peak P1 in samples A, B, C, D, and E was assessed. FIGS. 15A and 15B show an outline of the method of assessment, using samples A and E as examples.

FIGS. 15A and 15B are plots of change in luminance for samples A and E respectively. In FIGS. 15A and 15B, (a1) and (b1) are enlarged diagrams of the peak P1 and the surrounding region in each sample. The "peak width L of the peak P1", indicated by "L" in (a1) and (b1) of FIGS. 15A and 15B, is used as an index of how "pointed" the peak P1 is.

In order to more accurately determine this "peak width L of the peak P1", the first derivative of the plot in (a1) and (b1) in FIGS. 15A and 15B is shown in (a2) and (b2) in FIGS. 15A and 15B. In (a2) and (b2) in FIGS. 15A and 15B, the peak width L is the difference between the value along the horizontal axis corresponding to the peak top of the peak P1 and the value along the horizontal axis, in the direction of the center point from the peak, corresponding to the position at which the derivative first becomes zero. Table 6 shows the values of the peak width L in samples A, B, C, D, and E, with the distance along the horizontal axis between the center point in the Fourier transform image and the peak top of the peak P1 normalized as 100.

TABLE 6

| Name of Sample | Peak Width L |
|---|---|
| Sample A | 16.7 |
| Sample B | 18.1 |
| Sample C | 21.3 |
| Sample D | 21.9 |
| Sample E | 37.6 |

As illustrated in Table 6, the peak width L is the smallest in sample A and increases in order in samples B, C, and D, reaching its maximum value in sample E. Furthermore, in samples C and D, while the value of the peak width L was not as high as sample A, good hole conduction was confirmed even at a value of approximately 21.9.

The values of the peak width L listed in Table 6 indicate the clarity of the bright region formed by the concentric circle closest to the center point in the Fourier transform images of FIG. 11. As the value of the peak width L decreases, the extent of the bright region formed by concentric circles is smaller, indicating a greater level of regularity in the TEM photograph of the hole injection layer 4 in FIG. 10. Conversely, as the value of the peak width L is larger, the extent of the bright region formed by the concentric circle closest to the center point in the Fourier transform images of FIG. 11 is larger, indicating a loss of regularity in the microstructure in the TEM photograph of the hole injection layer 4 in FIG. 10.

As described with reference to FIG. 9, the basic structure of a single crystal tungsten oxide consists of periodically ordered connections of octahedrons. A nanocrystal structure is formed by a number of such single crystals, i.e. nanocrystals. Because the inside of these nanocrystals has a high level of regularity, it can be concluded that tungsten atoms with a valence of five are found not within nanocrystals, but rather along the surface of nanocrystals.

Based on the results of Tables 5 and 6, as the level of regularity in the film structure of the tungsten oxide layer decreases, the ratio of tungsten atoms with a valence of five clearly decreases. The reasons for this relationship are considered to be as follows.

In the tungsten oxide film manufactured under film forming conditions E, the above-described nanocrystals may exist, but most of the film is considered to be an amorphous structure. In the amorphous structure, most octahedrons are connected to each other throughout the film, though nonperiodically and disorderly. Only a few discontinuities exist along the sequence of octahedron connections, so there are few grain boundaries which can contain oxygen vacancies, resulting in a low ratio of tungsten atoms with a valence of five. Consequently, the film lacks locations that become hole conduction paths, making driving at a low voltage difficult. On the other hand, in the tungsten oxide film manufactured under film forming conditions A through D, the nanocrystals lie next to each other throughout the entire film, constituting the sequence of nanocrystal surfaces/interfaces. Because the periodically ordered octahedron connections in the nanocrystals end at their surfaces/interfaces, there exist tungsten atoms with a valence of five on the surfaces/interfaces, and they act as hole conduction paths, allowing for driving at low voltage.

(Analysis of Hole Conduction of Injected Holes)

As described above, the basic structure of a single crystal tungsten oxide consists of periodically ordered connections of octahedrons. When the film is formed from octahedron connections without order and periodicity, an amorphous structure results, whereas forming the film from octahedron connections with order and periodicity results in a nanocrystal structure.

When tungsten atoms with a valence of five are present in the tungsten oxide layer, the tungsten atoms are considered to form a structure with a lone pair of electrons when one of the oxygen atoms in octahedral coordination with a tungsten atom is lost. In other words, it is thought that a tungsten atom with a valence of five supplies a hole with its own lone pair of electrons, so that the tungsten atom with a valence of five that supplied the lone pair of electrons has a hole. Due to the bias voltage applied to the hole injection layer, this provision of an electron from a lone pair of electrons existing in a tungsten atom with a valence of five is thought to occur continuously, leading to hole conduction in which holes move in the direction of lower electric potential and electrons move in the direction of higher electric potential. Accordingly, as more tungsten atoms with a valence of five are included, more tungsten atoms contribute to hole conduction, thus increasing the hole conduction efficiency. The inclusion of numerous tungsten atoms with a valence of five, however, is not a sufficient condition for improving hole conduction properties. The reasons for this are described with reference to FIGS. 16A and 16B.

Figure 16A:
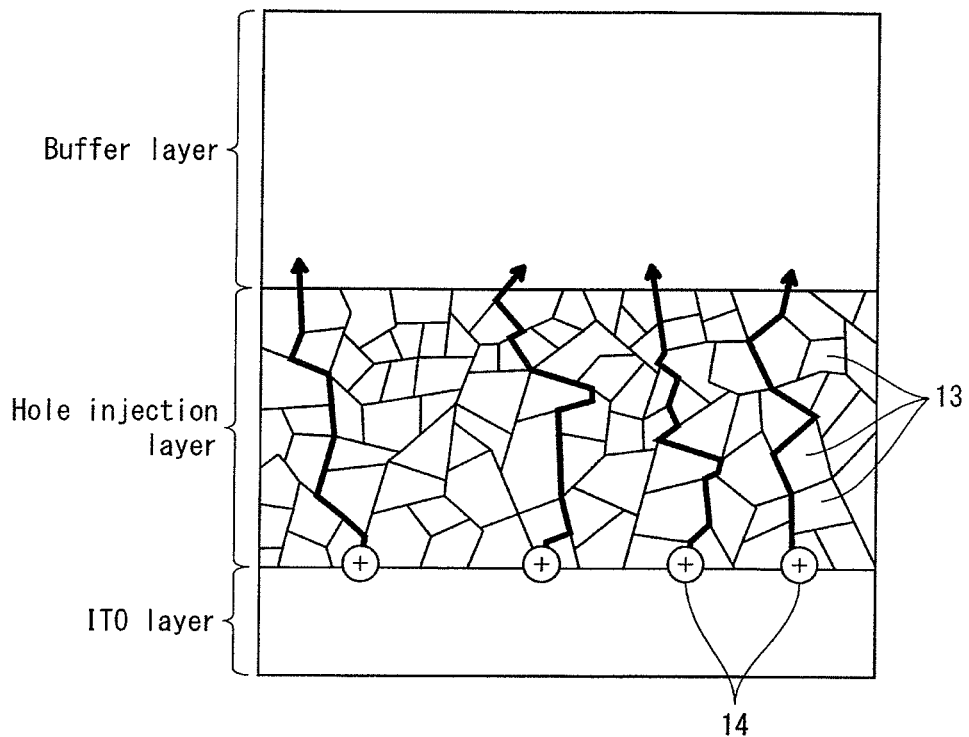
FIG. 16A is a diagram schematically illustrating hole conduction in a nanocrystal structure.
Figure 16B:
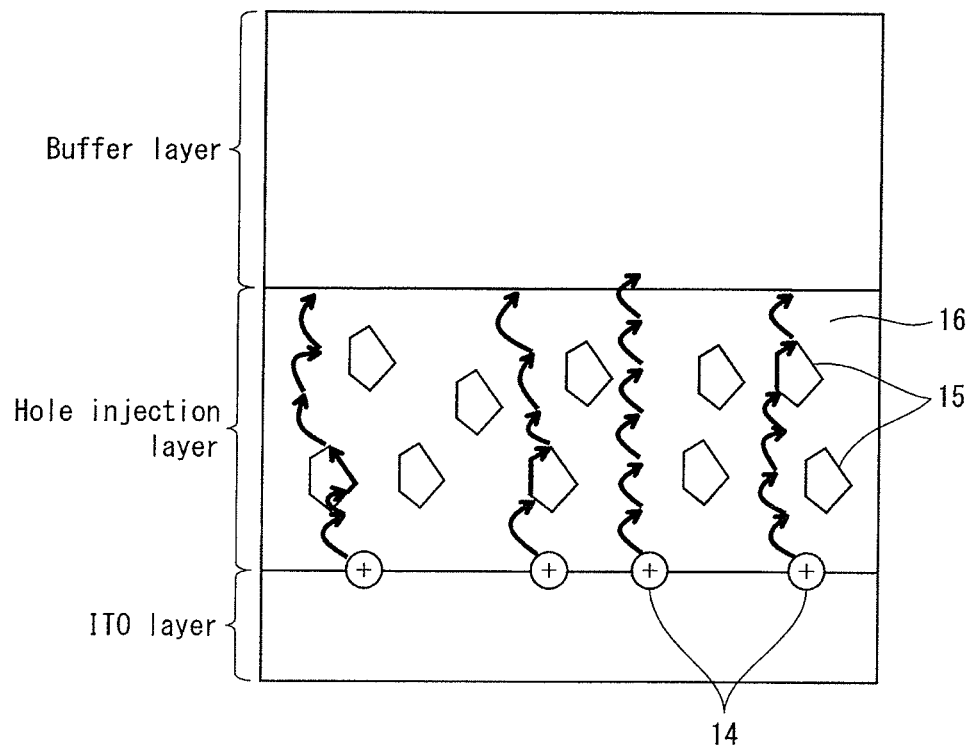
FIG. 16B is a diagram schematically illustrating hole conduction in an amorphous structure of a tungsten oxide layer.

FIG. 16B is a conceptual diagram of conduction of holes 10 by hopping conduction, illustrating conduction of holes 10 through an amorphous structure. In the amorphous structure illustrated in FIG. 16B, the portions labeled 11 are crystals with a well-ordered rutile structure (segregated crystals 15). Numerous tungsten atoms with a valence of five are found along the surface of the segregated crystals 15. On the other hand, region 16 excluding the segregated crystals 15 is an amorphous portion in which rutile structures are not well ordered. Not as many tungsten atoms with a valence of five exist as along the surface of the segregated crystals 15. In the amorphous structure, although tungsten atoms with a valence of five exist along the surface of the segregated crystals 15, the orbital of a tungsten atom with the valence of five does not overlap with the orbital of another nearby tungsten atom with a valence of five. Therefore, the holes 14 are thought to be conducted by hopping between tungsten atoms with a valence of five. In other words, in an amorphous structure, tungsten atoms with a valence of five are separated by a long distance. In order to exchange holes between tungsten atoms with the valence of five, which act as hole conduction locations, it becomes necessary to apply an extremely high-voltage across the tungsten atoms with a valence of five, thereby increasing the driving voltage of the element.

By contrast, FIG. 16A is a conceptual diagram showing the conduction of holes 14 along the surface of nanocrystals in order to illustrate the conduction of holes 14 in the case of a nanocrystal structure. As illustrated in FIG. 16A, a nanocrystal structure contains well-ordered rutile structures, so that the entire film is composed of microscopic crystals. The resulting mode of hole conduction differs from an amorphous film. As described above, tungsten atoms with a valence of five exist along the surface of nanocrystals 9, and this surface region becomes a hole conduction region. It is considered that in a nanocrystal structure, holes 14 can be conducted at a low voltage due to the continuity of surface regions that act as hole conducting regions.

As described above, for a metal oxide film to have good hole conduction properties, it is considered necessary (1) for portions acting as hole conduction regions to exist, and (2) to increase the number of crystal interfaces in order for electron orbitals contributing to hole conduction to overlap. In other words, a metal oxide film 1) that includes metal atoms with a lower valence than the maximum possible valence of the metal atoms and that 2) has a nanocrystal structure can be considered a good structure for hole conduction.

Next, it is described how the effect of improving hole conduction properties is the dominating factor behind achieving a low driving voltage by using tungsten oxide with a nanocrystal structure that includes a low valence. Reduction of driving voltage can also be reduced by reducing the hole injection barrier at the interface between the anode 2 and the hole injection layer 4, and by reducing the hole injection barrier at the interface between the hole injection layer 4 and the buffer layer 6A. Here, the hole conduction energy was analyzed by UPS measurement of tungsten oxide films manufactured in the same way as the hole injection layer 4 in BPD-D and BPD-E, shown in Table 3, which have different hole injection characteristics. As shown in FIG. 4, at a current density of 10 mA/cm$^2$, a difference of approximately 2 V in the driving voltage was confirmed between BPD-D and BPD-E, yet no difference in the hole conduction energy was observed by UPS. In other words, the difference in hole injection voltage between BPD-D and BPD-E was not caused by the hole injection barrier at the interface between the anode 2 and the hole injection layer 4, nor by the hole injection barrier at the interface between the hole injection layer 4 and the buffer layer 6A. Rather, the difference was confirmed to derive from the film structure of the hole injection layer, as described above.

(Regarding Film Loss of the Hole Injection Layer)

When checking the hole-only devices HOD-A through HOD-E prepared in the above experiment, the inventors found that, upon completion of the hole-only devices HOD-A through HOD-E, the thickness of the hole injection layer included therein has decreased compared to immediately after the forming of the hole injection layer (the reduction in the thickness of the hole injection layer is referred to hereinafter as "film thickness reduction"). Confronting such a situation, the inventors made an assumption that this film thickness reduction of the hole injection layer takes place during the processing of forming the banks. Based on such an assumption, the inventors conducted a confirmation experiment as described in the following so as to investigate the cause of the film thickness reduction of the hole injection layer.

In specific, the inventors prepared hole-only devices HOD-a through HOD-c for the experiment. Each of the hole-only devices was prepared by forming a film composed of tungsten oxide, which is to become the hole injection layer, on a glass substrate by sputtering. In the following, the hole-only devices HOD-a, HOD-b, and HOD-c are respectively referred to as samples a, b, and c. The film forming conditions under which each of the samples a, b, and c were formed are as indicated in Table 7. The only difference between the film forming conditions under which sample a was formed and the film forming conditions A shown in Table 1 is a slight difference in total pressure; otherwise, these conditions are approximately the same.

TABLE 7

| Name of Sample | Sample a | Sample b | Sample c |
|---|---|---|---|
| Total Pressure (Pa) | 4.8 | 2.7 | 2.7 |
| Ar:O2 | 100:100 | 43:100 | 43:100 |
| Input Power Density (W/cm$^2$) | 1.50 | 3.00 | 6.00 |
| Film Density (g/cm$^3$) | 5.43 | 6.09 | 6.33 |
| Film Thickness Reduction Amount (nm) | 57.7 | 25 | 20.9 |

Figure 17:
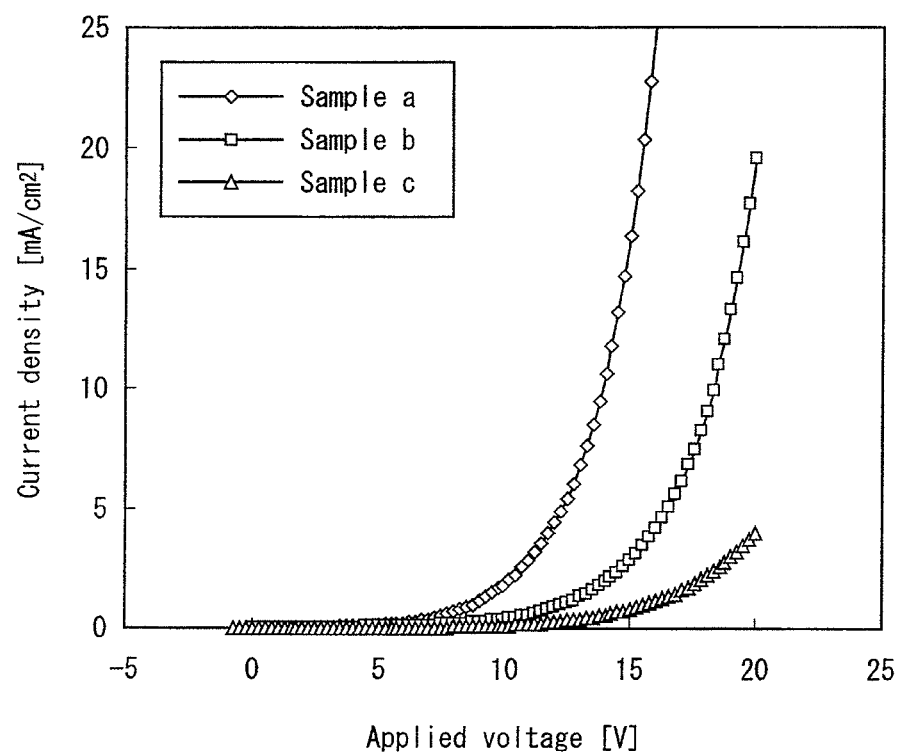
FIG. 17 is a device characteristics diagram showing relation curves illustrating relations between applied voltage and current density of the hole-only devices.

The completed samples a, b, and c were then connected to the direct current power supply DC and voltage was applied thereto. Furthermore, by changing the applied voltage, an electric current value per unit surface area (current density) was calculated for different voltages. FIG. 17 is a device characteristics diagram showing relation curves each illustrating a relation between applied voltage and current density of a prepared sample. In FIG. 17, the vertical axis indicates electric current density (mA/cm$^2$), whereas the horizontal axis indicates applied voltage (V). As shown in FIG. 17, the driving voltage is lowest for sample a, and increases in the order of sample b and sample c. This indicates that the hole conduction efficiency of the hole injection layer is highest in sample a, and decreases in the order of sample b and sample c. Further, according to embodiment 1, the quantity, in the hole injection layer, of tungsten atoms with a valence of five increases in the order of sample a, sample b, and sample c.

Subsequently, the inventors formed a resin material layer composed of a predetermined resin material ("TFR" series resin material produced by Tokyo Ohka Kogyo Co., Ltd.) so as to be layered on the hole injection layer of each sample by applying the spin coating method (room temperature, 2500 rpm/25 sec) and by performing baking (100° C., 90 sec). Following this, development processing (where a solution including 2.38% TMAH was used and where the developing time was 60 sec) and cleaning processing (where pure water was used and where the cleaning time was 60 sec) were performed. Successively, the resin material layer having been layered on the hole injection layer was removed. The forming of the resin material layer, the development processing, and the cleaning processing were performed so as to simulate the actual process of forming the banks.

Figure 18:
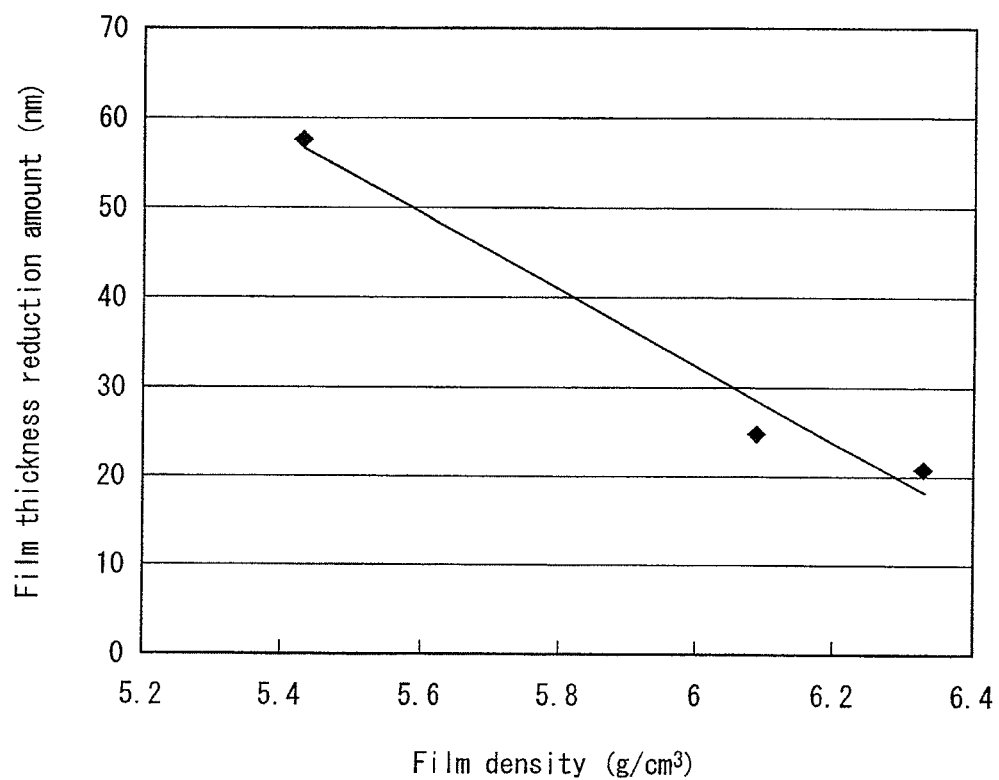
FIG. 18 is a graph showing a relation between a film thickness reduction amount and film density of tungsten oxide film constituting a hole injection layer.

Table 7 indicates the film forming conditions applied and the results of the experiment. Further, FIG. 18 illustrates a graph indicating a relation between the film densities and the film thickness reduction amounts in Table 7.

As is indicated by the experiment results presented in Table 7, the film thickness of the tungsten oxide layer in sample a, which was 80 nm at a point immediately following the forming thereof, decreased to 23 nm by the end of the experiment. As such, it was observed that the film thickness of the tungsten oxide layer in sample a decreased by as much as approximately 57 nm due to occurrence of the film thickness reduction.

Further, the inventors also found that there was a considerable level of correlation between an amount of a tungsten oxide layer decreasing as a result of the film thickness reduction and a film density of the tungsten oxide layer. More specifically, the inventors found that, when a tungsten oxide layer had a relatively low film density, the film thickness reduction amount of the tungsten oxide layer indicated a relatively great value. Further, when taking into consideration the results indicated in FIG. 17, a higher hole conduction efficiency of the tungsten oxide layer, or that is, a greater quantity of tungsten atoms with a valence of five included in the tungsten oxide layer results in the tungsten oxide layer having lower film density and a greater film thickness reduction amount. The reasons for this are described with reference to FIGS. 19A and 19B.

Figure 19A:
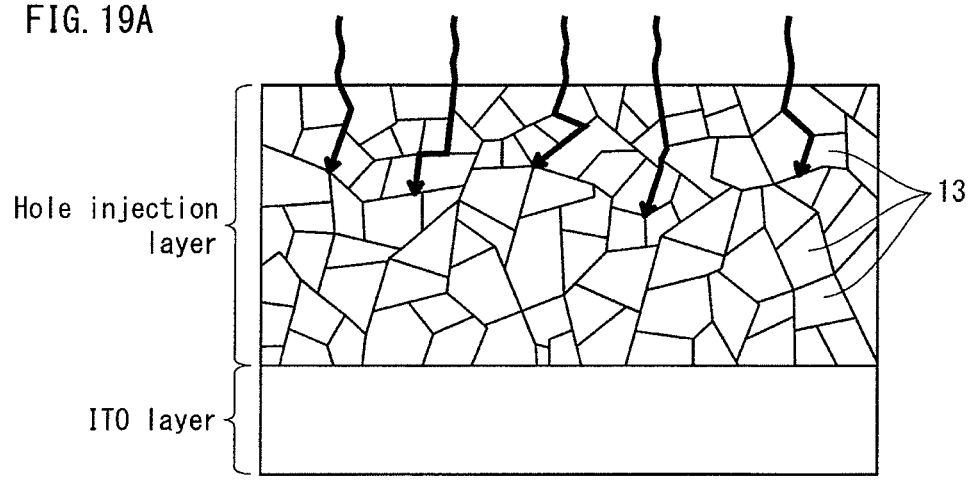
FIGS. 19A and 19B are each a schematic diagram showing a relation between a film structure and film density of tungsten oxide layer constituting a hole injection layer.
Figure 19B:
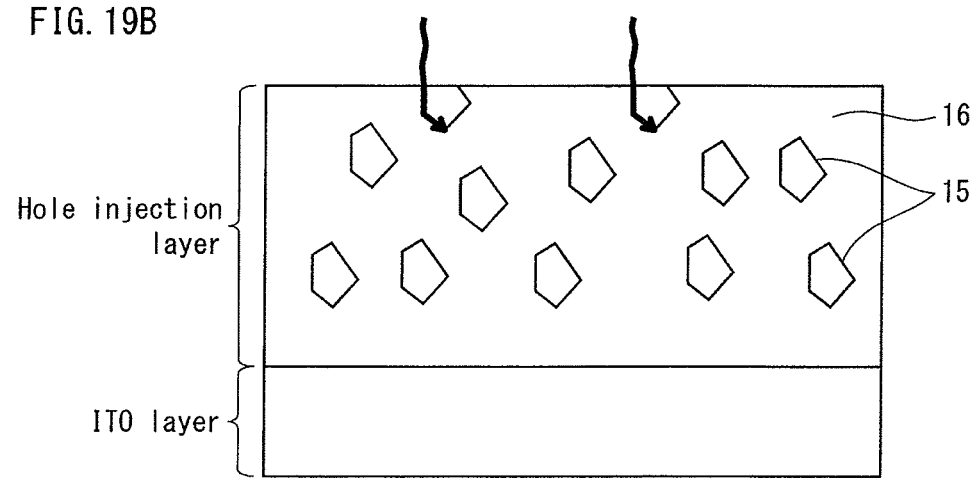

FIGS. 19A and 19B are schematic diagrams each illustrating a relation between a film structure and a film density of a tungsten oxide layer constituting a hole injection layer. Note that the schematic diagram in each of FIGS. 19A and 19B illustrates a state following the forming of the hole injection layer and before the forming of the banks. More specifically, FIG. 19A is a schematic diagram of the hole injection layer corresponding to a case where the tungsten oxide layer is formed to have the nanocrystal structure, or that is, a case where the hole injection layer has high hole conduction efficiency. In contrast, FIG. 19B is a schematic diagram of the hole injection layer corresponding to a case where the tungsten oxide layer is formed to have the amorphous structure (not all portions of the tungsten oxide layer have the amorphous structure, but tungsten oxide crystals exist in a segregated state in only some portions of the tungsten oxide layer), or that is, a case where the hole injection layer has low hole conduction efficiency.

When the hole injection layer is formed to have the nanocrystal structure (FIG. 19A), crystal surfaces of the nanocrystals 13 spread over the entire hole injection layer, and needless to say, crystal surfaces of the nanocrystals 13 spread along a surface of the hole injection layer on which banks are to be formed, which accordingly becomes an interface between the hole injection layer and the banks. When the hole injection layer, in the above-described state, is exposed to the dissolution liquid (a developing solution, a cleaning liquid, etc.) used in the process of forming the banks, the dissolution liquid permeates the hole injection layer via the crystal surfaces of the nanocrystals 13 present at the surface of the hole injection layer on which the banks are to be formed, which accordingly becomes the interface between the hole injection layer and the banks, as indicated by the arrows in FIG. 19A. This is because the spaces between the crystal surfaces of neighboring nanocrystals 13 serve as gaps through which the dissolution liquid is able to permeate the hole injection layer. Furthermore, since the crystal surfaces of the nanocrystals 13 are literally extremely "microscopic", the dissolution liquid is able to permeate the hole injection layer through an increased number of paths. Hence the film thickness reduction amount of the hole injection layer increases when the hole injection layer is formed to have the nanocrystal structure. In addition, gaps exist between the crystal surfaces of the nanocrystals 13 in a film having the nanocrystal structure, which results in the film having relatively low film density.

On the other hand, when the hole injection layer has the amorphous structure (FIG. 19B), the segregated crystals 15 are present at only some portions of the hole injection layer. Therefore, as indicated by the arrows in FIG. 19B, only a small number of crystal surfaces exist, which serve as permeation paths through which the dissolution liquid is able to permeate the hole injection layer. In addition, since the crystal surfaces are in a discontinuous state in an amorphous portion 16, it is less likely that the dissolution liquid permeates the hole injection layer to reach a relatively deep part of the hole injection layer (to the bottom direction in the figure) compared to the case where the hole injection layer has the nanocrystal structure. As such, it can be assumed that the film thickness reduction amount of the hole injection layer having the amorphous structure is smaller than the film thickness reduction amount of the hole injection layer having the nanocrystal structure. In addition, since a relatively small number of crystal surfaces are present in the film having the amorphous structure, a relatively small number of gaps exist in the film. As such, the film having the amorphous structure has relatively high film density.

From the experiment results presented above, it has been found that the film thickness reduction amount resulting from the film thickness reduction caused by the dissolution liquid used in the forming of the banks increases as the hole conduction efficiency of the tungsten oxide layers, having been assessed in embodiment 1, increases.

In general, there is a concern that the above-mentioned film thickness reduction might make it difficult to manage the thickness of the tungsten oxide layer and have some effect on hole injection properties of the tungsten oxide film of the completed organic EL element. Hence, if people skilled in the art are aware of the occurrence of such film thickness reduction of the hole injection layer, it is assumed that they will hesitate to form the hole injection layer by using tungsten oxide.

Intensive studies by the inventors of the present invention on this problem, however, have revealed that the film thickness reduction amount of the tungsten oxide layer can be adjusted by appropriately changing developing conditions (i.e., by reducing concentration of developer from 2.38% to approximately 0.2%) or baking conditions, for example. According to this, the thickness of the tungsten oxide film can be controlled while taking the film thickness reduction of the tungsten oxide film into account. Furthermore, the inventors of the present invention performed a study on an experimental model of a more realistic organic EL element based on such a technology of controlling a film thickness reduction amount of the hole injection layer, and confirmed the following technical matters.

The steps of manufacturing of the experimental model of the organic EL element were first to form a hole injection layer composed of tungsten oxide on an anode, and then to form a bank material layer on the hole injection layer. Subsequently, the bank material layer was patterned in a predetermined shape having an aperture in which a functional layer was to be formed (during patterning, banks are exposed, developed and cleaned). Subsequently, the functional layer was formed at a position corresponding to the aperture. On the functional layer, a cathode was formed.

When the inventors of the present invention examined the organic EL element manufactured in this method, the inventors found that tungsten oxide was dissolved to become a concavity at a position corresponding to the aperture of the hole injection layer, and accordingly, the hole injection layer, as a whole, was configured to have concave structures.

In addition, the inventors have reached a finding that when the hole injection layer has a concave structure and the organic EL element with this structure is driven, the electric field occurring between the anode and the cathode concentrates at edge of the concave structure of the hole injection layer, i.e., near the end portion of the aperture, and such concentration of the electric field might damage the light-emitting characteristics, causing problems such as the unevenness in luminance or a decrease in service life of the organic EL element.

As such, the inventors of the present invention conceived of the structure shown in the following Embodiment 2. According to this structure, defects due to concentration of the electric field at the edge of such concave structure can be avoided by modifying the shape of the banks.

The following is a description of Embodiment 2, focusing on the differences with Embodiment 1.

[Embodiment 2]

<Overall Structure of the Organic EL Panel>

Figure 21:
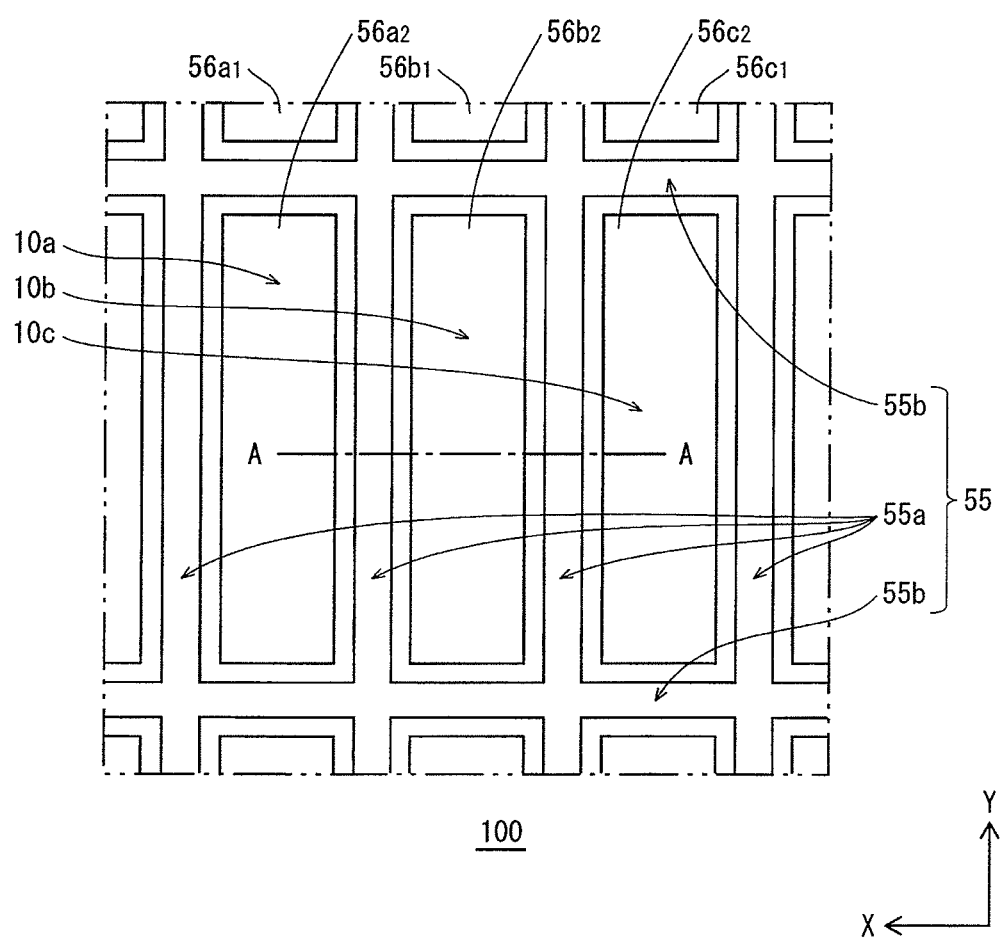
FIG. 21 is a plan view showing a part of an organic EL panel in Embodiment 2.

FIG. 21 is a plan view showing a part of an organic EL panel 100 in Embodiment 2.

The organic EL panel 100 is a top-emission type organic EL display composed of organic EL elements 10a, 10b, and 10c arranged in a matrix and each provided with a light emitting layer having a color of either red (R), green (G), or blue (B). Each of the organic EL elements 10a, 10b, and 10c corresponds to the organic EL element 1000 in Embodiment 1. Each organic EL element functions as a sub-pixel, and three adjacent organic EL elements of colors of RGB function as a pixel as a whole.

In an example of FIG. 21, a pixel bank 55 having a lattice shape is adopted. By a bank element 55a extending along a Y axis, light-emitting layers 56a1, 56b1, and 56c1 as well as light-emitting layers 56a2, 56b2, and 56c2 consecutively arranged along an X axis are partitioned.

On the other hand, a bank element 55b extending along the X axis delimits adjacent light-emitting layers 56a1 and 56a2 arranged along the Y axis, adjacent light-emitting layers 56b1 and 56b2 arranged along the Y axis, and adjacent light-emitting layers 56c1 and 56c2 arranged along the Y axis.

Figure 22:
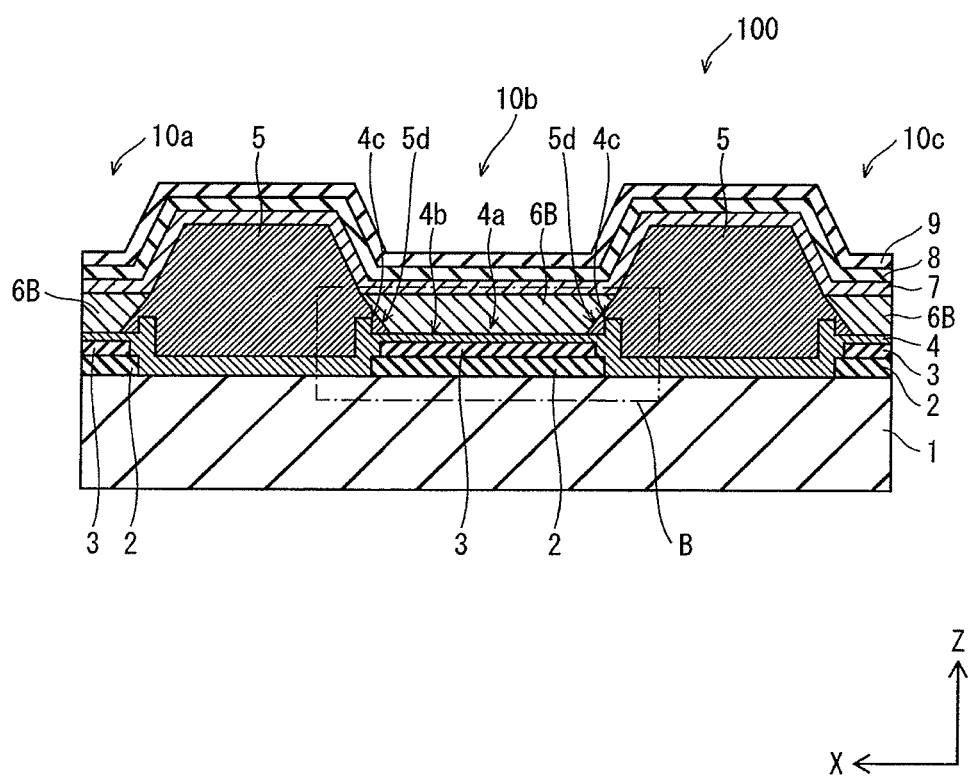
FIG. 22 is an end elevation schematically showing a cross section of the part of the organic EL panel in Embodiment 2.
Figure 23:
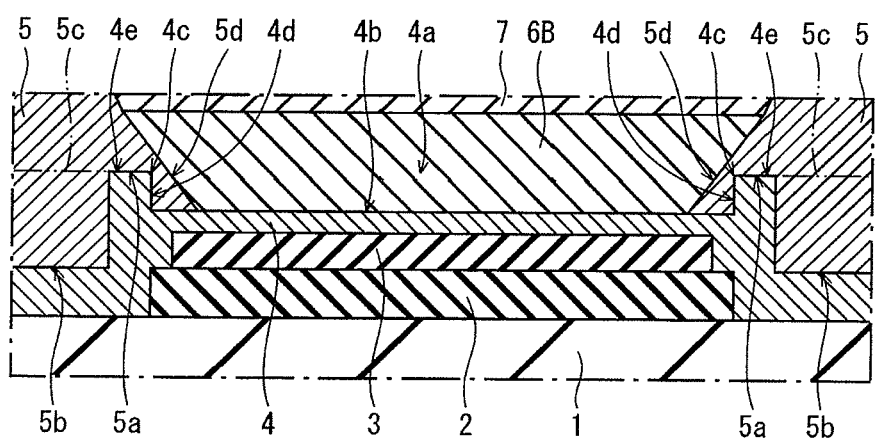
FIG. 23 is an enlarged end elevation of a portion B enclosed by an alternate long and short dash line of FIG. 20.

FIG. 22 is an end elevation schematically showing a cross section of the part of the organic EL panel in an embodiment pertaining to the present invention taken along the line A-A of FIG. 21. FIG. 23 is an enlarged end elevation of a portion B enclosed by an alternate long and short dash line of FIG. 22.

As shown in FIG. 22, the organic EL panel 100 differs from the organic EL element 1000 (FIG. 1) pertaining to Embodiment 1 in that the buffer layer 6A is not provided. Hereinafter, unless otherwise stated, material constituting each layer of the organic EL panel 100 pertaining to the present embodiment is the same as that of Embodiment 1.

On a substrate 1, anodes 2 are formed in a matrix. On the anode 2, an ITO layer 3 and a hole injection layer 4 are laminated in the stated order. Note that, while the ITO layer 3 is laminated only on the anode 2, the hole injection layer 4 is formed not only on the anode 2 but also over the substrate 1.

A bank 5 is formed above a periphery of the anode 2 via the hole injection layer 4. A light-emitting layer 6B is formed in an area defined by the bank 5. On the light-emitting layer 6B, an electron injection layer 7, a cathode 8, and a sealing layer 9 are formed continuously across the consecutive organic EL elements 10a, 10b and 10c, passing over the bank 5.

In the present embodiment, the cathode 8 is made of aluminum, ITO, IZO (indium zinc oxide), for example. A top-emission type panel preferably includes the cathode 8 made of a light-transmissive material.

(Hole Injection Layer)

The hole injection layer 4 is the same as that in Embodiment 1. The hole injection layer 4 is composed of tungsten oxide (WOx) layer that is formed under a film forming condition for achieving the high hole conduction efficiency.

As shown in FIG. 23, the hole injection layer 4 extends laterally along bottom surfaces 5a and 5b of the bank 5, and has a recess 4a in an upper surface thereof. A bottom 4b of the recess 4a is lower than a level 5c of the bottom surface 5a of the bank 5. The recess 4a is made up of the bottom 4b and an inner side surface 4d continuing the bottom 4b. The depth of the recess 4a is approximately 5 nm to 30 nm. An upper peripheral edge 4c of the recess is a convex portion composed of (i) a part 4e of the upper surface of the hole injection layer 4 in which the recess is not formed and (ii) the inner side surface 4d of the recess. The upper peripheral edge 4c is covered with a covering part 5d, which is a part of the bank 5.

The upper peripheral edge 4c of the recess protrudes from the bottom 4b of the recess. Therefore, if the upper peripheral edge 4c is not covered with the covering part 5d made from an insulating material, electric field concentrates in the vicinity of the upper peripheral edge 4c of the recess, and localized flow of current occurs in the light-emitting layer 6B. As a result, the uneven luminance occurs in a light-emitting surface and a life of the organic EL element is reduced due to localized deterioration of the light-emitting layer 6B. In the present embodiment, however, the above-mentioned problems are prevented, because the upper peripheral edge 4c of the recess is covered with the covering part 5d made from an insulating material. Note that it is desirable that the thickness of the covering part 5d (a shortest distance between the upper peripheral edge 4c of the recess and the light-emitting layer 6B) be 2 nm to 5 nm to effectively suppress the electric field concentration.

In an example of FIG. 23, the part 4e of the upper surface of the hole injection layer 4 in which the recess is not formed makes a right angle with the inner side surface 4d of the recess to form the peripheral edge 4c of the recess. The peripheral edge 4c of the recess, however, may have a multiangular shape, or may be curved. In such a case, the electrical filed concentration is further suppressed.

In the present embodiment, the covering part 5d reaches the bottom 4b of the recess 4a, and a side surface of the bank 5 slopes upward from the bottom 4b of the recess to a top of the bank 5. With this structure, when the light-emitting layer 6B is formed using printing technology such as inkjet technology, ink is distributed to every corner of an area defined by the bank. As a result, formation of a void and the like is suppressed.

<Process by Which an Aspect of the Present Invention was Achieved>

Figure 20A:
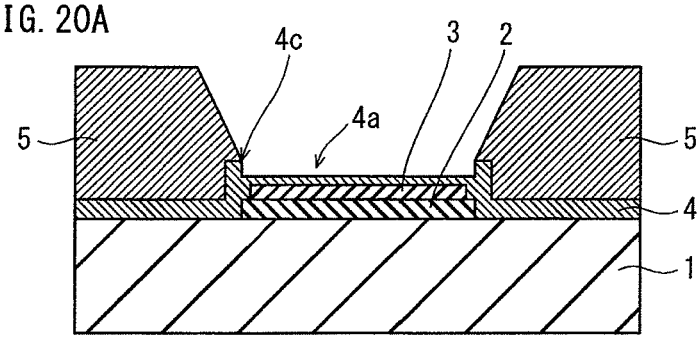
FIGS. 20A and 20B each show an end elevation to give a background of one aspect of the present invention.
Figure 20B:
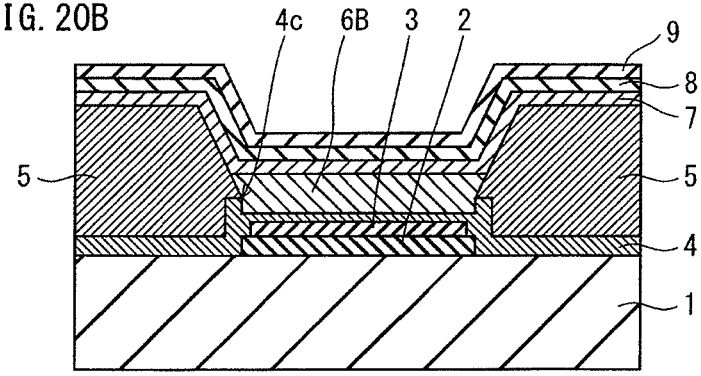

FIGS. 20A and 20B are each an end elevation showing a manufacturing process of an organic EL display. FIG. 20A shows a status in which the anode 2, the ITO layer 3, the hole injection layer 4, and the bank 5 are formed on a TFT substrate 1. FIG. 20B shows a status in which the light-emitting layer 6, the electron injection layer 7, the cathode 8, and the sealing layer 9 are formed in addition to the components shown in FIG. 20A.

With the structure in which the tungsten oxide is applied to the charge injection transport layer (the hole injection layer 4 in this example), a recess 4a is formed in an upper surface of the hole injection layer 4 (see FIG. 20A) in a process of forming the bank 5. If the light-emitting layer 6B is formed with the recess 4a formed in the upper surface of the hole injection layer 4 (see FIG. 20B), an electric field concentrates in the vicinity of an upper peripheral edge 4c of the recess 4a when the organic EL display emits light. As a result, localized flow of current can occur in the light-emitting layer 6B. This might lead to the occurrence of uneven luminance in a light-emitting surface and reduce a life of the organic EL element due to localized deterioration of the light-emitting layer.

The above-described problems and knowledge are unique to an organic EL element to which tungsten oxide is applied, and have technical significance in terms of not having been revealed.

As described above, the inventor arrived at the following technical features through a series of research and studies. That is, by covering the upper peripheral edge of the recess formed in the upper surface of the charge injection transport layer including tungsten oxide with a part of the bank, concentration of charges in the vicinity of the upper peripheral edge of the recess is suppressed when an organic EL element emits light. As a result, localized flow of current is suppressed.

<Manufacturing Method of Organic EL Panel>

FIGS. 24A, 24B, 24C, 25A, 25B, 25C, 26A, 26B, and 26C are each a process chart showing a method of manufacturing the organic EL element pertaining to an embodiment of the present invention.

Figure 24A:
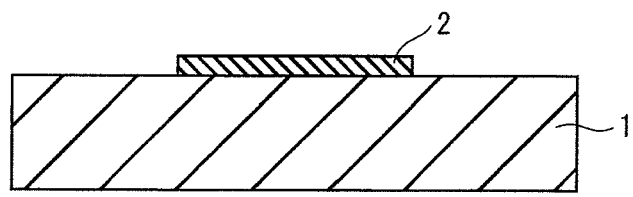
FIGS. 24A, 24B, and 24C are a process chart showing a method of manufacturing the organic EL panel in Embodiment 2.

First, as shown in FIG. 24A, a thin film of Ag is formed by sputtering, for example, on the substrate 1. The thin Ag film is then patterned by, for example, photolithography to form the anodes 2 in a matrix. Note that the thin Ag film may be formed using a vacuum evaporation method or the like.

Figure 24B:
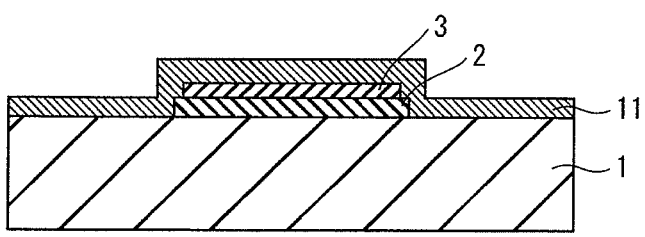

Next, as shown in FIG. 24B, a thin ITO film is formed using the sputtering method or the like. The formed thin ITO film is then patterned using the photolithography or the like to form the ITO layer 3. Subsequently, using a composition containing WOx or MoxWyOz, a thin film 11 of WOx or MoxWyOz is formed by technology such as vacuum deposition, sputtering, etc.

Figure 24C:
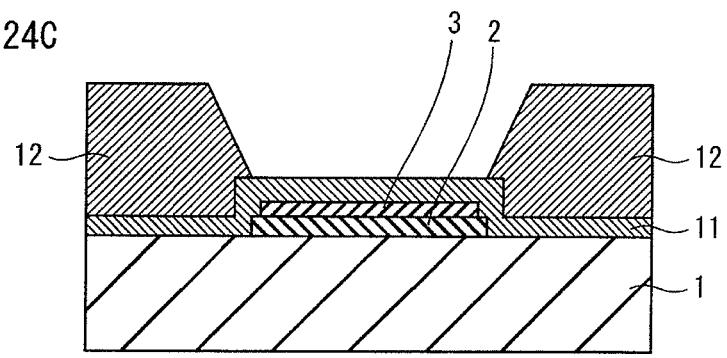

Next, as shown in FIG. 24C, a bank material layer 12 composed of organic material is formed on the thin film 11. A portion of the bank material layer 12 is removed so that the thin film 11 is partially exposed. The bank material layer 12 is formed by application or the like. The bank material layer 12 can be removed by patterning with a predetermined developer (a solution of tetramethylammonium hydroxide (TMAH) or the like).

Figure 25A:
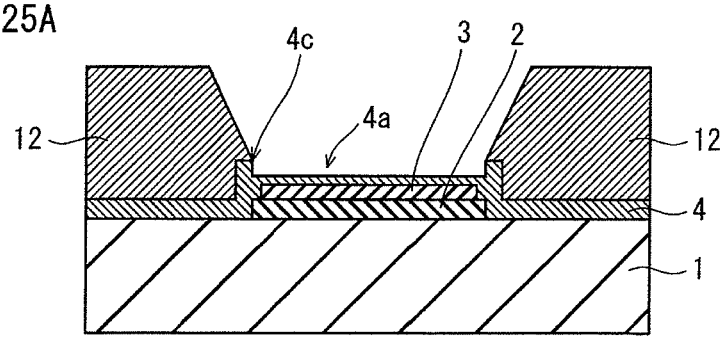
FIGS. 25A, 25B, and 25C are a process chart showing a method of manufacturing the organic EL panel in Embodiment 2.

Here, WOx or MoxWyOz, which is a material for the thin film 11, is soluble in pure water or TMAH solution. Therefore, washing off the bank residue remaining on the surface of the thin film 11 with the above developer causes the exposed portion of the thin film 11 to erode, leading to formation of a concave structure, as shown in FIG. 25A. As a result, the hole injection layer 4 having the recess 4a is formed.

Figure 25B:
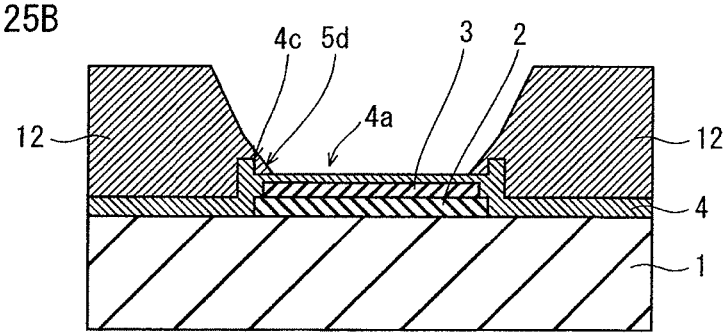

Next, as shown in FIG. 25B, the remaining portion of the bank material layer 12 is made fluid to some extent by heat treatment so that a bank material extends to cover the upper peripheral edge 4c of the recess. The upper peripheral edge 4c of the recess is covered with the covering part 5d in the above-mentioned manner. A heat cure can be adopted as the heat treatment, for example. The temperature and time for the heat cure may be appropriately determined in consideration of a type of the bank material and a required thickness of the covering part 5d and so on. After that, a surface of the remaining portion of the bank material layer 12 is, for example, subjected to treatment using fluorine plasma and the like to provide liquid repellency as necessary, and, as a result, the bank 5 is formed.

Figure 25C:
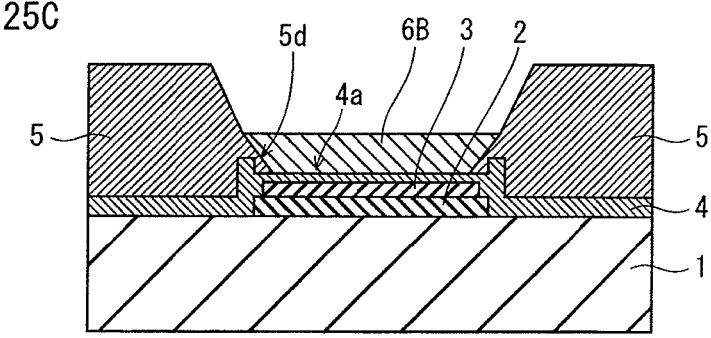

Subsequently, as shown in FIG. 25C, an ink composition including an organic EL material (hereinafter, simply referred to as "ink") is dropped in the area defined by the bank 5 by the inkjet method or the like. By drying the ink, the light-emitting layer 6B is formed. Note that the ink may be dropped by a dispenser method, a nozzle-coat method, a spin coat method, an intaglio printing, a letter press printing, or the like.

Figure 26A:
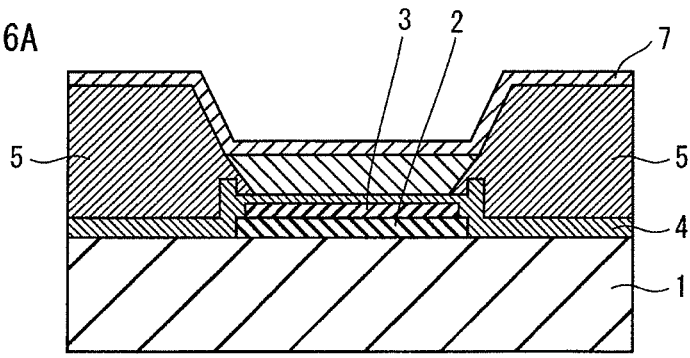
FIGS. 26A, 26B, and 26C are a process chart showing a method of manufacturing the organic EL panel in Embodiment 2.
Figure 26B:
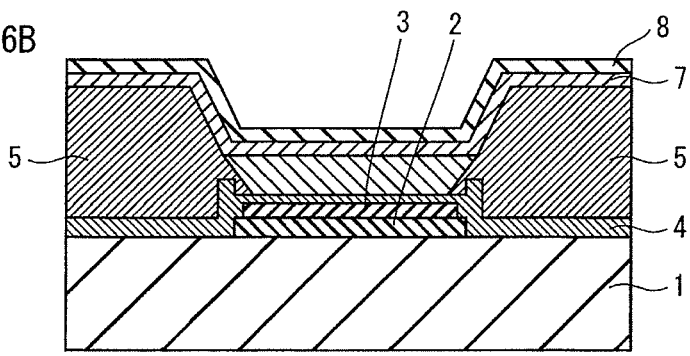
Figure 26C:
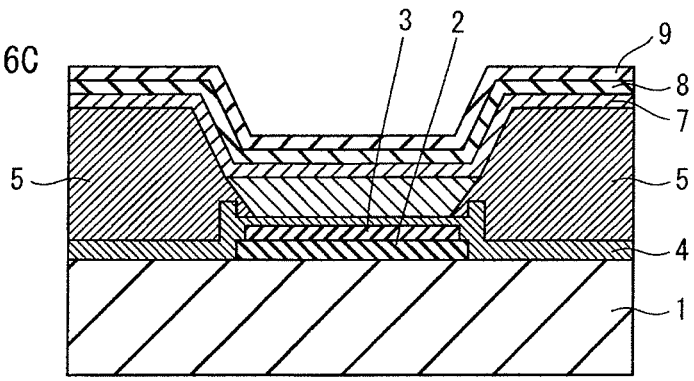

Next, as shown in FIG. 26A, a thin barium film as the electron injection layer 7 is formed using a vacuum evaporation method or the like. Then, as shown in FIG. 26B, an ITO thin film as the cathode 8 is formed using sputtering method. As shown in FIG. 26C, the sealing layer 9 is further formed.

With the above-mentioned manufacturing method, even when the recess 4a is formed in an exposed portion of the hole injection layer 4 during manufacturing, the electrical field concentration in the vicinity of the upper peripheral edge 4c of the recess is suppressed because the upper peripheral edge 4c of the recess is covered with the covering part 5d and the light-emitting layer 6B is formed on the covering part 5d.

Although Embodiments 1 and 2 have been explained, the present invention is not limited to these embodiments. For example, the following modifications can also be implemented.

[Modifications]

(1) In Embodiment 1, a tungsten oxide layer formed by DC sputtering is described as an example of the hole injection layer, but neither the method of film formation nor the type of metal oxide is limited in this way. Other methods, such as the vapor deposition method or CVD, may be used. Furthermore, in the above embodiments, tungsten oxide was described as an example of the hole injection layer, but instead of tungsten oxide, a metal oxide such as molybdenum oxide (MoOx) or molybdenum-tungsten oxide (MoxWyOz), a metal nitride, or a metal oxynitride may be used.

(2) As described in Embodiment 2, An organic EL element according to an aspect of the present invention is not limited to being used as a single element. A plurality of organic EL elements of the present invention may be integrated on a substrate as pixels to form an organic EL light-emitting apparatus. Such an organic EL light-emitting device can be achieved by appropriately setting the thickness of each layer in each element and may, for example, be used as an illumination device or the like.

(3) Although the organic EL panel is used as an example in Embodiment 2, the organic EL panel provided with the organic EL element according to an aspect of the present invention may also be used in an organic EL display apparatus. Such an organic EL display apparatus can, for example, be used in a variety of organic EL displays.

(4) In the above embodiments, the point at which the peak P1 clearly begins in FIGS. 15A and 15B is the point, in the direction of the center point from the peak top of the peak P1, at which the derivative first becomes zero in (a2) and (b2) in FIGS. 15A and 15B. The method of determining the point at which the peak P1 begins, however, is not limited in this way. For example, in the graph (a1) of FIG. 15A, the average value of the normalized luminance around the position at which the peak P1 begins may be taken as a baseline, and the intersection of this baseline with the peak P1 may be considered the position at which P1 begins to rise.

(5) In Embodiment 2, the recess in the hole injection layer is formed by being eroded by pure water during cleaning. However, an effect of suppressing the electrical filed concentration in the vicinity of the peripheral edge of the recess is obtained even when the recess is formed in another manner, by applying the structure in Embodiment 2. For example, the recess may be formed by the hole injection layer being eroded by etching solution during etching, or by the hole injection layer being eroded by a release agent during removal of the resist pattern. As described above, the present invention is effective in a case where the hole injection layer is made from a material that is eroded when exposed to a liquid used for forming the bank, in particular, the hole injection layer is made from a material that is eroded when exposed to a liquid used while the hole injection layer is partially exposed.

Figure 27:
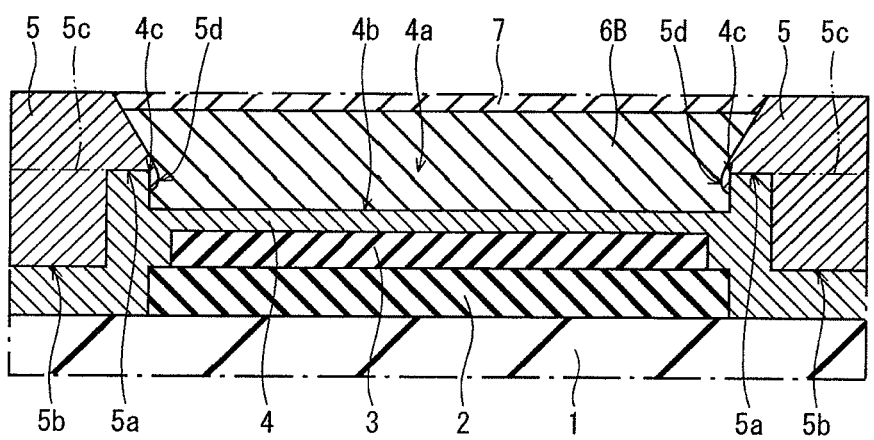
FIG. 27 is an end elevation schematically showing a cross section of a part of an organic EL panel in Modification.

(6) In Embodiment 2, the covering part extending from the bank reaches the bottom 4b of the recess beyond the upper peripheral edge 4c of the recess. However, the present invention is not limited to the above as long as at least the upper peripheral edge 4c of the recess is covered. For example, as shown in FIG. 27, the covering part 5d may be out of contact with the bottom 4b of the recess. When the structure shown in FIG. 27 is adopted, the temperature and time of the heat treatment are reduced, as it is not necessary to extend the bank material to the bottom of the recess.

In Embodiment 2, the recess 4a of the hole injection layer 4 is formed by cleaning after development in the process of forming the bank. In the present invention, however, mask pattering or the like may be used as a method of forming the recess.

Figure 28A:
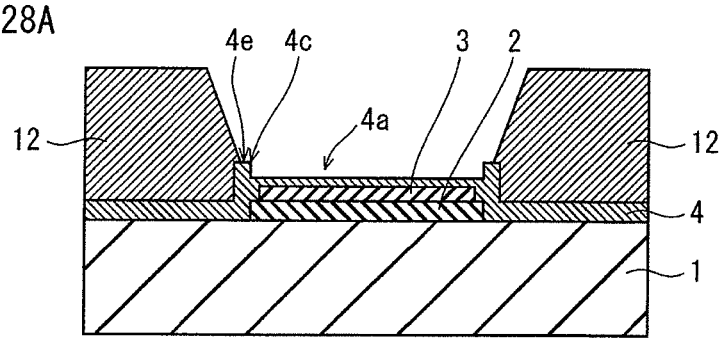
FIGS. 28A and 28B are a process chart showing a method of manufacturing the organic EL panel in Modification.
Figure 28B:
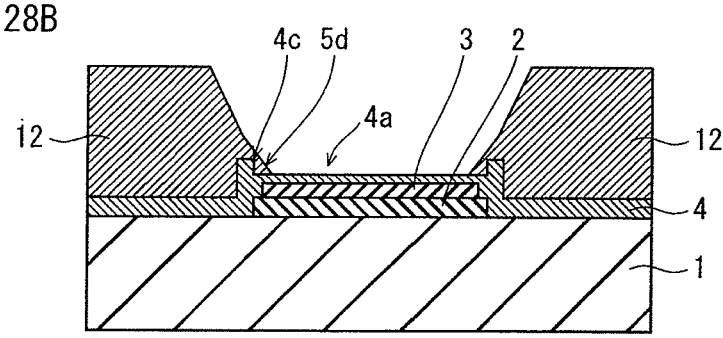

(7) In FIG. 25A, although a lower end of the slope of the bank material layer 12 coincides with the upper peripheral edge 4c of the recess, the structure of the bank material layer 12 is not limited to this. Depending on the bank material, the part 4e of the upper surface of the hole injection layer 4 in which the recess is not formed may be partially exposed by the slope of the bank material layer 12 being set back, as shown in FIG. 28A. In such a case, by appropriately heat treating the bank material layer 12, the upper peripheral edge 4c of the recess is covered with a part of the bank material (see FIG. 28B).

Figure 29:
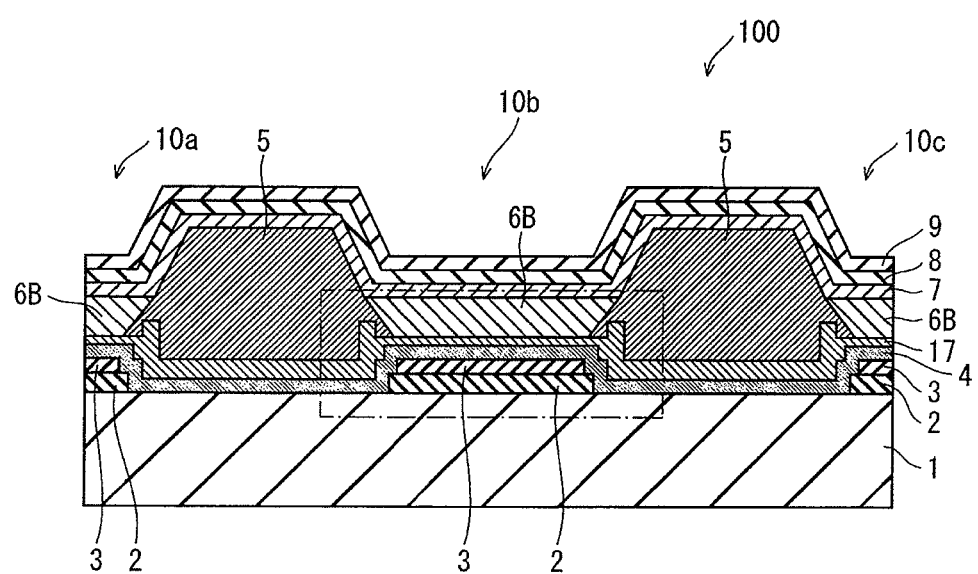
FIG. 29 is an end elevation schematically showing a cross section of a part of an organic EL panel in Modification.

(8) In the above embodiments, only the hole injection layer 4 is interposed between the anode and the light-emitting layer. However, the present invention is not limited to the above. For example, a hole transport layer 17 may be formed on the hole injection layer 4, as shown in FIG. 29. In this case, the recess is formed in an upper surface of the hole transport layer 17, and an upper peripheral edge of the recess formed in the hole transport layer is covered with the covering part.

Figure 31:
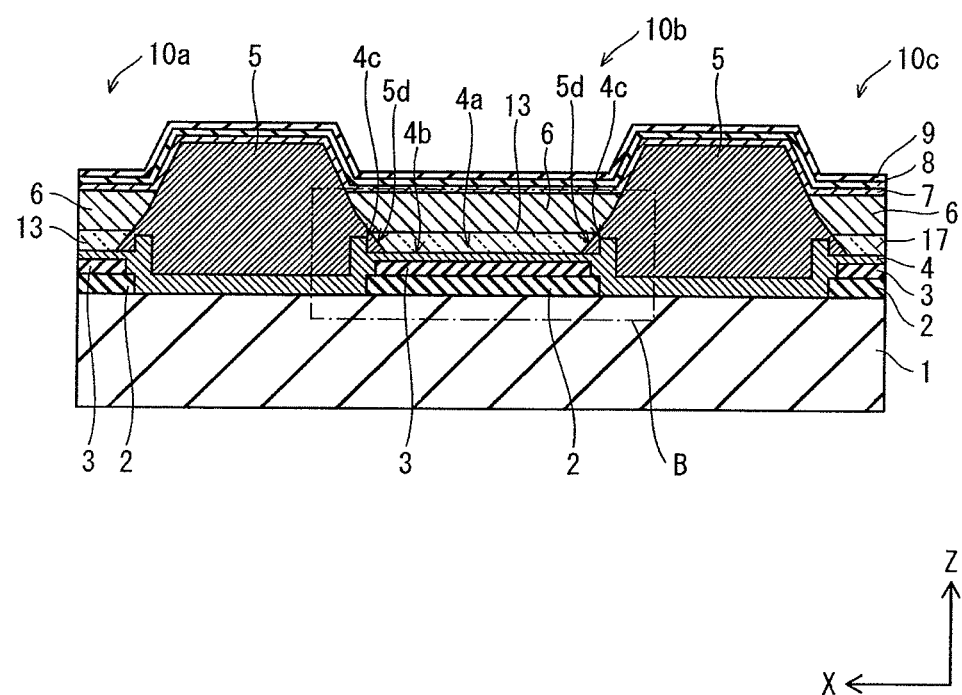
FIG. 31 is an end elevation showing a part of an organic EL display in Modification of the present invention.

Further, the charge injection transporting layer may include only the hole injection layer, and the hole injection layer and the hole transporting layer constituting the functional layer may be interposed between the anode and the light-emitting layer. In specific, the hole injection layer and the hole transport layer may be formed as shown in a portion B of FIG. 31. That is when the upper peripheral edge 4c of the recess 4a formed in the hole injection layer 4 is covered with the covering part 5d of the bank 5, a hole transport layer 17 may be formed on the recess 4a of the hole injection layer 4 by applying ink including hole transporting material, and a light-emitting layer 6 may be formed on the hole transport layer 17 by applying ink including light-emitting material.

In addition, the thickness of the hole transport layer is 10 nm to 20 nm, and the hole transport layer transports, to the organic light-emitting layer, holes injected from the hole injection layer. The hole transporting layer is made of hole transporting organic material. The hole transporting organic material transports generated holes by using intermolecular charge transfer reaction. This material is also referred to as p-type organic semiconductor material.

The hole transport layer may be made of high-polymer material or low-molecular material. In any of both cases, the hole transport layer is formed by wet printing. It is preferable that the hole transporting layer include a cross-linking agent so that the hole transporting layer is unlikely to be dissolved in the organic light-emitting layer when the organic light-emitting layer is formed on the hole transporting layer. Examples of the hole transporting organic material may include copolymer including fluorine units and triarylamine units, and low-molecular-weight triarylamine derivative. Examples of a cross-linking agent may include dipentaerythritol hexaacrylate and the like. In this case, it is preferable that the agent be made of doped polystyrene sulfonic acid, i.e., poly (3,4-ethylenedioxythiophene) (PEDOT-PSS) or its derivative (such as copolymers).

(9) In Embodiment 2, since the anode 2 is formed from the thin Ag film, the ITO layer 3 is formed on the anode 2. When the anode 2 is formed from an Al-based material, it is possible to adopt a single layer structure of the anode without forming the ITO layer 3.

Figure 30:
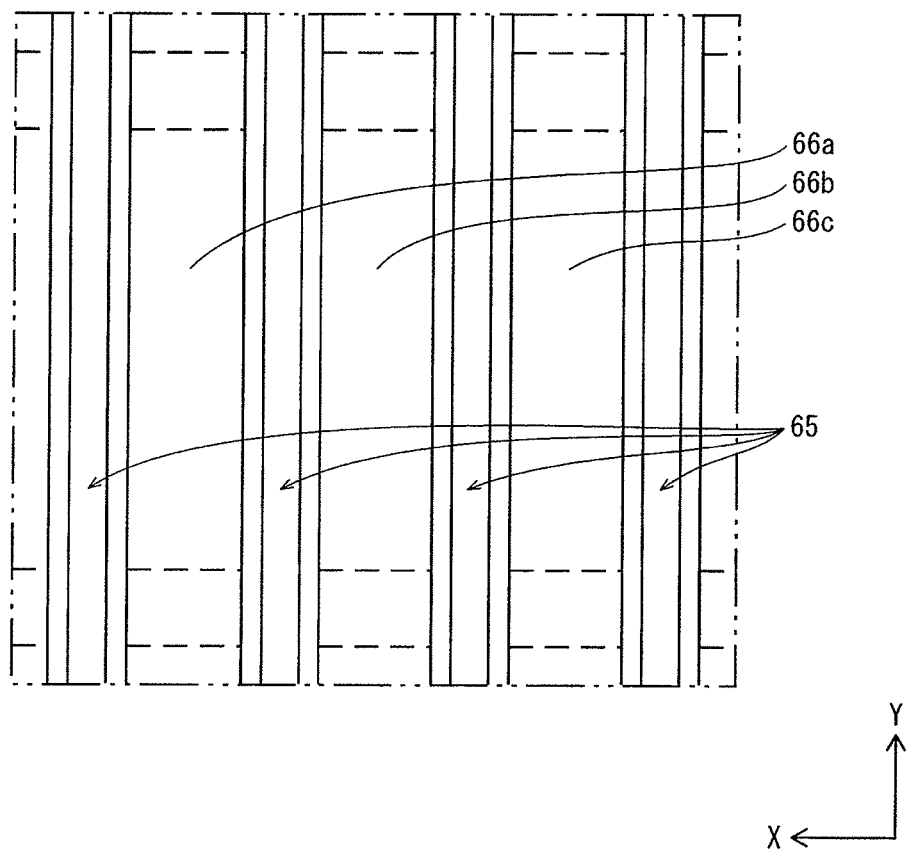
FIG. 30 is a plan view showing a part of an organic EL panel in Modification.

(10) In the above embodiments, although the so-called pixel bank (a bank having a lattice shape) is adopted, the present invention is not limited to this. For example, a line bank (banks arranged in lines) may be adopted. In an example of FIG. 30, the line bank 65 is adopted. The line bank 65 delimits consecutive light-emitting layers 6B6a, 66b, and 66c arranged along the X axis. Note that when the line bank 65 is adopted as shown in FIG. 30, adjacent light-emitting layers arranged along the Y axis are not defined by the bank element. However, by appropriately determining a driving method, a size of the anode, an interval between the anodes and so on, the adjacent light-emitting layers emit light without influencing each other.

(11) In the above embodiments, although a top-emission type light-emitting element is adopted, the light-emitting element of the present invention is not limited to the top-emission type light-emitting element. A bottom-emission type light-emitting element may be adopted.

(12) In the above embodiments, although only the electron injection layer is interposed between the light-emitting layer and the cathode, the electron transport layer may be interposed in addition to the electron injection layer.

(13) In the above embodiments, although organic material is used as a bank material, inorganic material may also be used.

In this case, the bank material layer may be formed by application or the like, in the same way as when organic material is used. The portion of the bank material layer may be removed by forming a resist pattern on the bank material layer, and then performing etching with use of predetermined etchant (Tetramethylammonium hydroxide (TMAH) solution, etc.). The resist pattern is removed by an aqueous or non-aqueous release agent after the etching, for example. Next, residues remaining after the etching are removed by being washed with pure water. Here, WOx or MoxWyOz, which is a material for the thin film, is soluble in pure water. Therefore, as shown in FIG. 6A, an exposed portion of the thin film is eroded, and a recess is formed. As a result, the hole injection layer having the recess is formed. Hence, the present invention can be applied to banks made of inorganic material, in the same way as when banks made of organic material.

[Industrial Applicability]

An organic EL element according to an aspect of the present invention may be favorably used in the home, in public facilities, and in the workplace in an organic EL apparatus used in various display apparatuses, televisions, displays for portable electronic devices, and the like.

REFERENCE SIGNS LIST 1 substrate
2 anode
3 ITO layer
4 hole injection layer
4a recess
4b bottom of recess
4c upper peripheral edge of recess
4d inner side surface of recess
4e part of upper surface of hole injection layer in which recess is not formed
5 bank
5a, 5b bottom surface of bank
5c level of bottom surface of bank
5d covering part
6A buffer layer
6B, 58a1, 56a2, 56b1, 56b2, 56c1, 56c2, 66a, 66b, 66c light-emitting layer
7 electron injection layer
8 cathode
8A cathode (metal layer)
9 sealing layer
1000, 10a, 10b, 10c organic EL element
11 thin film
12 bank material layer
13 nanocrystal
14 hole
15 segregated crystal
16 amorphous portion
17 hole transporting layer
55 pixel bank
55a, 55b bank material
65 line bank
70 conductive silicon substrate
80 tungsten oxide layer
100 organic EL panel
1000A hole-only device
DC power source

The invention claimed is:

1. An organic electroluminescent (EL) element, comprising:
   an anode;
   a cathode;
   a functional layer disposed between the anode and the cathode, and including a light-emitting layer containing an organic material;
   a hole injection layer disposed between the anode and the functional layer; and
   a bank that defines an area in which the light-emitting layer is to be formed, wherein
   the hole injection layer includes a tungsten oxide,
   tungsten atoms constituting the tungsten oxide include both tungsten atoms with a valence of six and tungsten atoms with a valence less than six,
   the hole injection layer includes a crystal of the tungsten oxide, a particle diameter of the crystal being on an order of nanometers,
   an inner portion of the hole injection layer is depressed to define a recess, and
   an upper peripheral edge of the recess is covered with a part of the bank, the upper peripheral edge of the recess comprising at least a portion of an inner side surface of the recess.

2. The organic EL element of claim 1, wherein the tungsten atoms with the valence less than six are tungsten atoms with a valence of five.

3. The organic EL element of claim 2, wherein a ratio $W^{5+}/W^{6+}$ of the number of the tungsten atoms with a valence of five to the number of the tungsten atoms with a valence of six is at least 3.2%.

4. The organic EL element of claim 3, wherein the ratio $W^{5+}/W^{6+}$ is at least 3.2% and at most 7.4%.

5. The organic EL element of claim 1, wherein a hard X-ray photoelectron spectroscopy spectrum of a surface of the hole injection layer exhibits a first peak and a second peak, the first peak corresponding to a $4f_{7/2}$ energy level of the tungsten atoms with a valence of six, and the second peak being in a region lower than the first peak in terms of binding energy.

6. The organic EL element of claim 5, wherein the second peak is in a region between 0.3 electron volts and 1.8 electron volts lower, in terms of binding energy, than the first peak.

7. The organic EL element of claim 5, wherein an area intensity of the second peak is between 3.2% and 7.4% of an area intensity of the first peak.

8. The organic EL element of claim 1, wherein tungsten atoms with a valence less than six cause a band structure of the hole injection layer to have an occupied energy level in a range between 1.8 electron volts and 3.6 electron volts lower than a lowest energy level of a valence band in terms of binding energy.

9. The organic EL element of claim 1, wherein the hole injection layer includes a plurality of crystals of the tungsten oxide, each of the crystals having a particle diameter of between 3 nm and 10 nm.

10. The organic EL element of claim 1, wherein regular linear structures at intervals of between 1.85 angstroms and 5.55 angstroms appear in a lattice image by transmission electron microscopy observation of the hole injection layer.

11. The organic EL element of claim 10, wherein in a 2D Fourier transform image of the lattice image, a pattern of concentric circles centering on a center point of the 2D Fourier transform image appears.

12. The organic EL element of claim 11, wherein
in a plot of distance from the center point versus normalized luminance, the normalized luminance being a normalized value of the luminance of the 2D Fourier transform image at the corresponding distance, at least one peak of the normalized luminance appears.

13. The organic EL element of claim 12, wherein
with a peak width being a difference between the distance corresponding to a position of a peak of the normalized luminance appearing closest to the center point in the plot and the distance corresponding to a position at which the peak of the normalized luminance begins to rise, the peak width is less than 22 when a difference between the distance corresponding to the center point and the distance corresponding to the peak of the normalized luminance appearing closest to the center point is 100.

14. The organic EL element of claim 1, wherein
the functional layer includes amine-containing material.

15. The organic EL element of claim 1, wherein
the functional layer further includes one of a hole transfer layer that transfers holes, and a buffer layer that one of adjusts optical characteristics and blocks electrons.

16. The organic EL element of claim 1, wherein
the part of the bank reaches an inner bottom surface of the recess of the hole injection layer, and a side surface of the bank slopes upward from the inner bottom surface of the recess to a top surface of the bank.

17. The organic EL element of claim 1, wherein
the part of the bank is out of contact with an inner bottom surface of the recess.

18. The organic EL element of claim 1, wherein
the hole injection layer extends laterally along a bottom surface of the bank.

19. The organic EL element of claim 1, wherein
the upper peripheral edge of the recess is a convex portion composed of a part of the upper surface of the hole injection layer in which the recess is not formed and the portion of the inner side surface of the recess.

20. The organic EL element of claim 1, wherein
the bank is liquid-repellent and the hole injection layer is liquid-philic.

21. An organic EL panel comprising the organic EL element of claim 1.

22. An organic EL light-emitting apparatus comprising the organic EL element of claim 1.

23. An organic EL display apparatus comprising the organic EL element of claim 1.

24. A method of manufacturing an organic EL element, comprising:
preparing an anode;
forming a tungsten oxide layer on the anode using a sputtering gas including argon gas and oxygen gas and using tungsten as a sputtering target, under film forming conditions such that a total pressure of the sputtering gas is at least 2.3 Pa and at most 7.0 Pa, a partial pressure of the oxygen gas in the sputtering gas is at least 50% and at most 70%, an input power density per unit area of the sputtering target is at least 1.5 W/cm$^2$ and at most 6.0 W/cm$^2$, and a value yielded by dividing the total pressure of the sputtering gas by the input power density is larger than 0.7 Pa·cm$^2$/W;
forming a bank material layer containing material constituting a bank above the tungsten oxide layer;
forming a recess by removing a portion of the bank material layer so that the tungsten oxide layer is partially exposed and an upper surface of the tungsten oxide layer in the recess is closer to the anode than an upper peripheral edge of the recess, the recess having an inner bottom surface and an inner side surface that is continuous with the inner bottom surface;
heat-treating a remaining portion of the bank material layer, the remaining portion of the bank material layer being made fluid so that the bank material layer extends to cover the upper peripheral edge of the recess, the upper peripheral edge of the recess comprising at least a portion of the inner side surface of the recess;
forming functional layer including a light-emitting layer above an exposed surface of the tungsten oxide layer after the heat treatment; and
forming a cathode above the functional layer.

25. The method of manufacturing an organic EL element of claim 24, wherein
the tungsten oxide layer is formed so that tungsten atoms constituting the tungsten oxide layer include both tungsten atoms with a maximum valence thereof and tungsten atoms with a valence less than the maximum valence, and so as to include a tungsten oxide crystal having a particle diameter on an order of nanometers.

26. The method of manufacturing an organic EL element of claim 24, wherein
when forming the tungsten oxide layer, the value yielded by dividing the total pressure of the sputtering gas by the input power density is less than 3.2 Pa·cm2/W.

* * * * *